United States Patent
Noack et al.

(10) Patent No.: US 11,508,428 B2
(45) Date of Patent: Nov. 22, 2022

(54) VOLTAGE SUPPLY CIRCUIT, MEMORY CELL ARRANGEMENT, TRANSISTOR ARRANGEMENT, AND METHODS THEREOF

(71) Applicant: Ferroelectric Memory GmbH, Dresden (DE)

(72) Inventors: Marko Noack, Dresden (DE); Rashid Iqbal, Dresden (IN)

(73) Assignee: Ferroelectric Memory GmbH, Dresden (DE)

( * ) Notice: Subject to any disclaimer, the term of this patent is extended or adjusted under 35 U.S.C. 154(b) by 203 days.

(21) Appl. No.: 17/215,033

(22) Filed: Mar. 29, 2021

(65) Prior Publication Data

US 2021/0312969 A1  Oct. 7, 2021

(30) Foreign Application Priority Data

Apr. 3, 2020  (DE) .......................... 102020109369.1

(51) Int. Cl.
*G11C 11/22*  (2006.01)

(52) U.S. Cl.
CPC ........ *G11C 11/2297* (2013.01); *G11C 11/223* (2013.01); *G11C 11/2255* (2013.01); *G11C 11/2257* (2013.01); *G11C 11/221* (2013.01)

(58) Field of Classification Search
CPC ... G11C 8/08; G11C 11/1653; G11C 11/2297; G11C 11/223; G11C 11/2255; G11C 11/2257

See application file for complete search history.

(56) References Cited

U.S. PATENT DOCUMENTS

| | | | |
|---|---|---|---|
| 8,461,913 B2 | 6/2013 | Garrard et al. | |
| 2010/0214842 A1* | 8/2010 | Honda | G11C 16/0483 365/185.18 |
| 2015/0194221 A1* | 7/2015 | Hong | G11C 17/14 365/96 |

FOREIGN PATENT DOCUMENTS

EP     1308959 B1     7/2003

OTHER PUBLICATIONS

Office Action filed in corresponding German application; 10 pages.

* cited by examiner

*Primary Examiner* — Han Yang
(74) *Attorney, Agent, or Firm* — Black, McCuskey, Souers & Arbaugh LPA

(57) ABSTRACT

An electronic circuit may be operated based on two or more supply voltages ramped in accordance with a digital control scheme, the digital control scheme may include ramping a voltage value of a first output voltage generated via a first digitally controlled voltage converter from a first target voltage value to a third target voltage value such that the voltage value of the first output voltage matches a second target voltage value during a first ramp interval and the third target voltage value during a second ramp interval; and ramping a voltage value of a second output voltage generated via a second digitally controlled voltage converter from the first target voltage value to the second target voltage value such that the voltage value of the second output voltage matches the second target voltage value during the first ramp interval, and the second target voltage value during the second ramp interval.

20 Claims, 18 Drawing Sheets

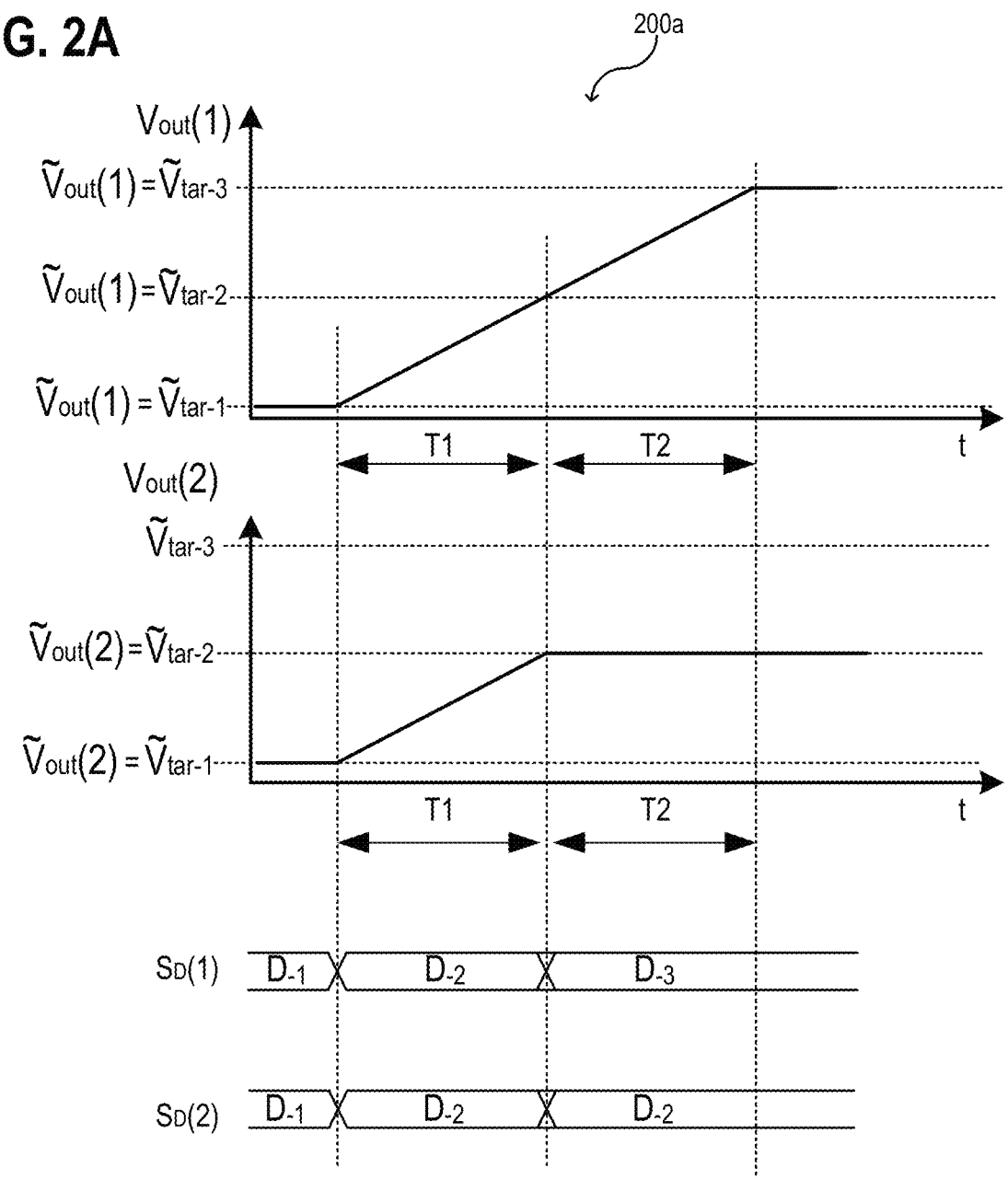

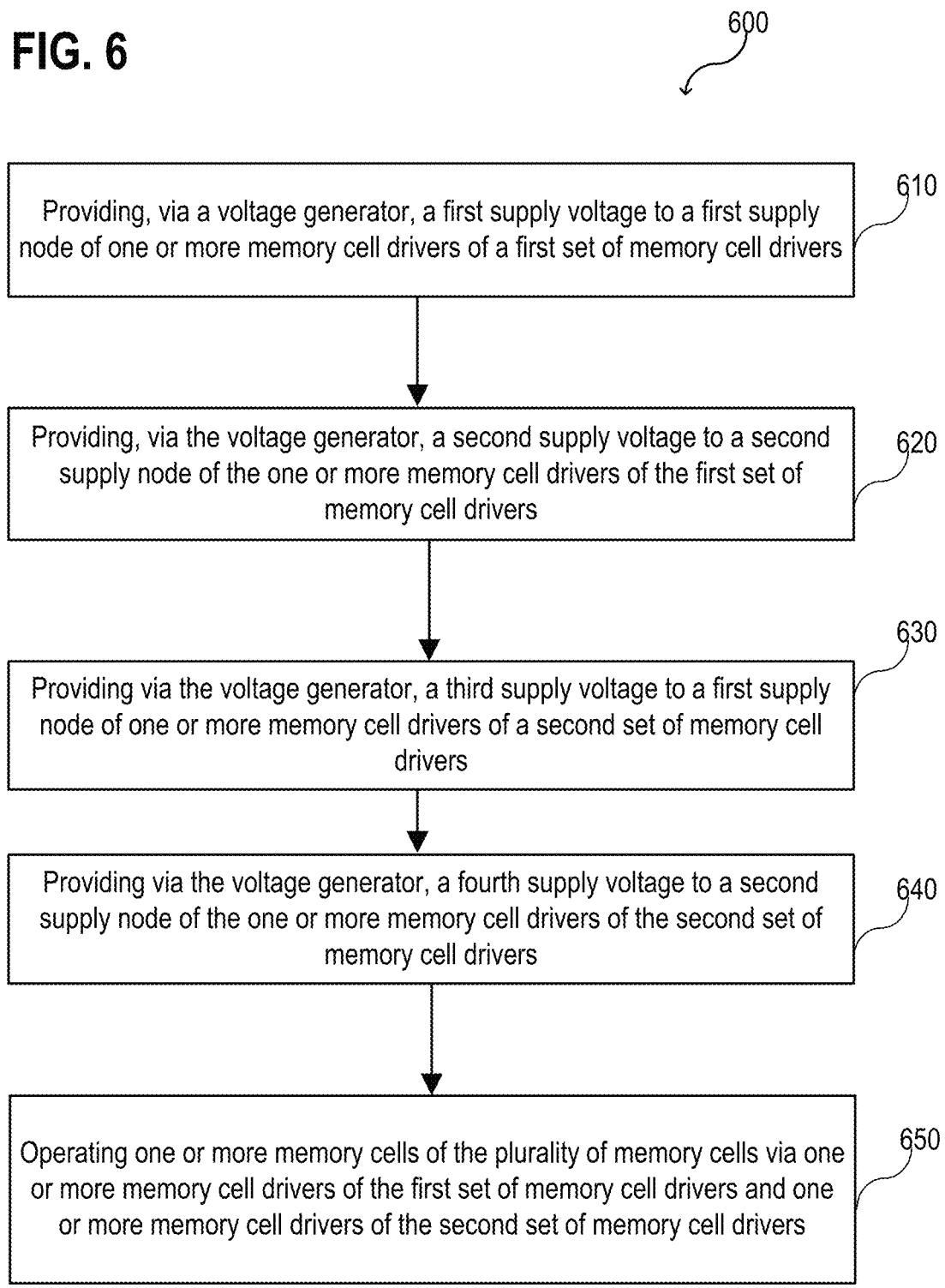

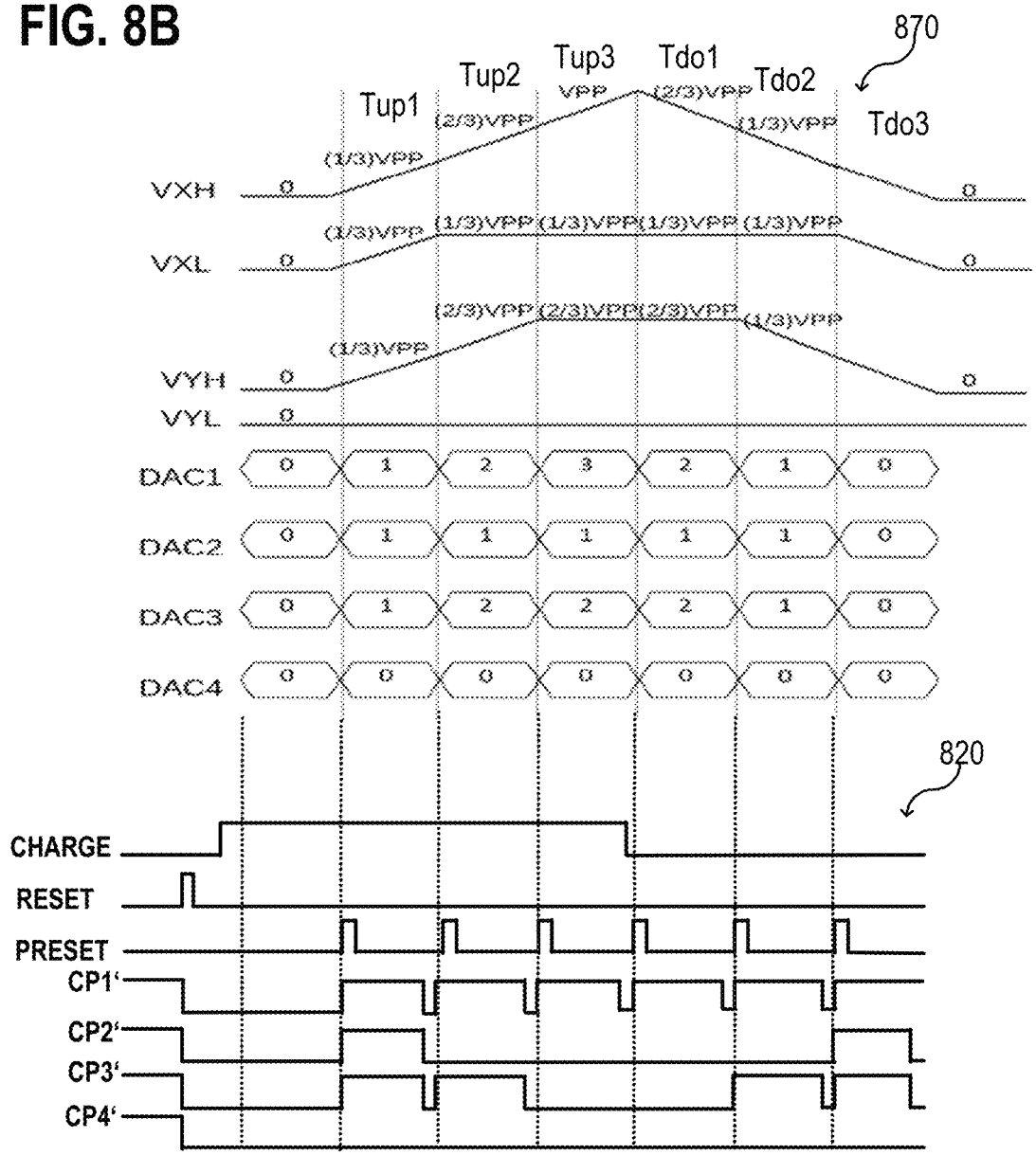

FIG. 10A 1000a

1010a — Ramping a voltage value of a first output voltage generated via a first digitally controlled voltage converter from a first target voltage value to a third target voltage value by supplying a first digital control signal to the first digitally controlled voltage converter such that the voltage value of the first output voltage matches a second target voltage value during a first ramp interval and the third target voltage value during a second ramp interval 1020a — Ramping a voltage value of a second output voltage generated via a second digitally controlled voltage converter from the first target voltage value to the second target voltage value by supplying a second digital control signal to the second digitally controlled voltage converter such that the voltage value of the second output voltage matches the second target voltage value during the first ramp interval, and the second target voltage value during the second ramp interval

FIG. 10B 1000b

1010b — Ramping a voltage value of a first output voltage generated via a first digitally controlled voltage converter from a third target voltage value to a first target voltage value by supplying a first digital control signal to the first digitally controlled voltage converter such that the voltage value of the first output voltage matches a second target voltage value during a first ramp interval and the first target voltage value during a second ramp interval 1020b — Ramping a voltage value of a second output voltage generated via a second digitally controlled voltage converter from the second target voltage value to the first target voltage value by supplying a second digital control signal to the second digitally controlled voltage converter such that the voltage value of the second output voltage matches the second target voltage value during the first ramp interval and the first target voltage value during the second ramp interval

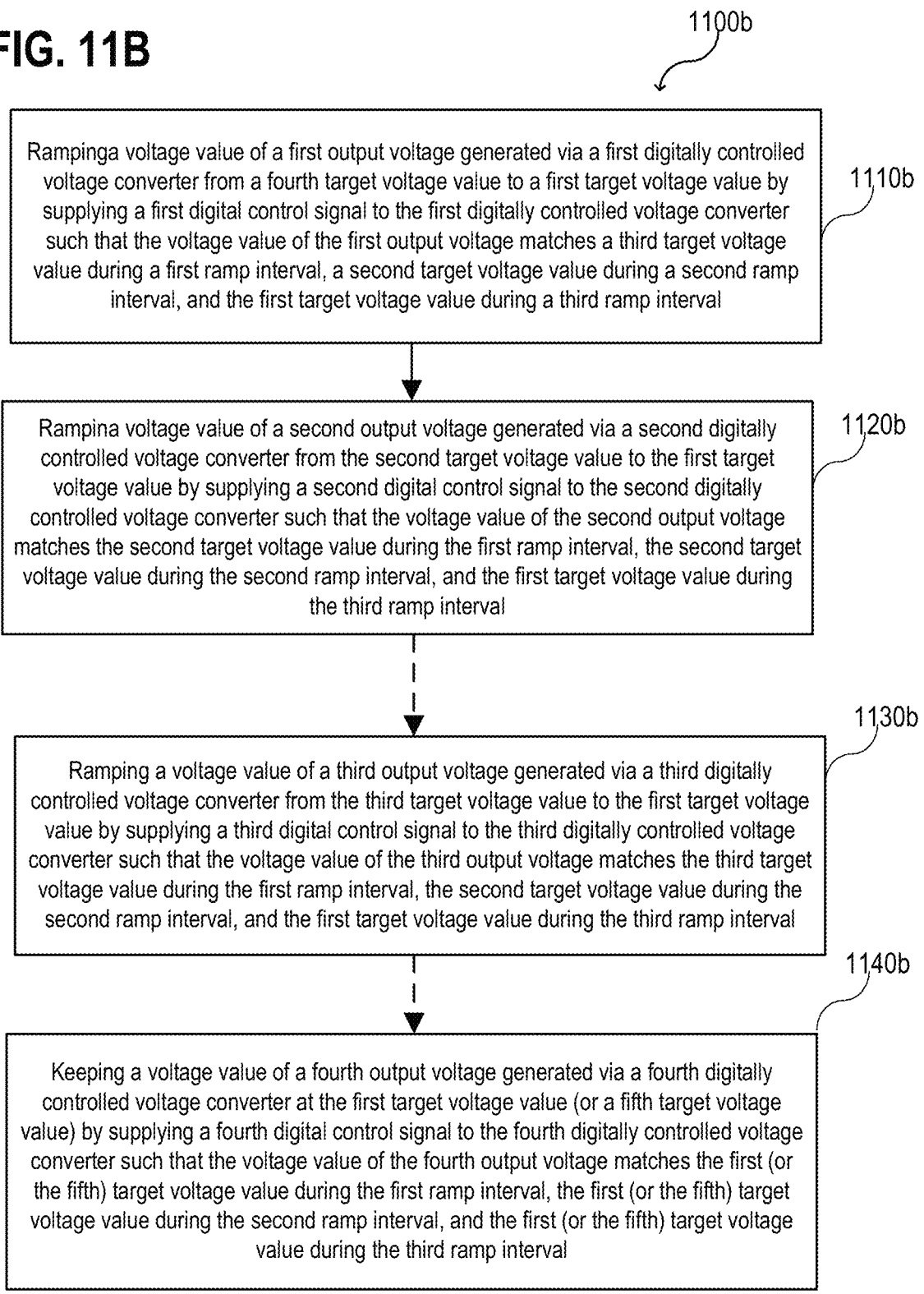

VOLTAGE SUPPLY CIRCUIT, MEMORY CELL ARRANGEMENT, TRANSISTOR ARRANGEMENT, AND METHODS THEREOF

RELATED APPLICATION INFORMATION

The present application claims priority to and the benefit of German Patent Application No. 10 2020 109 369.1, which was filed on Apr. 3, 2020, and which is incorporated by reference herein in its entirety.

TECHNICAL FIELD

Various aspects relate to a voltage supply circuit, a memory cell arrangement, a transistor arrangement, and methods thereof, e.g. a method for operating a voltage supply circuit, a method for operating a memory cell arrangement, and a method for operating a transistor arrangement.

BACKGROUND

In general, various computer memory technologies have been developed in semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is changed, e.g., in a controlled manner. The information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. Furthermore, various driver circuits have been developed in semiconductor industry to control an operation of one or more memory cells of a memory device. The memory cells may be implemented in such a way that each single memory cell or at least various groups of memory cells is unambiguously addressable, e.g. for programming and/or erasing the respective memory cell or groups of memory cells. Therefore, various driver schemes may be used to implement a desired addressing scheme for a plurality of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIGS. 2A and 2B show operation schemes for a voltage supply circuit, according to various aspects;

FIG. 6 shows a schematic flow diagram of a method for operating a memory cell arrangement, according to various aspects;

FIGS. 8A and 8B show a voltage supply circuit and an operation thereof in various schematic views, according to various aspects;

FIG. 10A shows a schematic flow diagram of a method for operating a voltage supply circuit, according to various aspects;

FIG. 10B shows a schematic flow diagram of a method for operating a voltage supply circuit, according to various aspects;

FIG. 11B shows a schematic flow diagram of a method for operating a voltage supply circuit, according to various aspects.

DESCRIPTION

Figure 1A:
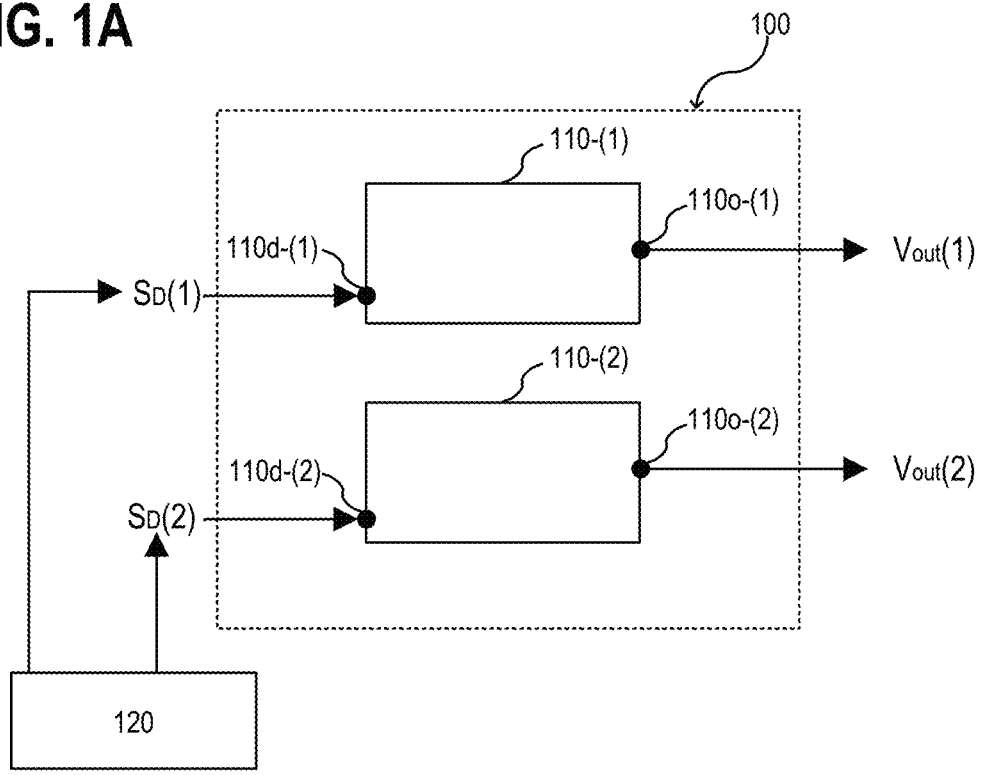
FIGS. 1A to 1D show a voltage supply circuit in various schematic views, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices. However, it may be understood that aspects described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term "voltage" may be used herein with respect to "one or more input voltages", "one or more addressing voltages", "one or more output voltages", "one or more supply voltages", and the like. As an example, the term "supply voltage" may be used herein to denote a voltage that is provided to a supply node. As another example, the term "input voltage" may be used herein to denote a voltage that is provided to an input node. Further, the term "output voltage", as example, may be used herein to denote a voltage that is provided to an output node. According to various aspects, the term "substantially equal" may be used herein, for example, with reference to a comparison of two voltages (e.g. of a target voltage and an output voltage) to mean a deviation of less than 20%, e.g. less than 10%, e.g. less than 5%, e.g. less than 1%. According to various aspects, the term "substantially equal" may be used herein, for example, with reference to a comparison of two voltages (e.g. of a target voltage and an output voltage) to mean a deviation of less 500 mV, e.g. less than 250 mV, e.g. less than 100 mV.

In some aspects, two voltages may be compared with one another by relative terms such as "greater", "less", or "equal", for example. It is understood that, in some aspects, a comparison may include the sign (positive or negative) of the voltage value or, in other aspects, the absolute voltage values are considered for the comparison. As an example, an n-type (e.g. ferroelectric) field-effect transistor (FET) based memory cell may have a low threshold voltage (LVT) and a high threshold voltage (HVT), wherein the HVT may be greater than the LVT both with respect to the voltage value and the absolute voltage value (e.g. the LVT may be 1 V and the HVT may be 3 V, only as numerical examples) or wherein the HVT may be greater than the LVT only with respect to the voltage value (e.g. the LVT may be −1 V and the HVT may be 1 V, or the LVT may be −2 V and the HVT may be 0 V, or the LVT may be −3 V and the HVT may be −1 V, only as numerical examples). As another example, a p-type (e.g. ferroelectric) field-effect transistor (FET) based memory cell may have a low threshold voltage (LVT) and a high threshold voltage (HVT), wherein the HVT may be lower than the LVT with respect to the voltage value and higher than the LVT with respect to the absolute voltage value (e.g. the LVT may be −1 V and the HVT may be −3 V, only as numerical examples) or wherein the HVT may be lower than the LVT only with respect to the voltage value (e.g. the LVT may be 1 V and the HVT may be −1 V, or the LVT may be 2 V and the HVT may be 0 V, or the LVT may be 3 V and the HVT may be 1 V, only as numerical examples).

According to various aspects, a threshold voltage of a field-effect transistor or a field-effect transistor based memory cell may be a constant-current threshold voltage ($V_{T(ci)}$). In this case, the constant-current threshold voltage ($V_{T(ci)}$) may be a gate-source voltage at which the drain current is equal to a predefined (constant) current ($I_D$). The predefined (constant) current may be a reference current ($I_{D0}$) times the ratio of gate width (W) to gate length (L). The magnitude of the reference current may be selected to be appropriate for a given technology, e.g. 0.1 μA. In some aspects, the constant-current threshold voltage ($V_{T(ci)}$) may be determined based on the following equation:

$$V_{T(ci)} = V_{GS} \text{ (at } I_D = I_{D0} W/L\text{)}.$$

Changing or setting a memory state may be referred to as writing (e.g. programming and/or erasing) the memory cell. In other words, a memory state of one or more memory cells may be changed by one or more write operations. As an example, a first write operation may include changing a memory state of a memory cell from a logic "0" to a logic "1" (also referred to as programming) and a second write operation may include changing a memory state of a memory cell from a logic "1" to a logic "0" (also referred to as erasing). However, the definition of a programming operation and/or an erase operation may be selected arbitrarily. According to various aspects, a memory cell may have at least two distinct states, e.g. with two distinct electrical conductivities that can be determined to determine in which of the at least two distinct states the memory cell is. As an example, a remanent-polarizable memory cell may include a first memory state, e.g. a low threshold voltage state (LVT), and a second memory state, e.g. a high threshold voltage state (HVT). The high threshold voltage state (HVT) may be associated with a lower current flow during read-out than the low threshold voltage state (LVT). In other words, the low threshold voltage state (LVT) may be an electrically conducting state (e.g. associated with a logic "1") and the high threshold voltage state (HVT) may be an electrically non-conducting (or at least less conducting) state (e.g. associated with a logic "0"). However, the definition of the LVT and the HVT and/or the definition of a logic "0" and a logic "1" may be selected arbitrarily.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device.

In some aspects, a non-volatile memory technology may be based on at least one ferroelectric field-effect transistor (FeFET). As an example, a memory cell may include a field-effect transistor (FET) having a ferroelectric material as a gate insulator. As another example, a memory cell may include a field-effect transistor (FET) and a ferroelectric capacitor structure coupled to a gate electrode of the field-effect transistor to provide a ferroelectric field-effect transistor (FeFET) structure. Since a ferroelectric material has at least two stable polarization states, it may be used to shift a threshold voltage of a field-effect transistor in a non-volatile fashion; and, therefore, it may be used to turn the field-effect transistor into a non-volatile field-effect transistor that stores its state in a non-volatile fashion, when power is removed.

In comparison to other emerging memory technologies, a FeFET based memory cell may be integrated in the Front-End-of-Line (FEoL) and/or in the Back-End-of-Line (BEoL) process flow, since it may be implemented as a transistor-type of memory. Accordingly, the integration of the FeFET based memory cell may comply with a standard FEoL and/or BEoL complementary metal-oxide-semiconductor (CMOS) process flow. Consequently, various different integration schemes may be used to integrate a FeFET in different process technologies, e.g., gate-first technologies, gate-last technologies, fully-depleted silicon-on-insulator (FDSOI) technologies, Fin-FET technologies, nanosheet technologies, nanowire technologies, as examples.

According to some aspects, a FeFET based memory cell may include a plurality of (e.g. two) FeFET structures. This allows for an implementation of a ternary memory cell, e.g. a content-addressable memory (CAM) cell. A ternary memory cell may be based on one or more FeFET structures and, therefore, may be integrated together with one or more logic transistors in a CMOS process flow. The integration of one or more FeFET memory cells on a CMOS process platform may be carried out in a gate-first process technology. However, FeFET memory cells may be implemented into other process technologies, wherein different integration schemes may be used. The FeFET memory cells may be integrated, for example, next to one or more logic circuit structures, e.g., next to one or more processor cores on a chip. However, the FeFET memory cells may be integrated independently from other structures. According to various aspects, a FeFET based memory cell may be provided with a feature size equal to or less than about 45 nm.

According to various aspects, a ferroelectric material may be used as part of a memory cell. The ferroelectric material may be or may include ferroelectric $HfO_2$. Ferroelectric $HfO_2$ may include any form of hafnium oxide that may exhibit ferroelectric properties. This may include, for example, pure $HfO_2$, a solid solution of $HfO_2$ and $ZrO_2$ (e.g. but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide.

Various aspects may be related to a remanently-polarizable layer as memory layer or as a functional part of a memory cell. In general, a remanent polarization (also referred to as retentivity or remanence) may be present in a material layer in the case that the material layer may remain polarized upon reduction of an applied electric field (E) to zero; therefore, a certain value for the electrical polarization (P) of the material layer may be detected. Illustratively, a polarization remaining in a material, when the electric field is reduced to zero, may be referred to as remanent polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to described remanent magnetization in magnetic materials.

Further, the term spontaneously polarized or spontaneous polarization may be used with reference to a residual polarization, e.g., the polarization capability of a material beyond dielectric polarization. The coercivity of a material may be a measure of the strength of the reverse polarizing electric field that may be required to remove a remanent polarization. A remanent polarization may be evaluated via analyzing one or more hysteresis measurements (e.g., hysteresis curves), e.g., in a plot of P versus E, in which the material is polarized into opposite directions. The polarization capability of a material (e.g., the dielectric polarization, the spontaneous polarization, and/or the remanent polarization) may be analyzed using capacity spectroscopy, e.g., via a static capacitance-voltage measurement and/or time-resolved capacitance-voltage measurements, by polarization-voltage (P-V) measurements, and/or positive-up-negative-down (PUND) measurements.

In general, a FeFET based memory cell array may be operated based on one or more write operations (e.g. program and/or erase operations) and/or one or more read operations. During a write operation, as example, predefined voltages may be applied at electrical lines (also referred to as control lines or driver lines), wherein the electrical lines may be connected to the respective memory cells to allow for the desired operation. The electrical lines may be referred to as word-lines, source-lines, and/or bit-lines, as examples. One approach to program and/or erase a plurality of memory cells may be a one-third (⅓) voltage scheme. Such a ⅓ voltage scheme may realize that one-third of a programming voltage (the programming voltage may be also referred to as write voltage) is only substantially exceeded at nodes corresponding to one or more memory cells that are intended to be programmed or erased. In other words, all memory cells that are not intended to be written may see a voltage that is substantially equal to or less than one-third of the programming voltage. The programming voltage may be defined by the type and/or design of memory cell. In some aspects, the programming voltage may be in the range from about 1 V to about 10 V. The programming voltage may be determined via one or more electrical measurements. Various timings may be used to provide the respective voltages, e.g. to provide the desired write voltages and/or the desired read-out voltages.

According to various aspects, a memory cell driver is provided that may be used to control one or more operations (e.g. one or more write operations) of one or more memory cells of a memory cell arrangement. The memory cell driver may be also referred to as memory cell driver circuit (or, abbreviated, as driver circuit). In some aspects, the memory cell driver described herein may be used to efficiently implement a ⅓ VPP scheme, wherein VPP is a programming voltage that may be used for programming and/or erasing the one or more memory cells. The ⅓ VPP scheme may include illustratively providing various voltages during a write operation (e.g. during programing and/or erasing) in such a way that only one or more memory cells of the memory cell arrangement that are intended to be written are actually written. In some aspects, a read-out scheme with corresponding read-out voltages may be used during a read operation. The read-out scheme may be different from the writing scheme, e.g. may include different voltages. According to various aspects, a read-out circuit may be used in addition to a writing circuit, wherein the writing circuit may include a plurality of memory cell drivers as described herein. According to other aspects, a read-out circuit and a writing circuit may be implemented into a single read-out/write circuit, wherein the read-out/write circuit includes a plurality of memory cell drivers as described herein.

In some aspects, a memory cell driver may be implemented based on a number of transistors (e.g. in CMOS technology), wherein a design for a memory cell driver is described herein that is based on a minimal number of transistors. This may lead to a lowest possible circuit complexity.

According to various aspects, a driver circuit for a FeFET based memory cell is provided. In some aspects, a memory cell arrangement is provided that includes a plurality of memory cells (e.g. a plurality of a FeFET based memory cells), wherein a plurality of memory cell drivers is used to drive (in other words to operate or to control an operation of) the memory cell arrangement. According to various aspects, the memory cell drivers may be connected with the plurality of memory cells in an array configuration. As an example, a first set of (m) memory cell drivers and a second set of (n) memory cell drivers may be used to individually address each memory cell of an array A(n,m) with n times m memory cells. It is understood that m may be an integer number greater than one and that n may be an integer number greater than one.

According to various aspects, a control scheme and a voltage supply circuit implementing the control scheme are provided. The control scheme may include a generation of a plurality of supply voltages (e.g., two or more programming voltages, two or more erase voltages and one or more corresponding inhibit voltages) to efficiently write (e.g., program and/or erase) one or more memory cells of a memory cell arrangement. The one or more memory cells of the memory cell arrangement may be ferroelectric memory cells. The control scheme may include a digital control of the generated supply voltages. The digital control of the generated supply voltages may allow for an efficient writing of one or more memory cells of a memory cell arrangement without affecting information stored in all other memory cells of the memory cell arrangement that are not intended to be written.

According to various aspects, the control scheme or the voltage supply circuit implementing the control scheme may be configured to assure that the memory cells that are not intended to be written will not be subjected to a gate/source voltage and/or a gate/drain voltage (i.e., the voltage drop between the gate terminal and the source/drain terminal(s) of the memory cell) that is higher than the 1/N-times the write voltage (also referred to as programming voltage VPP) during a write operation; wherein N may be an integer number greater than 1 (e.g., 2, 3, or 4). The write operation may include a voltage ramp up time interval, a write time interval, and a voltage ramp down time interval. According to various aspects, the control scheme or the voltage supply circuit implementing the control scheme may be configured to assure that the memory cells that are not intended to be written will not be subjected to a gate/source voltage and/or a gate/drain voltage that is higher than the 1/N-times the write voltage during the voltage ramp up time interval, the write time interval, and the voltage ramp down time interval.

According to various aspects, all supply voltages that are used to write memory cells of the memory cell array (e.g., including one or more inhibit voltages) can be varied efficiently according to the respective requirement by setting the digital inputs that control the operation of the digitally controlled voltage converters (e.g., digitally controlled charge pumps). According to various aspects, a significant area reduction may be realized based on the control scheme using a digital control of the voltage converters. According to various aspects, a direct connection of the one or more voltage converters to corresponding row and column decoders may be used, which may ensure that the desired target voltages on the control lines (e.g., on the word-lines, WLs, on the source-lines, SLs, and one the bit-lines BLs) can be provided via a controlled ramping.

According to various aspects, the inhibition of writing memory cells that are not intended to be written may be ensured during supply voltage ramp up and supply voltage ramp down as well as afterwards.

FIG. 1A shows a voltage supply circuit 100 in a schematic view, according to various aspects. The voltage supply circuit 100 may include a first digitally controlled voltage converter circuit 110-(1) and a second digitally controlled voltage converter circuit 110-(2), according to some aspects. The voltage supply circuit 100 may further include a control circuit 120 configured to ramp a first output voltage $V_{out}(1)$ generated by the first digitally controlled voltage converter circuit 110-(1) selectively up and down as a function of a first digital control signal $S_D(1)$ provided thereto. The control circuit 120 may be further configured to ramp a second output voltage $V_{out}(2)$ generated by the second digitally controlled voltage converter circuit 110-(2) selectively up and down as a function of a second digital control signal $S_D(1)$ provided thereto. According to various aspects, the control circuit 120 may be configure to control the ramping of the output voltages $V_{out}(1)$, $V_{out}(2)$ in accordance with a control scheme (e.g., a voltage control scheme or a voltage regulation scheme) as described herein.

As exemplarily illustrated in FIG. 1A, each of the digitally controlled voltage converter circuits 110-(1), 110-(2) may include a digital input node 110d-(1), 110d-(2) to receive the respective digital control signal $S_D(1)$, $S_D(2)$. As further exemplarily illustrated in FIG. 1A, each of the digitally controlled voltage converter circuits 110-(1), 110-(2) may include a voltage output node 110o-(1), 110o-(2) to output the respective output voltage $V_{out}(1)$, $V_{out}(2)$.

According to various aspects, each of the digitally controlled voltage converter circuits 110-(1), 110-(2) may include or may be a digitally controlled charge pump circuit. In this case, the respective digitally controlled voltage converter circuit 110-(1), 110-(2) (e.g., the digitally controlled charge pump circuit) may receive an input voltage $V_{in}(1)$, $V_{in}(2)$ at a respective input node 110i-(1), 110i(2) and generate the respective output voltage $V_{out}(1)$, $V_{out}(2)$ via a suitable charge pump control scheme as a function of the received digital control signal $S_D(1)$, $S_D(2)$, as exemplarily illustrated in FIG. 1B. The generation of an output voltage $V_{out}$ based on an input voltage $V_{in}$ via one or more charge pumps of a charge pump circuit may be implemented based on one of various well known techniques, e.g., via one or more latch charge pumps, or via one or more bootstrap charge pumps, or via any other suitably voltage converter circuits.

Figure 1B:
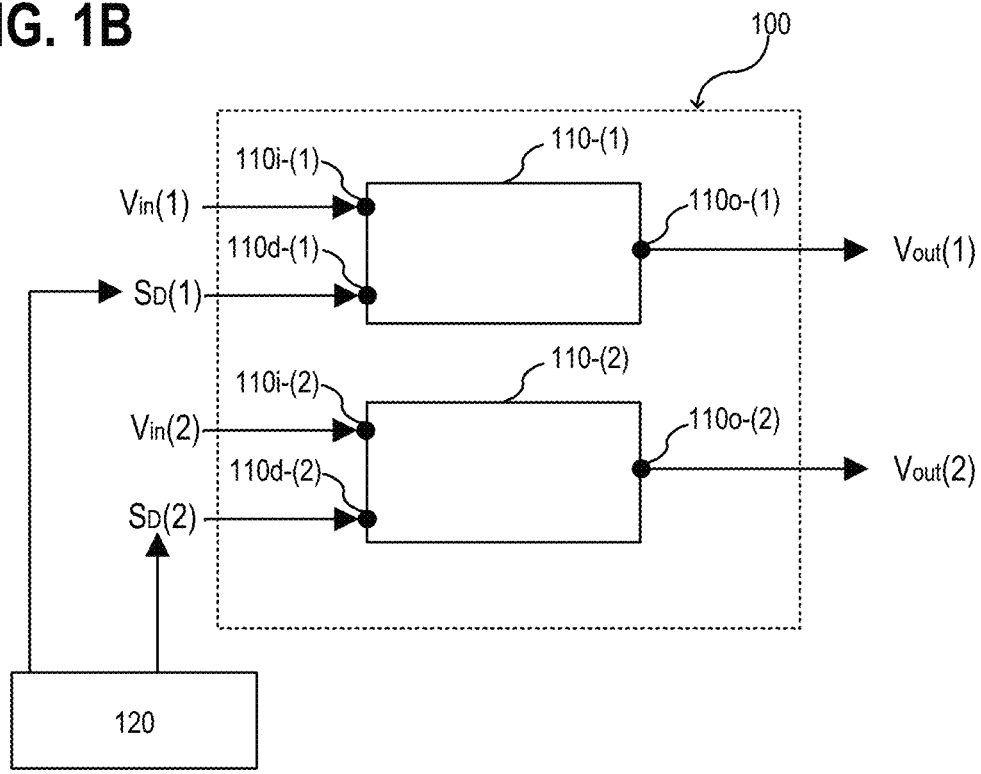
Figure 1C:
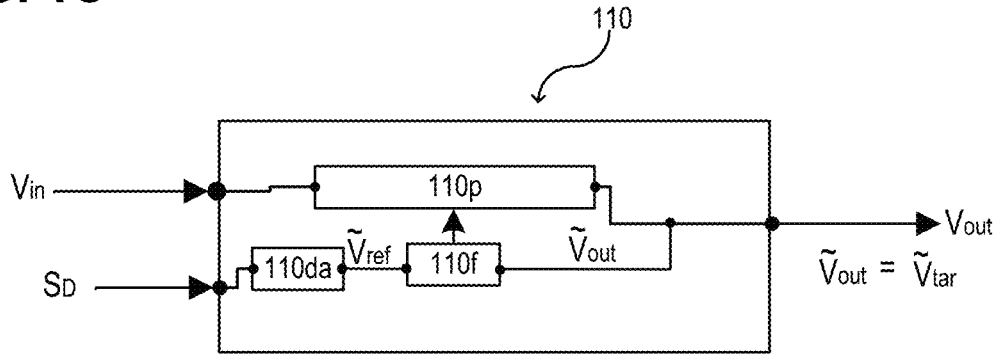

FIG. 1C shows exemplarily a voltage converter circuit 110, according to various aspects. The voltage converter circuit 110 may include one or more charge pumps 110p and a feedback loop 110f configured to compare an actual voltage value $\tilde{V}_{out}$ of the output voltage $V_{out}$ or a representative thereof with a corresponding reference voltage value $\tilde{V}_{ref}$ and control the operation of the one or more charge pumps 110p based on the comparison such that the actual voltage value $\tilde{V}_{out}$ matches a target voltage value $\tilde{V}_{tar}$. According to various aspects, the reference voltage value $\tilde{V}_{ref}$ may define the target voltage value $\tilde{V}_{tar}$ to be output by the one or more charge pumps 110p. According to various aspects, the reference voltage value $\tilde{V}_{ref}$ may be provided based on the received digital control signal $S_D$ via a digital-to-analog (D/A) voltage converter circuit 110da. This allows a digital control of the voltage converter circuit 110, wherein the target voltage value $\tilde{V}_{tar}$ for the output voltage $V_{out}$ may be set via the digital control signal $S_D$. According to various aspects, the feedback loop 110f may include a comparator to compare the reference voltage value $\tilde{V}_{ref}$ with the actual voltage value $\tilde{V}_{out}$ of the output voltage $V_{out}$ or a representative thereof. For ramping the actual voltage value $\tilde{V}_{out}$ of the output voltage $V_{out}$ up or down to a target voltage value $\tilde{V}_{tar}$, the one or more charge pumps 110p may be activated in the case that the reference voltage value $V_{ref}$ is less than the actual voltage value $V_{out}$ of the output voltage $V_{out}$ or the representative thereof (in this case, the actual voltage value $\tilde{V}_{out}$ of the output voltage $V_{out}$ may be less than the target voltage value $\tilde{V}_{tar}$) and deactivated in the case that the reference voltage value $\tilde{V}_{ref}$ is greater than the actual voltage value $\tilde{V}_{out}$ of the output voltage $V_{out}$ or the representative thereof (in this case, the actual voltage value $\tilde{V}_{out}$ of the output voltage $V_{out}$ may be greater than the target voltage value $\tilde{V}_{tar}$).

Figure 1D:
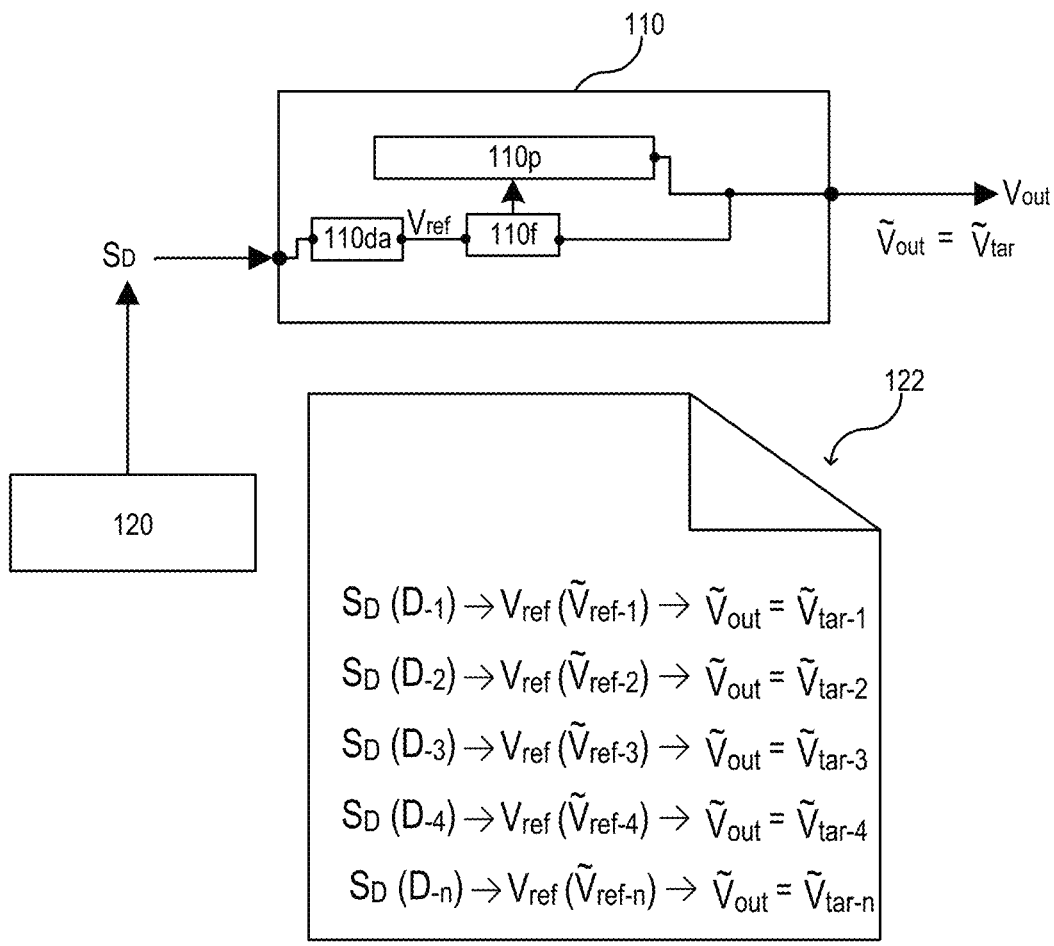

FIG. 1D shows exemplarily a digital control scheme 122, according to various aspects. The voltage converter circuit 110 may be controlled via a control circuit 120 in accordance with the digital control scheme 122 and/or the digital control scheme 122 may be implemented via the control circuit 120. The control circuit 120 may be or may include one or more processors. A processor may be any hardware, software, or combination of hardware and software that allows implementing the desired control functions.

According to various aspects, the digital control scheme 122 may include to ramp the actual voltage value $\tilde{V}_{out}$ of the output voltage $V_{out}$ to one target voltage value $\tilde{V}_{tar}$ of a set of target voltage values $\tilde{V}_{tar-1}$, $\tilde{V}_{tar-2}$, ..., $\tilde{V}_{tar-n}$ controlled via the digital control signal $S_D$. Only as example, in the case that the digital control signal $S_D$ that is provided to the voltage converter circuit 110, e.g., from the control circuit 120, may represent a first digital value $D_{-1}$, the actual voltage value $\tilde{V}_{out}$ of the output voltage $V_{out}$ may be ramped to a first target voltage value $\tilde{V}_{tar-1}$. In this case, the one or more charge pumps 110p of the voltage converter circuit 110 may be controlled based on the digital control signal $S_D$, wherein the first digital value $D_{-1}$ may instruct the D/A voltage converter circuit 110da to output the reference voltage $V_{ref}$ with a first reference voltage value $\tilde{V}_{ref-1}$, wherein the first reference voltage value $\tilde{V}_{ref-1}$ causes the feedback loop 110f to control the one or more charge pumps 110p of the voltage converter circuit 110 such that the actual voltage value $\tilde{V}_{out}$ of the output voltage $V_{out}$ matches a first target voltage value $\tilde{V}_{tar-1}$. The first digital value $D_{-1}$ may define (e.g., set) the reference voltage value $\tilde{V}_{ref}$ of the reference voltage $V_{ref}$ that serves as a basis in the feedback loop 110f such that the actual voltage value $\tilde{V}_{out}$ of the output voltage $V_{out}$ is controlled to match a target voltage value $\tilde{V}_{tar-1}$ corresponding to the first digital value $D_{-1}$. As another example, in the case that the digital control signal $S_D$ that is provided to the voltage converter circuit 110, e.g., from the control circuit 120, may represent a second digital value $D_{-2}$, the actual voltage value $\tilde{V}_{out}$ of the output voltage $V_{out}$ may be ramped to a second target voltage value $\tilde{V}_{tar-2}$. In this case, the one or more charge pumps 110p of the voltage converter circuit 110 may be controlled based on the digital control signal $S_D$, wherein the second digital value $D_{-2}$ may instruct the D/A voltage converter circuit 110da to output the reference voltage $V_{ref}$ with a second reference voltage value $\tilde{V}_{ref-2}$, wherein the second reference voltage value $\tilde{V}_{ref-2}$ causes the feedback loop 110f to control the one or more charge pumps 110p of the voltage converter circuit 110 such that the actual voltage value $V_{out}$ of the output voltage $V_{out}$ matches a second target voltage value $\tilde{V}_{tar-2}$. The second digital value $D_{-2}$ may define (e.g., set) the reference voltage value $\tilde{V}_{ref}$ of the reference voltage $V_{ref}$ that serves as a basis in the feedback loop 110f such that the actual voltage value $\tilde{V}_{out}$ of the output voltage $V_{out}$ is controlled to match a target voltage value $\tilde{V}_{tar-2}$ corresponding to the second digital value $D_{-2}$. As still another example, in the case that the digital control signal $S_D$ that is provided to the voltage converter circuit 110, e.g., from the control circuit 120, may represent a third digital value $D_{-3}$, the actual voltage value $\tilde{V}_{out}$ of the output voltage $V_{out}$ may be ramped to a third target voltage value $\tilde{V}_{tar-3}$. In this case, the one or more charge pumps 110p of the voltage converter circuit 110 may be controlled based on the digital control signal $S_D$, wherein the third digital value $D_{-3}$ may instruct the D/A voltage converter circuit 110da to output the reference voltage $V_{ref}$ with a third reference voltage value $\tilde{V}_{ref-3}$, wherein the third reference voltage value $\tilde{V}_{ref-3}$ causes the feedback loop 110f to control the one or more charge pumps 110p of the voltage converter circuit 110 such that the actual voltage value $\tilde{V}_{out}$ of the output voltage $V_{out}$ matches a third target voltage value $\tilde{V}_{tar-3}$. The third digital value $D_{-3}$ may define (e.g., set) the reference voltage value $\tilde{V}_{ref}$ of the reference voltage $V_{ref}$ that serves as a basis in the feedback loop 110f such that the actual voltage value $\tilde{V}_{out}$ of the output voltage $V_{out}$ is controlled to match a target voltage value $\tilde{V}_{tar-3}$ corresponding to the third digital value $D_{-3}$. As still another example, in the case that the digital control signal $S_D$ that is provided to the voltage converter circuit 110, e.g., from the control circuit 120, may represent a fourth digital value $D_{-4}$, the actual voltage value $\tilde{V}_{out}$ of the output voltage $V_{out}$ may be ramped to a fourth target voltage value $\tilde{V}_{tar-4}$. In this case, the one or more charge pumps 110p of the voltage converter circuit 110 may be controlled based on the digital control signal $S_D$, wherein the fourth digital value $D_{-4}$ may instruct the D/A voltage converter circuit 110da to output the reference voltage $V_{ref}$ with a fourth reference voltage value $\tilde{V}_{ref-4}$, wherein the fourth reference voltage value $\tilde{V}_{ref-4}$ causes the feedback loop 110f to control the one or more charge pumps 110p of the voltage converter circuit 110 such that the actual voltage value $\tilde{V}_{out}$ of the output voltage $V_{out}$ matches a fourth target voltage value $\tilde{V}_{tar-4}$. The fourth digital value $D_{-4}$ may define (e.g., set) the reference voltage value $\tilde{V}_{ref}$ of the reference voltage $V_{ref}$ that serves as a basis in the feedback loop 110f such that the actual voltage value $V_{out}$ of the output voltage $V_{out}$ is controlled to match a target voltage value $\tilde{V}_{tar-4}$ corresponding to the fourth digital value $D_{-4}$. The voltage converter circuit 110 may be digitally controlled such that the output voltage $V_{out}$ matches selectively as many as desired distinct target voltage values $\tilde{V}_{tar-1}$, $\tilde{V}_{tar-2}$, ..., $\tilde{V}_{tar-n}$, each target voltage value may correspond to one distinct digital value $D_{-1}$, $D_{-2}$, ..., $D_{-n}$ represented by the control signal.

According to various aspects, each of the digitally controlled voltage converter circuits 110-(1), 110-(2) of the voltage supply circuit 100 may be configured as described with reference to FIG. 1C and FIG. 1D. However, there may be various other possibilities to implement the digitally controlled voltage converter circuits 110-(1), 110-(2) and the digital control scheme 122 described herein.

The voltage supply circuit 100 illustrated exemplarily in FIG. 1A and FIG. 1B may include two digitally controlled voltage converter circuits 110-(1), 110-(2) as illustrated to provide two output voltages $V_{out}(1)$, $V_{out}(2)$ that can be digitally controlled independently from one another. However, the voltage supply circuit 100 may include more than two digitally controlled voltage converter circuits (e.g., three, four, five, or more than five digitally controlled voltage converter circuits) to provide more than two output voltages (e.g., three, four, five, or more than five output voltages) that can be digitally controlled independently from one another.

Figure 3:
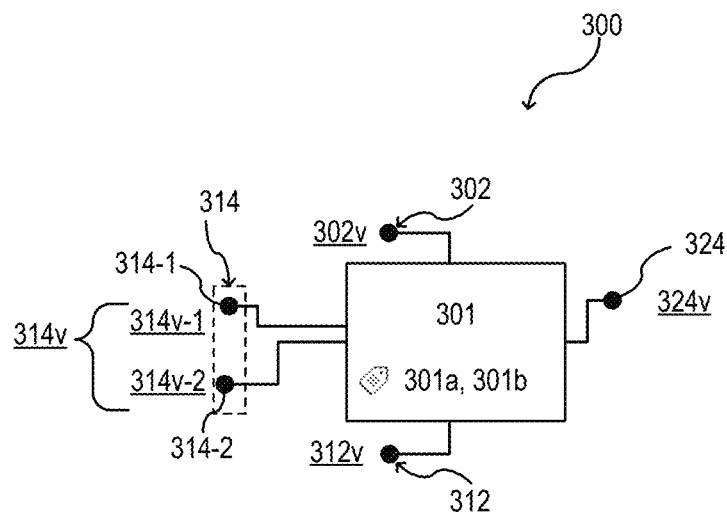
FIG. 3 shows a memory cell driver for driving a memory cell in a schematic view, according to various aspects.

According to various aspects, the voltage supply circuit 100 may be used to provide a plurality of supply voltages to a memory driver, e.g. to provide two supply voltages to a memory driver 300 as shown, for example, in FIG. 3. In some further aspects, the voltage supply circuit 100 may be used to provide a plurality of supply voltages to a plurality of memory drivers of a memory cell arrangement. As an example, the voltage supply circuit 100 may be used to supply four supply voltages to a plurality of memory drivers 300 of a memory cell arrangement 400, 500, as shown, for example, in FIG. 4A, FIG. 4B, and FIGS. 5A to 5D. In some aspects, one of the supply voltages may be zero volt or any suitable reference voltage (e.g. the ground voltage). In other aspects, each of the supply voltages may be different from zero volt or the reference voltage (e.g. different from the ground voltage).

According to various aspects, voltage converter circuits of a voltage supply circuit 100 may be digitally controlled such that the respective output voltages $V_{out}(1, \ldots, n)$ provided by the voltage supply circuit 100 via the digitally controlled voltage converter circuits are ramped (e.g., up or down) and holed (e.g., for a predefined time during a write operation) with a predefined relationship to one another.

FIG. 2A illustrates a control scheme 200a for controlling a voltage supply circuit, e.g., the voltage supply circuit 100 illustrated in FIG. 1A, according to various aspects. According to various aspects, the control scheme 200a described in FIG. 2A may be carried out or may be implemented via the control circuit 120 of the voltage supply circuit 100.

According to various aspects, the control scheme 200a may include or the control circuit 120 of the voltage supply circuit 100 may be configured to ramp (via the first digitally controlled voltage converter circuit 110-(1)) a voltage value $\tilde{V}_{out}(1)$ of a first output voltage $V_{out}(1)$ from a first target voltage value $\tilde{V}_{tar-1}$ (e.g., up) to a third target voltage value $\tilde{V}_{tar-3}$ by generating a first digital control signal $S_D(1)$ (e.g., supplied to the first digitally controlled voltage converter circuit 110-(1)) such that the voltage value $\tilde{V}_{out}(1)$ of the first output voltage $V_{out}(1)$ matches a second target voltage value $\tilde{V}_{tar-2}$ during (e.g., at the end of) a first ramp interval T1, and the third target voltage value $\tilde{V}_{tar-3}$ during (e.g., at the end of) a second ramp interval T2. The ramping of the voltage value $\tilde{V}_{out}(1)$ of a first output voltage $V_{out}(1)$ from a first target voltage value $\tilde{V}_{tar-1}$ (e.g., up) to a third target voltage value $\tilde{V}_{tar-3}$ may start at the beginning of the first ramp interval T1.

According to various aspects, the control scheme 200a may further include or the control circuit 120 of the voltage supply circuit 100 may be further configured to ramp (via the second digitally controlled voltage converter circuit 110-(2)) a voltage value $\tilde{V}_{out}(2)$ of a second output voltage $V_{out}(2)$ from the first target voltage value $\tilde{V}_{tar-1}$ (e.g., up) to the second target voltage value $\tilde{V}_{tar-2}$ by generating a second digital control signal $S_D(2)$ (e.g., supplied to the second digitally controlled voltage converter circuit 110-(2)) such that the voltage value $\tilde{V}_{out}(2)$ of the second output voltage $V_{out}(2)$ matches the second target voltage value $\tilde{V}_{tar-2}$ during (e.g., at the end of) the first ramp interval T1, and the second target voltage value $\tilde{V}_{tar-2}$ during (e.g., at the end of) the second ramp interval T2. The ramping of the voltage value $\tilde{V}_{out}(2)$ of a second output voltage $V_{out}(2)$ from the first target voltage value $\tilde{V}_{tar-1}$ (e.g., up) to the second target voltage value $\tilde{V}_{tar-2}$ may start at the beginning of the first ramp interval T1.

It has to be noted that, if the second output voltage $V_{out}(2)$ would be ramped to the second target voltage value $\tilde{V}_{tar-2}$ later, e.g., during the second ramp interval T2 and not during the first ramp interval T1, it may be possible that a voltage difference between the actual voltage values $\tilde{V}_{out}(1)$, $\tilde{V}_{out}(2)$ of the first output voltage $V_{out}(1)$ and the second output voltage $V_{out}(2)$ exceeds a predefined value that may not be desired in some electric circuits that could be supplied with supply voltages $\tilde{V}_{out}(1)$, $\tilde{V}_{out}(2)$ by the voltage supply circuit 100, e.g., a memory arrangement or a transistor arrangement, as described in more detail below. By using the control scheme 200a, it may be assured that the voltage difference (e.g., the absolute value of the voltage difference) between the actual voltage values $\tilde{V}_{out}(1)$, $\tilde{V}_{out}(2)$ of the first output voltage $V_{out}(1)$ and the second output voltage $V_{out}(2)$ do neither exceed the voltage difference (e.g., the absolute value of the voltage difference) between the first target voltage value $\tilde{V}_{tar-1}$ and the second target voltage value $\tilde{V}_{tar-2}$ nor between the second target voltage value $\tilde{V}_{tar-2}$ and the third target voltage value $\tilde{V}_{tar-3}$.

Figure 2B:
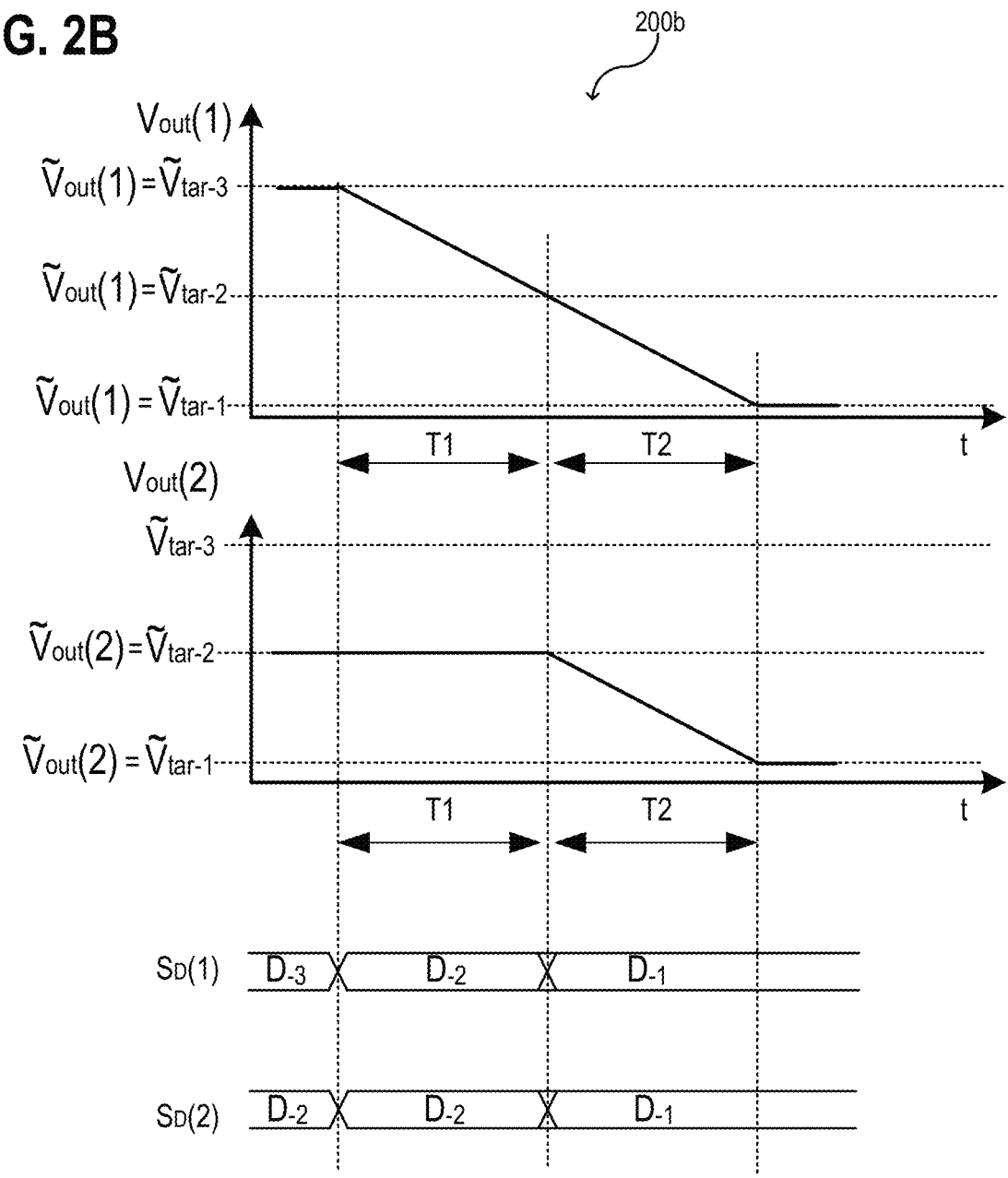

FIG. 2B illustrates a control scheme 200b for controlling a voltage supply circuit, e.g., the voltage supply circuit 100 illustrated in FIG. 1A, according to various aspects. According to various aspects, the control scheme 200b described in FIG. 2B may be carried out or may be implemented via the control circuit 120 of the voltage supply circuit 100.

According to various aspects, the control scheme 200b may include or the control circuit 120 of the voltage supply circuit 100 may be configured to ramp (via the first digitally controlled voltage converter circuit 110-(1)) a voltage value $\tilde{V}_{out}(1)$ of a first output voltage $V_{out}(1)$ from a third target voltage value $\tilde{V}_{tar-3}$ (e.g., down) to a first target voltage value $\tilde{V}_{tar-1}$ by generating a first digital control signal $S_D(1)$ (e.g., supplied to the first digitally controlled voltage converter circuit 110-(1)) such that the voltage value $\tilde{V}_{out}(1)$ of the first output voltage $V_{out}(1)$ matches a second target voltage value $\tilde{V}_{tar-2}$ during (e.g., at the end of) a first ramp interval T1, and the first target voltage value $\tilde{V}_{tar-1}$ during (e.g., at the end of) a second ramp interval T2.

According to various aspects, the control scheme 200b may further include or the control circuit 120 of the voltage supply circuit 100 may be further configured to ramp (via the second digitally controlled voltage converter circuit 110-(2)) a voltage value $\tilde{V}_{out}(2)$ of a second output voltage $V_{out}(2)$ from the second target voltage value $\tilde{V}_{tar-2}$ (e.g., down) to the first target voltage value $\tilde{V}_{tar-1}$ by generating a second digital control signal $S_D(2)$ (e.g., supplied to the second digitally controlled voltage converter circuit 110-(2)) such that the voltage value $\tilde{V}_{out}(2)$ of the second output voltage $V_{out}(2)$ matches the second target voltage value $\tilde{V}_{tar-2}$ during (e.g., at the end of) the first ramp interval T1, and the first target voltage value $\tilde{V}_{tar-1}$ during (e.g., at the end of) the second ramp interval T2.

It has to be noted that, if the second output voltage $V_{out}(2)$ would be ramped to the first target voltage value $\tilde{V}_{tar-1}$ earlier, e.g., during the first ramp interval T1 and not during the second ramp interval T2, it may be possible that a voltage difference between the actual voltage values $\tilde{V}_{out}(1)$, $\tilde{V}_{out}(2)$ of the first output voltage $V_{out}(1)$ and the second output voltage $V_{out}(2)$ exceeds a predefined value that may not be desired in some electric circuits that could be supplied with supply voltages $\tilde{V}_{out}(1)$, $\tilde{V}_{out}(2)$ by the voltage supply circuit 100, e.g., a memory arrangement or a transistor arrangement, as described in more detail below. By using the control scheme 200b, it may be assured that the voltage difference (e.g., the absolute value of the voltage difference) between the actual voltage values $\tilde{V}_{out}(1)$, $\tilde{V}_{out}(2)$ of the first output voltage $V_{out}(1)$ and the second output voltage $V_{out}(2)$ do neither exceed the voltage difference (e.g., the absolute value of the voltage difference) between the first target voltage value $\tilde{V}_{tar-1}$ and the second target voltage value $\tilde{V}_{tar-2}$ nor between the second target voltage value $\tilde{V}_{tar-2}$ and the third target voltage value $\tilde{V}_{tar-3}$.

According to various aspects, an actual digital value represented by the digital control signal $S_D$ may define the actual target voltage value $\tilde{V}_{tar}$ towards which the respective output voltage $V_{out}$ is converted from an input voltage via the corresponding voltage converter circuit 110.

As an example, as illustrated in FIG. 2A and FIG. 2B, the actual digital value $D_{-1}$, $D_{-2}$, $D_{-3}$ represented by the first digital control signal $S_D(1)$ may define whether the actual voltage value $\tilde{V}_{out}(1)$ of the first output voltage $V_{out}(1)$ is matched to the first target voltage value $\tilde{V}_{tar-1}$, the second target voltage value $\tilde{V}_{tar-2}$, or the third target voltage value $\tilde{V}_{tar-3}$. Moreover, the actual digital value $D_{-1}$, $D_{-2}$ represented by the second digital control signal $S_D(2)$ may define whether the actual voltage value $\tilde{V}_{out}(2)$ of the second output voltage $V_{out}(2)$ is matched to the first target voltage value $\tilde{V}_{tar-1}$ or to the second target voltage value $\tilde{V}_{tar-2}$.

According to various aspects, the output voltage $V_{out}$ of each of the plurality of digitally controlled voltage converter circuits 101-(1, . . . , n) may be output by the voltage supply circuit 100 to supply one or more electronic components, e.g. to supply one or more memory cell drivers of a memory cell arrangement, e.g., to supply voltages to transistors of a transistor arrangement, only as examples.

FIG. 3 shows a memory cell driver 300 in a schematic view, according to various aspects. The memory cell driver 300 may include a select circuit 301. The memory cell driver 300 may further include a first supply node 302 to receive a first supply voltage 302v and a second supply node 312 to receive a second supply voltage 312v. The memory cell driver 300 may further include a plurality of addressing nodes 314 to receive a plurality of addressing voltages 314v. As an example, the memory cell driver 300 may include at least two addressing nodes 314-1, 314-2 to receive at least two addressing voltages 314v-1, 314v-2. The memory cell driver 300 may further include a driving node 324. As an example, the driving node 324 of the memory cell driver 300 may be used to output a driving voltage 324v to a single control-line (e.g. to a word-line, to a source-line, to a bit-line, etc.). As another example, the driving node 324 may be used to output a driving voltage 324v to more than one control-line (e.g. to both a source-line and a bit-line).

According to various aspects, the plurality of addressing nodes 314 may be used to control whether the select circuit 301 is in a first operating state 301a or in a second operating state 301b. Further, the plurality of addressing nodes 314 may be used to address one or more memory cells connected (e.g. electrically conductively connected) to the driving node 324 of the memory cell driver 300.

According to various aspects, the select circuit 301 may be connected (e.g. electrically conductively connected) to the first supply node 302, the second supply node 312, the plurality of addressing nodes 314, and the driving node 324. In some aspects, the first supply node 302 and the second supply node 312 may be used to supply the respective supply voltages to the select circuit 301. However, the select circuit 301 may receive one or more additional supply voltages, if desired. In some aspects, the plurality of addressing nodes 314 may be used to provide logic input states to the select circuit 301 (e.g., the select circuit 301 may be a logic circuit). According to various aspects, the select circuit 301 may be configured to connect (e.g. electrically conductively connect) either the first supply node 302 or the second supply node 312 to the driving node 324.

According to various aspects, the memory cell driver 300 may be operated via the voltage supply circuit 100. As an example, the first output voltage $V_{out}(1)$ generated via the voltage supply circuit 100 may be provided to the first supply node 302 of the memory cell driver 300 as first supply voltage 302v and the second output voltage $V_{out}(2)$ generated via the voltage supply circuit 100 may be provided to the second supply node 312 of the memory cell driver 300 as second supply voltage 312v.

In the case that the voltage supply circuit 100 is configured to provide four output voltages $V_{out}(1)$, $V_{out}(2)$, $V_{out}(3)$, $V_{out}(4)$, as described in more detail below, according to various aspects, the memory cell driver 300 may be operated selectively in a first operation mode (e.g., during programming one or more memory cells via the memory cell driver 300) or in a second operation mode (e.g., during erasing one or more memory cells via the memory cell driver 300) via the voltage supply circuit 100. As an example, in the first operation mode, the first output voltage $V_{out}(1)$ generated via the voltage supply circuit 100 may be provided to the first supply node 302 of the memory cell driver 300 as first supply voltage 302v and the second output voltage $V_{out}(2)$ generated via the voltage supply circuit 100 may be provided to the second supply node 312 of the memory cell driver 300 as second supply voltage 312v. As another example, in the second operation mode, the third output voltage $V_{out}(3)$ generated via the voltage supply circuit 100 may be provided to the first supply node 302 of the memory cell driver 300 as first supply voltage 302v and the fourth output voltage $V_{out}(4)$ generated via the voltage supply circuit 100 may be provided to the second supply node 312 of the memory cell driver 300 as second supply voltage 312v.

Figure 4A:
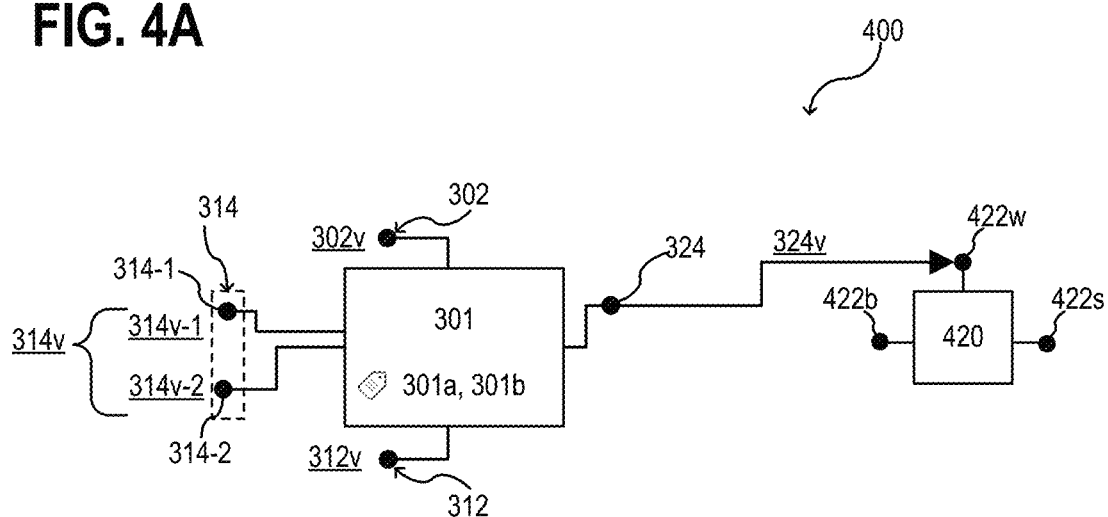
FIG. 4A and FIG. 4B schematically show a memory cell arrangement including a memory cell and a memory cell driver for driving the memory cell, according to various aspects.

FIG. 4A shows a memory cell arrangement 400 including a memory cell driver 300 and a memory cell 420, wherein a driving node 324 of the memory cell driver 300 is (e.g. electrically conductively) connected to a control node 422w of the memory cell 420. According to various aspects, one of the supply voltages 302v, 312v may be used to operate (e.g. to write) the memory cell 420. As illustrated in FIG. 4A, the control node 422w may be a first control node of the memory cell 420, e.g. a word-line node. However, the control node may be any other node of the memory cell 420. According to various aspects, the memory cell 420 may include one or more additional control nodes 422s, 422b, e.g. a source-line node 422s and a bit-line node 422b.

Figure 4B:
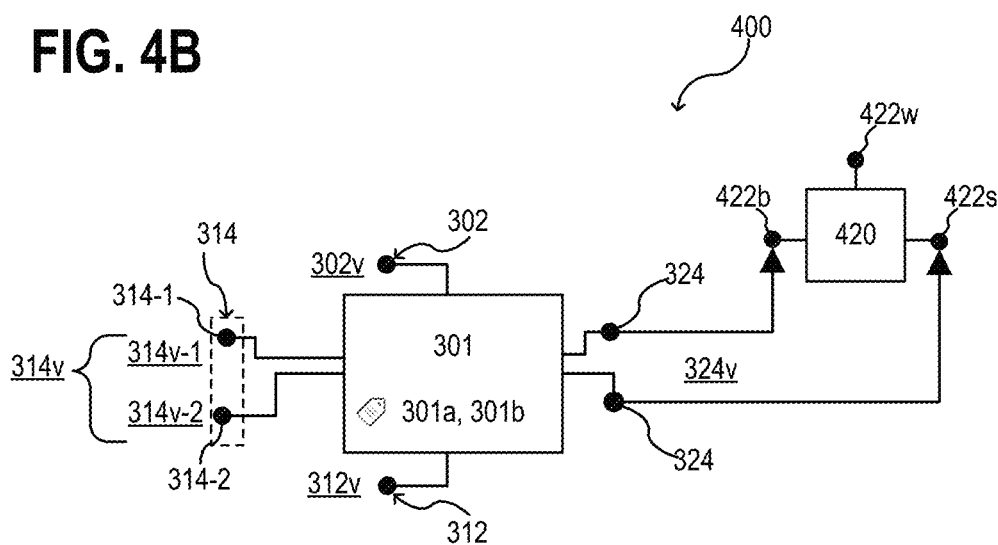

FIG. 4B shows a memory cell arrangement 400 including a memory cell driver 300 and a memory cell 420, wherein a driving node 324 of the memory cell driver 300 is electrically conductively connected to two control nodes 422s, 422b of the memory cell 420. According to various aspects, one of the supply voltages 302v, 312v may be used to operate (e.g. to write) the memory cell 420.

The memory cell 420 of the memory cell arrangement 400 illustrated in FIG. 4A and FIG. 4B may be a three terminal memory cell, i.e. the memory cell may be operated via three control nodes 422w, 422s, 422b also referred to as word-line node 422w, source-line node 422s, and bit-line node 422b. In the case that the memory cell 420 is a FeFET based memory cell, e.g. in the case that the memory cell 420 includes at least one FeFET to store information, the word-line node 422w may be connected to a gate region (or gate electrode) of the at least one FeFET, the source-line node 422s may be connected to a source region (or source electrode) of the at least one FeFET, and the bit-line node 422b may be connected to a drain region (or drain electrode) of the at least one FeFET.

Figure 5A:
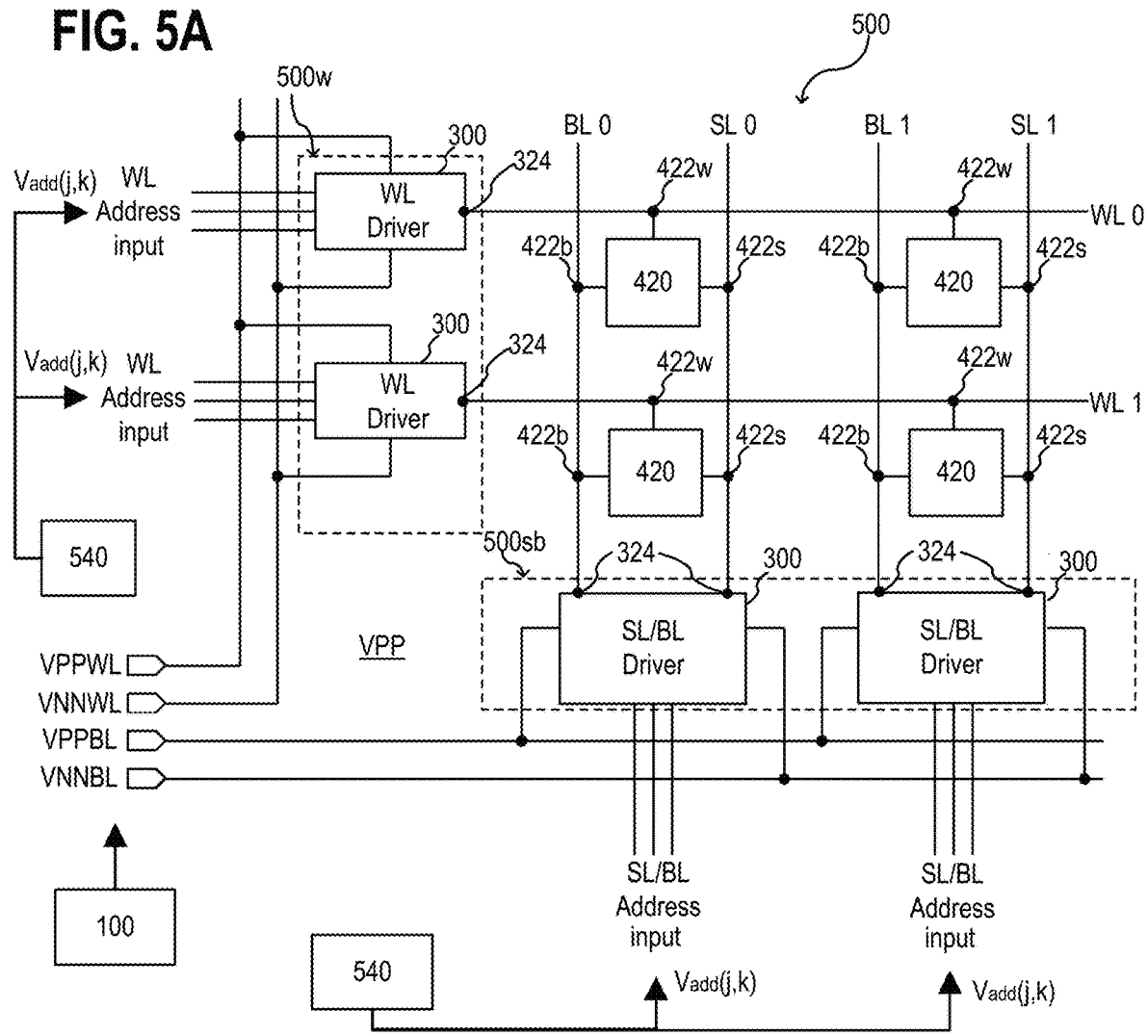
FIG. 5A shows a memory cell arrangement in a schematic view, according to various aspects.
Figure 5B:
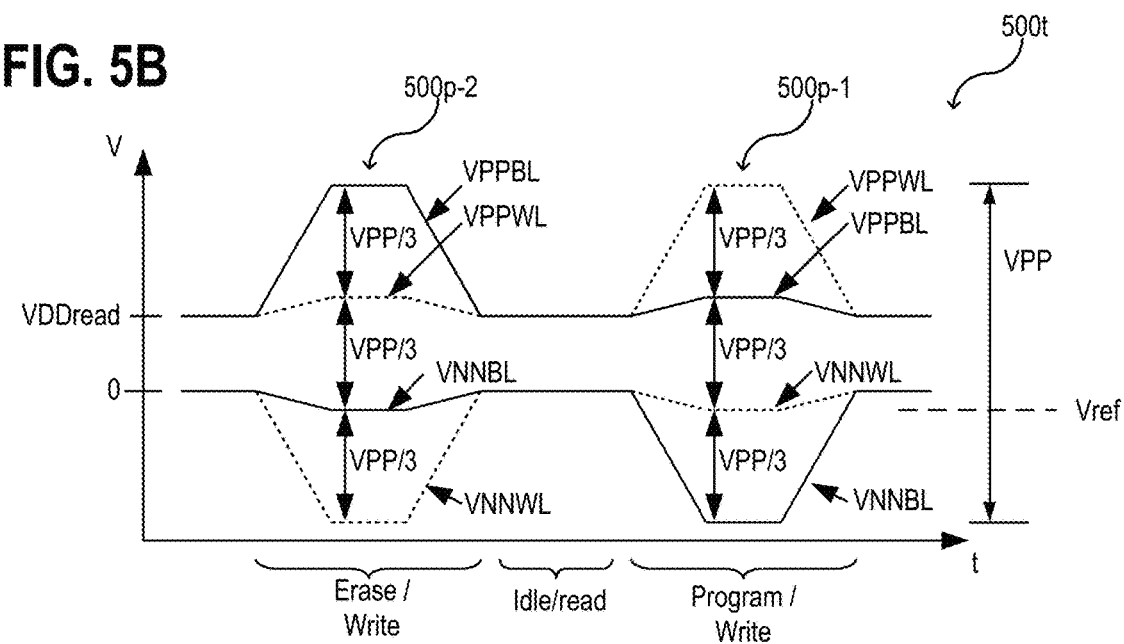
FIG. 5B shows a timing diagram of supply voltages for operating a memory cell arrangement, according to various aspects.

FIG. 5A shows a memory cell arrangement 500 in a schematic view, according to various aspects. FIG. 5B shows exemplarily a timing diagram 500t for four supply voltages provided to the memory cell drivers 300 and to operate (e.g. to program) the memory cell arrangement 500, according to various aspects. The four supply voltages may include two supply voltages VPPWL, VNNWL associated with word-line drivers (WL Driver) and two supply voltages VPPBL, VNNBL associated with the source/bit-line drivers (SL/BL Driver). It is noted that VPPWL may be a supply voltage of a set of supply voltages (e.g., a first supply voltage VXH); VNNWL may be a supply voltage of a set of supply voltages (e.g., a second supply voltage VXL), VPPBL may be a supply voltage of a set of supply voltages (e.g., a third supply voltage VYH), and VNNBL may be a supply voltage of a set of supply voltages (e.g., a fourth supply voltage VYL). Further, it is noted, that the timing diagram 500*t* is shown only with a schematic behavior of the supply voltages, and that the actual ramping of the supply voltages may be digitally controlled, as described herein according to various aspects.

As exemplarily illustrated in FIG. 5A, the memory cell arrangement 500 may include a plurality of memory cell drivers 300 to drive (in other words to operate or to control an operation of, e.g. to program) a plurality of memory cells 420. As an example, the memory cell arrangement 500 may include a first set of memory cell drivers 500*w* and a second set of memory cell drivers 500*sb*. Each memory cell driver of the memory cell arrangement 500 may be configured, for example, as described herein with reference to the memory cell driver 300.

According to various aspects, the driving node 324 of each memory cell driver 300 of the first set of memory cell drivers 500*w* may be connected to a first control-line (WL0, WL1). As an example, the memory cell driver 300 of the first set of memory cell drivers 500*w* may be word-line (WL) drivers, and each of the word-line drivers may be connected to a word-line (WL). According to various aspects, the driving node 324 of each memory cell driver 300 of the second set of memory cell drivers 500*sb* may be connected to one or more second control-lines (SL0, SL1, BL0, BL1). As an example, the memory cell drivers 300 of the second set of memory cell drivers 500*sb* may be source/bit-line (SL/BL) drivers and each of the source/bit-line drivers may be connected to at least one source-line (SL) and at least one bit-line (BL).

According to various aspects, each memory cell 420 of the memory cell arrangement 500 may include one or more first control nodes 422*w* and one or more second control nodes 422*s*, 422*b*, wherein the one or more first control nodes 422*w* and the one or more second control nodes 422*s*, 422*b* of each of the plurality of memory cells 420 are connected to the one or more first control-lines (WL) of a corresponding memory cell driver 300 of the first set of memory cell drivers 500*w* and the one or more second control-lines (SL, BL) of a corresponding memory cell driver 300 of the second set of memory cell drivers 500*sb* respectively.

FIG. 5A illustrates memory cells 420 that may be operated via three control nodes. As an example, a FeFET based memory cell may include a single FeFET operated via three control nodes, e.g. via a word-line node 422*w* (also referred to as gate-node) connected to a corresponding word-line (WL) to apply a voltage at the gate of the FeFET, a source-line node 422*s* (also referred to as source node) connected to a corresponding source-line (SL) to apply a voltage at a source of the FeFET, and a bit-line node 422*b* (also referred to as drain node) connected to a corresponding bit-line (BL) to apply a voltage at the drain of the FeFET, see, for example, FIG. 5A. As another example, the FeFET based memory cell may include two FeFETs coupled in series or in parallel with one another and operated via four control nodes, e.g. via two word-line nodes to connect each gate of the two FeFETs to a corresponding word-line, a source-line node to connect a source of at least one of the two FeFETs to a source-line, and a bit-line node to connect a drain of at least one of the two FeFETs to a bit-line.

According to various aspects, the number of memory cell drivers 300 that may be used to operate (e.g. to program) each memory cell 420 of the memory cell arrangement 500 may be selected as desired. In one configuration, each memory cell 420 of the memory cell arrangement 500 may be connected to one memory cell driver 300 of the first set of memory cell drivers 500*w* and to one memory cell driver 300 of the second set of memory cell drivers 500*sb*. A read-out of the memory cells 420 of the memory cell arrangement 500 may be carried out by applying a read-out voltage between the source-line node 422*s* and the bit-line node 422*b* of the memory cell 420 and by determining a presence and/or a strength of a resulting current flow there between.

According to various aspects, the memory cell arrangement 500 may include a plurality of memory cells 420, e.g. a plurality of FeFET based memory cells, wherein each memory cell of the plurality of memory cells 420 may be unambiguously addressable via the memory cell drivers 300 of the memory cell arrangement 500. The addressing of the memory cells 420 may be carried out via respectively one memory cell driver 300 of the first set of memory cell drivers 500*w* (e.g. one of the word-line drivers) and one memory cell driver 300 of the second set of memory cell drivers 500*sb* (e.g. one of the source/bit-line drivers).

According to various aspects, memory cell arrangement 500 may further include one or more voltage supply circuits 100. The one or more voltage supply circuits 100 may be configured to generate the first supply voltage VPPWL and the second supply voltage VNNWL for each memory cell driver 300 of the first set of memory cell drivers 500*w*. The one or more voltage supply circuits 100 may be further configured to generate the first supply voltage VPPBL and the second supply voltage VNNBL for each memory cell driver 300 of the second set of memory cell drivers 500*sb*. According to various aspects, only one voltage supply circuit 100 may be used to generate four output voltages $V_{out}$(1, 2, 3, 4), wherein one of the generated four output voltages $V_{out}$(1, 2, 3, 4) may be the first supply voltage VPPWL supplied to each memory cell driver 300 of the first set of memory cell drivers 500*w*, another one of the generated four output voltages $V_{out}$(1, 2, 3, 4) may be the second supply voltage VNNWL supplied to each memory cell driver 300 of the first set of memory cell drivers 500*w*, another one of the generated four output voltages $V_{out}$(1, 2, 3, 4) may be the first supply voltage VPPBL supplied to each memory cell driver 300 of the second set of memory cell drivers 500*sb*, and still another one of the generated four output voltages $V_{out}$(1, 2, 3, 4) may be the second supply voltage VNNBL supplied to each memory cell driver 300 of the second set of memory cell drivers 500*sb*. This may allow to avoid failures during a programming and/or an erase of the memory cells 420, e.g. during a ramping of the supply voltages since the four output voltages $V_{out}$(1, 2, 3, 4) provided by the voltage supply circuit 100 have a predefined relationship to one another.

The first supply voltage VPPWL and the second supply voltage VNNWL supplied to each memory cell driver 300 of the first set of memory cell drivers 500*w* may be generated with an offset relative to the first supply voltage VPPBL and the second supply voltage VNNBL supplied to each memory cell driver 300 of the second set of memory cell drivers 500sb. As an example, the offset may be about ⅓ of the programming voltage VPP. According to various aspects, the supply voltages VPPWL, VNNWL, VPPBL, VNNBL may be provided to the respective memory cell drivers 300 of the memory cell arrangement 500 during writing the respective memory cells 420, e.g. during a programming operation and/or during an erase operation. Another voltage regime may be used (e.g. including a read-out voltage VDDread applied between the respective source-line SL and bit-line BL) for a readout of the memory cell. A readout of a FeFET based memory cell may be carried out by applying a readout voltage VDDread between the source and the drain of a FeFET based memory cell and measuring a resulting electrical current flow.

According to various aspects, a memory cell 420 may have (e.g. may define) a programming voltage VPP associated therewith for programming and/or erasing the memory cell 420. As exemplarily illustrated in FIG. 5B, the first supply voltage VPPWL and the second supply voltage VNNWL may be generated for each memory cell driver 300 of the first set of memory cell drivers 500w so that (e.g. during programming and/or erasing) a voltage difference between the first supply voltage VPPWL and the second supply voltage VNNWL is in the range from about 60% to about 72% of the programming voltage VPP. As an example, the voltage difference between the first supply voltage VPPWL and the second supply voltage VNNWL may be about ⅔ of the programming voltage VPP. Further, the first supply voltage VPPBL and the second supply voltage VNNBL may be generated for each memory cell driver 300 of the second set of memory cell drivers 500sb so that (e.g. during programming and/or erasing) a voltage difference between the first supply voltage VPPBL and the second supply voltage VNNBL is in the range from about 60% to about 72% of the programming voltage VPP. As an example, the voltage difference between the first supply voltage VPPBL and the second supply voltage VNNBL may be about ⅔ of the programming voltage VPP.

According to various aspects, the timing diagram 500t in FIG. 5B shows a first voltage ramping scheme 500p-1 (e.g. a ramping for a first write operation, e.g. for a programming operation) and a second voltage ramping scheme 500p-2 (e.g. a ramping for a second write operation, e.g. an erase operation) of the supply voltages VPPWL, VNNWL, VPPBL, VNNBL. The first voltage ramping scheme 500p-1 may provide the programming voltage VPP to the respective memory cells 420 to be written (e.g., to be programmed or erased). The second voltage ramping scheme 500p-2 may provide the inverse programming voltage −VPP to the respective memory cells 420 to be written (e.g. to be erased or programmed). Via selecting the addressing voltages $V_{add}(j,k)$ it may be defined, which memory cell 420 of the memory cell arrangement 500 is actually programmed and/or erased, as shown in more detail in FIG. 5C and FIG. 5D. Illustratively, four voltage levels (also referred to as target voltage values $\tilde{V}_{tar-1}$, $\tilde{V}_{tar-2}$, $\tilde{V}_{tar-3}$, $\tilde{V}_{tar-4}$) may be used for writing (e.g., programming and/or erasing) the memory cells 420.

According to various aspects, the voltage supply circuit 100 as described herein may be used to generate the supply voltages. Illustratively, the output voltages of the voltage supply circuit 100 may be used as the supply voltages to operate the memory cell arrangement 400, 500. According to various aspects, the voltage supply circuit 100 may be configured to ramp a set of output voltages to a corresponding set of target voltages. To implement a VPP/3 programming scheme for a memory cell arrangement, the set of target voltages may include at least four different target voltage values, a lowest target voltage value (e.g., the first target voltage value $\tilde{V}_{tar-1}$), a second lowest target voltage value (e.g., the second target voltage value $\tilde{V}_{tar-2}$), a second highest target voltage value (e.g., the third target voltage value $\tilde{V}_{tar-3}$), and a highest target voltage value (e.g., the fourth target voltage value $\tilde{V}_{tar-4}$).

In the first voltage ramping scheme 500p-1, VNNBL may be ramped to the lowest predefined output voltage level, VNNWL may be ramped to the second lowest predefined output voltage level, VPPBL may be ramped to the second highest predefined output voltage level, and VPPWL may be ramped to the highest predefined output voltage level. In second voltage ramping scheme 500p-2, VNNWL may be ramped to the lowest predefined output voltage level, VNNBL may be ramped to the second lowest predefined output voltage level, VPPWL may be ramped to the second highest predefined output voltage level, and VPPBL may be ramped to the highest predefined output voltage level.

According to various aspects, a constant reference voltage (e.g. a ground voltage or any other suitable base voltage) may be used as one of the supply voltages for programming and/or erasing the memory cells. In this case, this constant reference voltage may not be ramped. However, in this case, the voltage supply circuit 100 may be configured to generate the output voltages based on the constant reference voltage.

According to various aspects, the memory cell arrangement 500 may further include one or more addressing circuits 540 configured to provide the plurality of addressing voltages $V_{add}(j,k)$ for each memory cell driver 300 of the first set of memory cell drivers 500w and of the second set of memory cell drivers 500sb. The one or more addressing circuits 540 may be configured to provide the plurality of addressing voltages $V_{add}(j,k)$ for each memory cell driver 300 of the first set of memory cell drivers 500w and each memory cell driver 300 of the second set of memory cell drivers 500sb to perform a programming operation and/or an erase operation for one or more memory cells 420 of the memory cell arrangement 500.

Figure 5C:
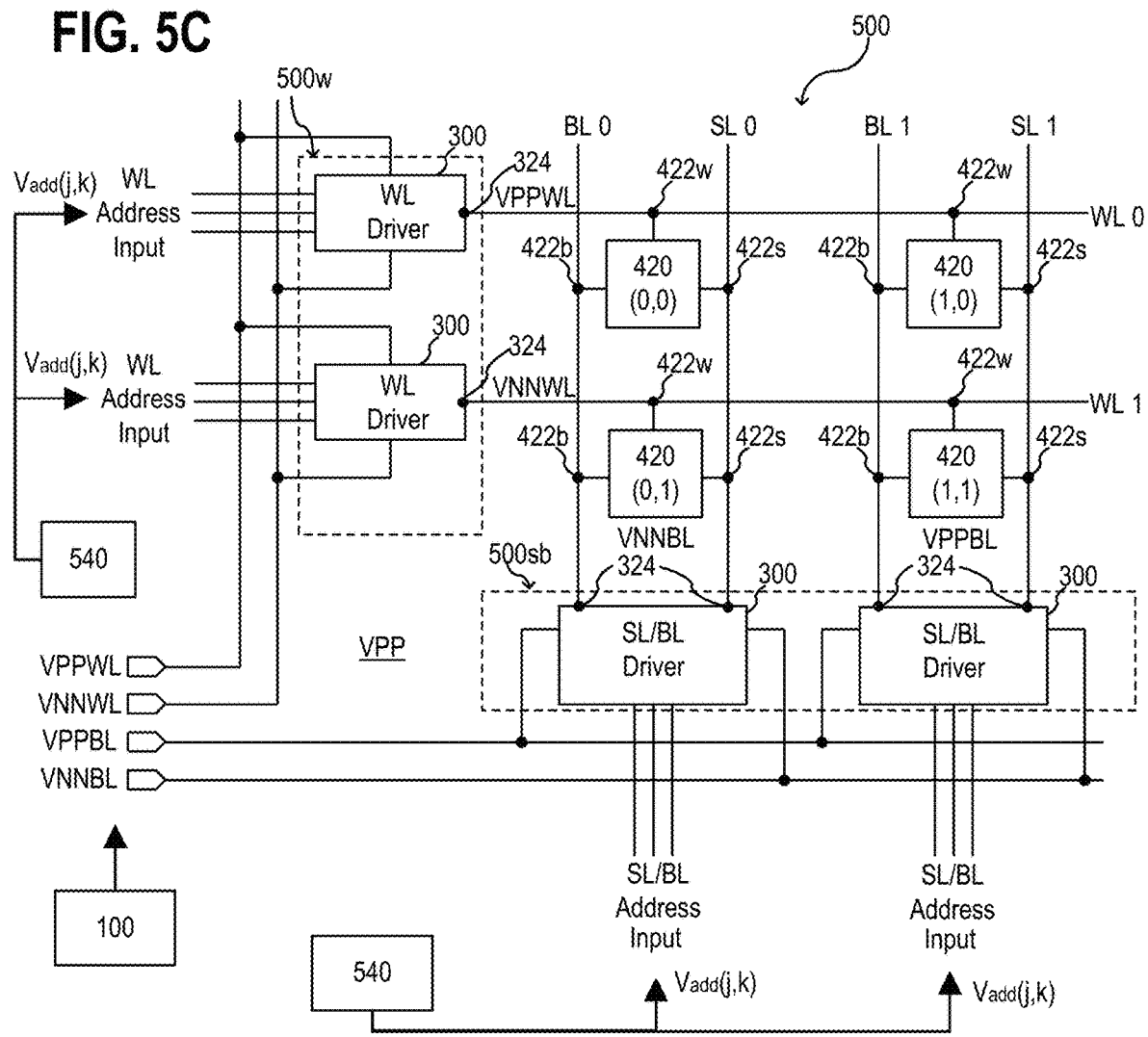
FIG. 5C and FIG. 5D show a memory cell arrangement during a write operation with various supply voltages supplied to the memory cells of the memory cell arrangement via memory cell drivers, according to various aspects.

FIG. 5C shows the memory cell arrangement 500 and the corresponding supply voltages and output voltages provided during a first write operation (e.g. during a programming operation). Via the addressing voltages $V_{add}(j,k)$ it may be selected whether VPPWL or VNNWL is output to the respective word-lines WL0, WL1 and whether VPPBL or VNNBL is output to the respective source/bit-lines BL0/SL0, BL1, SL1. During the first write operation, see for example FIG. 5B, VPPWL is ramped to $V_{ref}+⅔$ VPP, VNNWL is ramped to $V_{ref}$, VPPBL is ramped to $V_{ref}+⅓$ VPP, VNNBL is ramped to $V_{ref}-⅓$ VPP. $V_{ref}$ may be a reference voltage (also referred to as reference potential) for the programming operation. In the case that VPPWL is applied to a word-line (e.g. WL0) via the corresponding word-line driver 300 and VNNBL is applied to a source-line (e.g. SL0) and a bit-line (e.g. BL0) via the corresponding source/bit-line driver, a memory cell 420 (e.g. the memory cell (0,0)) that may receive VPPWL, VNNBL may receive, as a result of the voltage difference between VPPWL and VNNBL, the programming voltage VPP (e.g. with positive polarity) and therefore this memory cell may be programmed. To avoid a programming or an erase of all other memory cells 420 (e.g. of the memory cells (1,0), (0,1), and (1,1)), VNNWL is applied to all other word-lines (e.g. WL1) via the corresponding word-line drivers 100 and VPPBL is applied to all other source-lines (e.g. SL1), and all other bit-lines (e.g. BL1) via the corresponding source/bit-line drivers. As a result, all memory cells 420 may receive only one-third of the full programming voltage VPP. As an example, a memory cell 420 (e.g. the memory cell (0,1)) that may receive VNNWL, VNNBL may receive, as a result of the voltage difference between VNNWL and VNNBL, one-third of the programming voltage VPP and therefore this memory cell is not written (e.g. not programmed or not erased). As an example, a memory cell 420 (e.g. the memory cell (1,0)) that may receive VPPWL, VPPBL may receive, as a result of the voltage difference between VPPWL and VPPBL, one-third of the programming voltage VPP and therefore this memory cell is not written (e.g. not programmed or not erased). As an example, a memory cell 420 (e.g. the memory cell (1,1)) that may receive VNNWL, VPPBL may receive, as a result of the voltage difference between VNNWL and VPPBL, one-third of the programming voltage VPP and therefore this memory cell is not written (e.g. not programmed or not erased).

Figure 5D:
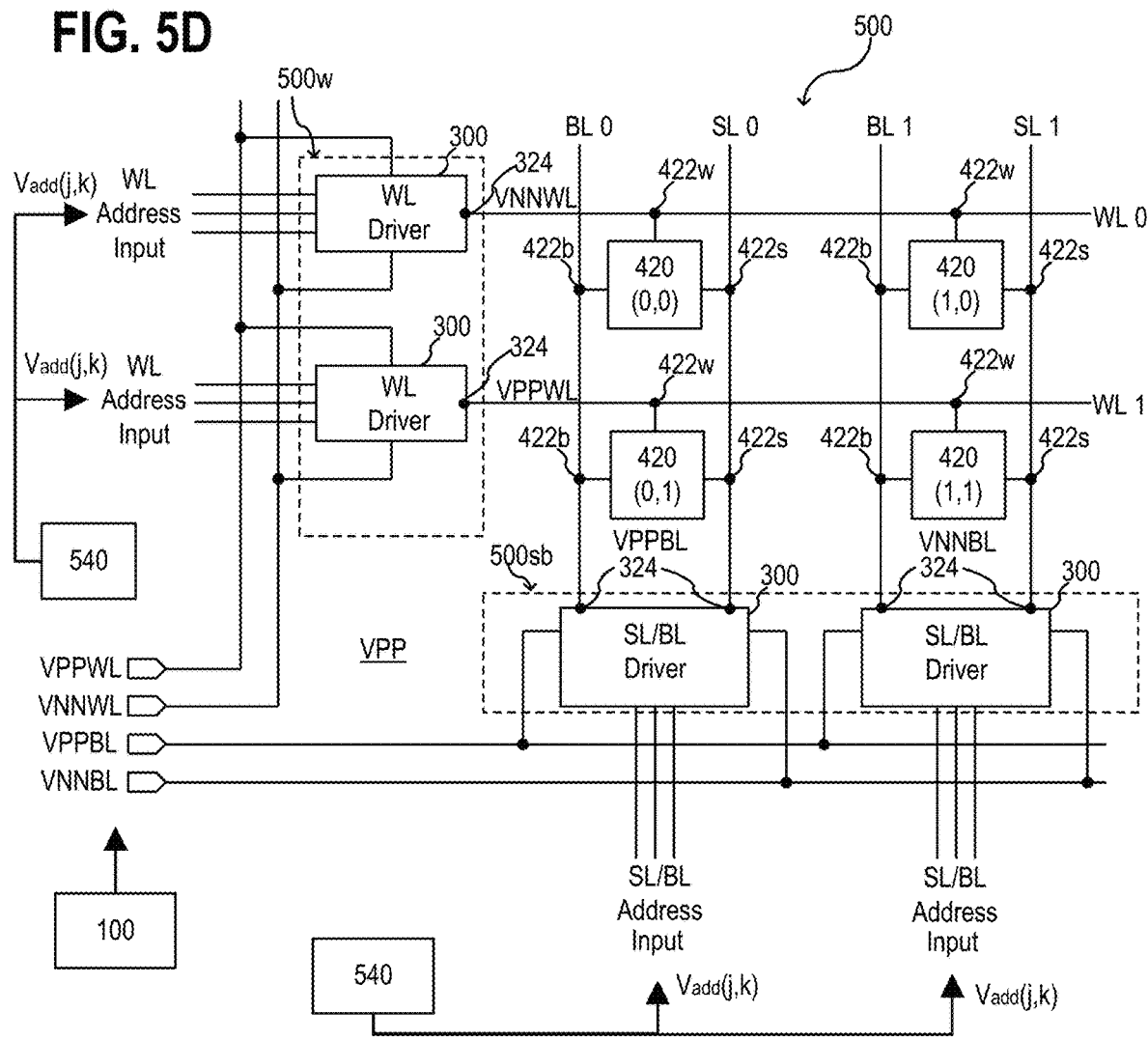

FIG. 5D shows the memory cell arrangement 500 and the corresponding supply voltages and output voltages provided during a second write operation (e.g. during an erase operation). Via the addressing voltages $V_{add}(j,k)$ it may be selected whether VPPWL or VNNWL is output to the respective word-lines WL0, WL1 and whether VPPBL or VNNBL is output to the respective source/bit-lines BL0/SL0, BL1, SL1. During the second write operation, see for example FIG. 5B, VPPWL is ramped to $V_{ref}+\frac{1}{3}$ VPP, VNNWL is ramped to $V_{ref}-\frac{1}{3}$ VPP, VPPBL is ramped to $V_{ref}+\frac{2}{3}$ VPP, and VNNBL is ramped to $V_{ref}$ $V_{ref}$ may be a reference voltage for the erase operation, e.g. the reference voltage for the erase operation may be equal to the reference voltage for the programming operation. In the case that VNNWL is applied to a word-line (e.g. WL0) via the corresponding word-line driver 300 and VPPBL is applied to a source-line (e.g. SL0) and a bit-line (e.g. BL0) via the corresponding source/bit-line driver, a memory cell 420 (e.g. the memory cell (0,0)) that may receive VNNWL, VPPBL may receive, as a result of the voltage difference between VNNWL and VPPBL, the full programming voltage VPP (e.g. with negative polarity) and therefore this memory cell may be written (e.g. programmed or erased). To avoid a programming and/or an erase of all other memory cells 420 (e.g. of the memory cells (1,0), (0,1), and (1,1)), VPPWL is applied to all other word-lines (e.g. WL1) via the corresponding word-line drivers 100 and VNNBL is applied to all other source-lines (e.g. SL1), and all other bit-lines (e.g. BL1) via the corresponding source/bit-line drivers. As a result, all memory cells 420 may receive only one-third of the full programming voltage VPP. As an example, a memory cell 420 (e.g. the memory cell (0,1)) that may receive VPPWL, VPPBL may receive, as a result of the voltage difference between VPPWL and VPPBL, one-third of the programming voltage VPP and therefore this memory cell is not written (e.g. not programmed or not erased). As an example, a memory cell 420 (e.g. the memory cell (1,0)) that may receive VNNWL, VNNBL may receive, as a result of the voltage difference between VNNWL and VNNBL, one-third of the programming voltage VPP and therefore this memory cell is not written (e.g. not programmed or not erased). As an example, a memory cell 420 (e.g. the memory cell (1,1)) that may receive VPPWL, VNNBL may receive, as a result of the voltage difference between VPPWL and VNNBL, one-third of the programming voltage VPP and therefore this memory cell is not written (e.g. not programmed or not erased).

FIG. 6 shows a schematic flow diagram of a method 600 for operating a memory cell arrangement, according to various aspects. The memory cell arrangement may include a plurality of memory cells, e.g. a plurality of memory cells 420 as described above with reference to the memory cell arrangement 500. According to various aspects, the method 600 may include: in 610, providing, via a voltage supply circuit 100, a first supply voltage VPPWL to a first supply node 302 of one or more memory cell drivers 300 of a first set of memory cell drivers 500w; in 620, providing, via the voltage supply circuit 100, a second supply voltage VNNWL to a second supply node 312 of the one or more memory cell drivers 300 of the first set of memory cell drivers 500w; in 630, providing, via the voltage supply circuit 100, a third supply voltage VPPBL to a first supply node 302 of one or more memory cell drivers 300 of a second set of memory cell drivers 500sb; in 640, providing, via the voltage supply circuit 100, a fourth supply voltage VNNBL to a second supply node 312 of the one or more memory cell drivers 300 of the second set of memory cell drivers 500sb; and, in 650, operating one or more memory cells of the plurality of memory cells 420 via one or more memory cell drivers 300 of the first set of memory cell drivers 500w and one or more memory cell drivers 300 of the second set of memory cell drivers 500sb. Operating the one or more memory cells may include, for example, providing, for each memory driver 300 of the first set of memory cell drivers 500w, a plurality of addressing voltages to the plurality of addressing nodes 314 to control the memory driver 300 to output either the first supply voltage VPPWL or the second supply voltage VNNWL to the respective one or more first control-lines WL; and/or providing, for each memory driver 300 of the second set of memory cell drivers 500sb, a plurality of addressing voltages to the plurality of addressing nodes 314 to control the memory driver 300 to output either the third supply voltage VPPBL or the fourth supply voltage VNNBL to the respective one or more second control-lines SL, BL, see, for example, FIG. 5C and FIG. 5D.

According to various aspects, a FeFET memory driver circuitry (referred to as memory cell driver 300) is provided. According to various aspects, two different voltage domains (VPPWL, VNNWL and VPPBL, VNNBL) can be used for the word-line drivers and the source/bit-line drivers. The voltage domains (VPPWL, VNNWL and VPPBL, VNNBL) may be shifted relative to one another by ⅓ of the programming voltage VPP. Various aspects may be related to a remanent-polarizable layer or a remanent-polarizable material, however, the term "remanent-polarizable" may be understood as "spontaneously-polarizable" and vice versa.

Figure 7A:
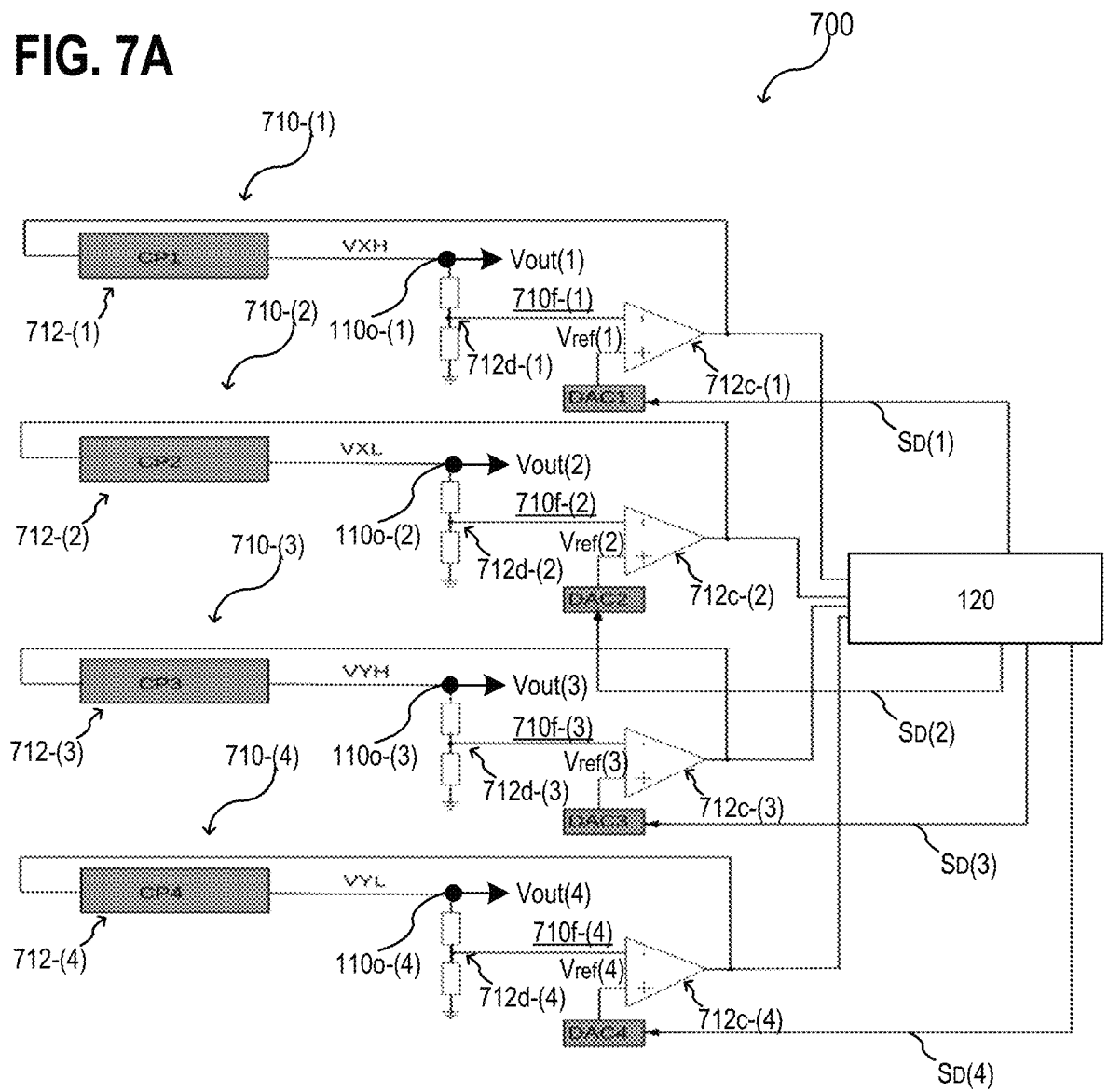
FIGS. 7A to 7E show a voltage supply circuit and an operation thereof in various schematic views, according to various aspects.

FIG. 7A shows a schematic diagram of the voltage supply circuit 700, according to various aspects. The voltage supply circuit 700 may include at least four voltage converter circuit 710-(1, 2, 3, 4) that are digitally controlled. Each of the four voltage converter circuits 710-(1, 2, 3, 4) may include at least one charge pump 712-(1, 2, 3, 4) (or in general at least one voltage converter) and may be controlled via a corresponding digital-to-analog (D/A) voltage converter DAC1, DAC2, DAC3, DAC4 and a corresponding feedback loop 710f-(1, 2, 3, 4) to provide a controlled output voltage $V_{out}$(1, 2, 3, 4). The voltage supply circuit 700 may be configured in the same way or on a similar way as described above with reference to the voltage supply circuit 100.

Each feedback loop 710f-(1, 2, 3, 4) may include a voltage divider 712d-(1, 2, 3, 4) and a comparator 712c-(1, 2, 3, 4) to compare a reference voltage $V_{ref}$(1, 2, 3, 4) (provided from the respective D/A voltage converter 710da-(1, 2, 3, 4) to the corresponding comparator 712c-(1, 2, 3, 4)) with a representative of the output voltage $V_{out}(1, 2, 3, 4)$. As described above, the digital input $S_D$-(1, 2, 3, 4) provided to the respective D/A voltage converter DAC1, DAC2, DAC3, DAC4 may defined the respective actual output voltage value $\tilde{V}_{out}$ of the four output voltages $V_{out}(1, 2, 3, 4)$.

According to various aspects, the ramping of the output voltages $V_{out}(1, 2, 3, 4)$ may be controlled via a control circuit 120. The control circuit may be configured to implement one or more control schemes, as described herein, e.g., regulation schemes 770a and 770b as illustrated in FIG. 7C and FIG. 7E.

Figure 7B:
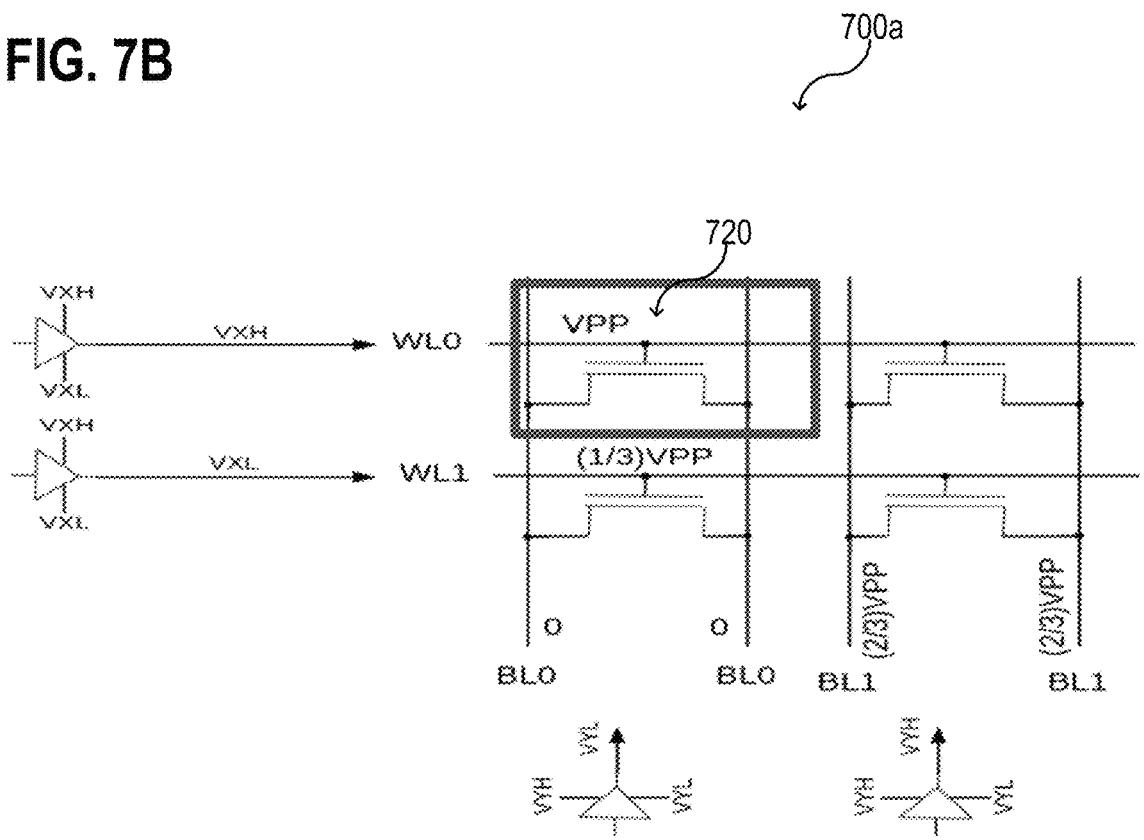
Figure 7C:
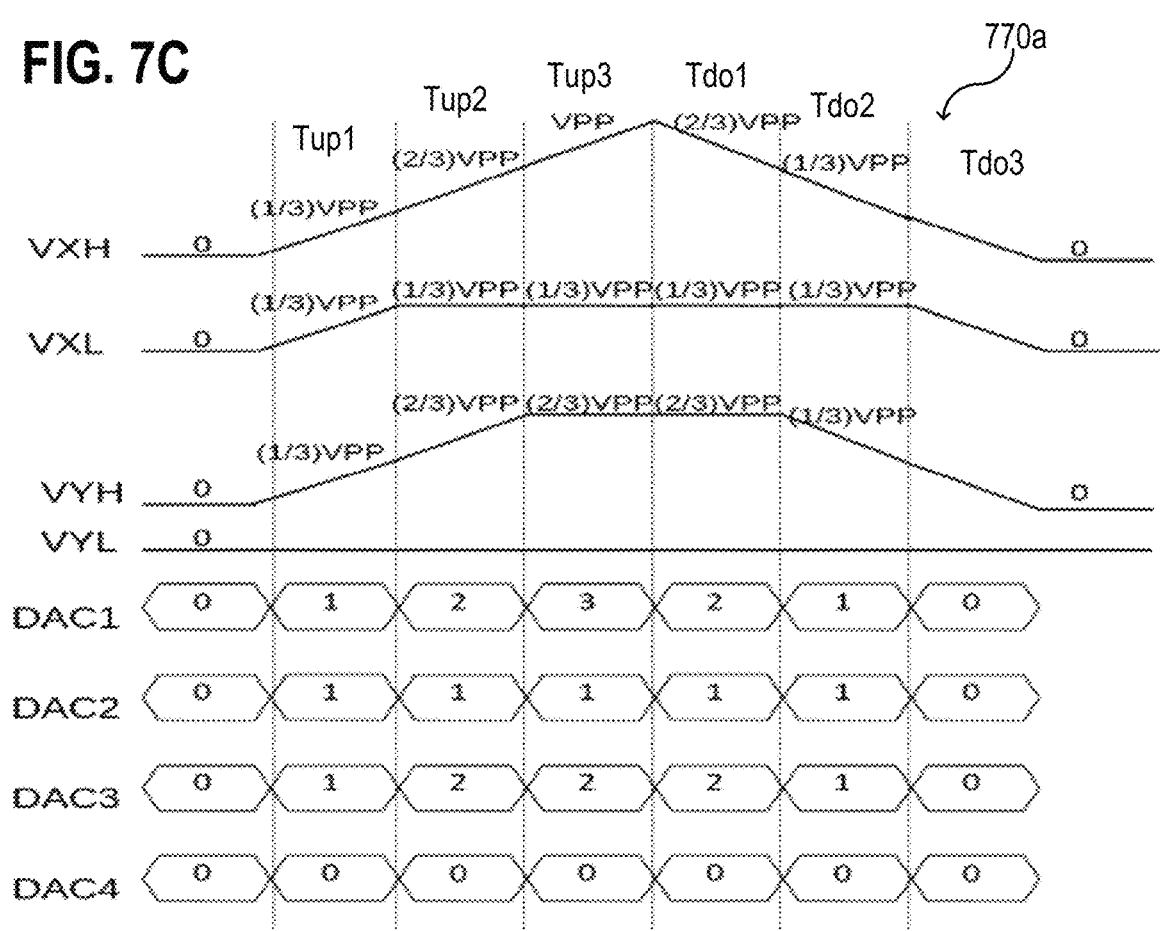

FIG. 7B shows a memory cell arrangement 700a and FIG. 7C shows a corresponding schematic control scheme for programming a memory cell 720 of the memory cell arrangement 700a via four supply voltages VXH, VXL, VYH, VYL, according to various aspects. The four supply voltages VXH, VXL, VYH, VYL may be generated via the voltage supply circuit 700, according to various aspects. As an example, two supply voltages VXH, VXL may be selectively provided to the word-lines WL0, WL1 of the memory cell arrangement 700a and two supply voltages VYH, VYL may be selectively provided to the sets of source/bit-lines BL0, BL1 of the memory cell arrangement 700a. According to various aspects, for programming the memory cell 720, a first supply voltage VXH may be provided to a first word-line WL0 of the memory cell arrangement 700a and a second supply voltage VXL may be provided to a second word-line WL1 of the memory cell arrangement 700a, wherein the memory cell 720 to be programmed is connected to the first word-line WL0 and not connected to the second word-line WL1. Further, for programming the memory cell 720, a fourth supply voltage VYL may be provided to one or more first source/bit-lines BL0 of the memory cell arrangement 700a and a third supply voltage VYH may be provided to one or more second source/bit-lines BL1 of the memory cell arrangement 700a, wherein the memory cell 720 to be programmed is connected to the one or more first source/bit-lines BL0 and not connected to the one or more source/bit-lines BL1.

The control scheme 770a may include four supply voltages VXH, VXL, VYH, VYL and may be implemented via the control circuit 120 of the voltage supply circuit 700, according to various aspects.

To program the memory cell 720 of the memory cell arrangement 700a, a programming voltage VPP may be applied between the terminals of the memory cell 720, e.g., between the gate terminal of the memory cell 720 that is connected to the first word-line WL0 and one or both of the source/drain terminals of the memory cell 720 that are connected to the one or both first source/bit-lines BL0. The four supply voltages VXH, VXL, VYH, VYL may be provided such that other memory cells of the memory cell arrangement (memory cells that are not to be written) may not have the programming voltage VPP applied thereto, e.g., may have a voltage applied thereto that is substantially equal to or lower than one third of the programming voltage VPP (⅓ VPP).

As illustrated in FIG. 7C, the four supply voltages VXH, VXL, VYH, VYL may be provided by controlling the D/A voltage converters DAC1, DAC2, DAC3, DAC4 of the voltage supply circuit 700 accordingly. In this example, the digital value 0 may correspond to a target voltage value of zero volts (0 V) such that, in the case that this digital value is provided to a respective one of the D/A voltage converters DAC1, DAC2, DAC3, DAC4, the corresponding voltage converter circuit 710-(1, 2, 3, 4) may be controlled to output the output voltage $V_{out}(1, 2, 3, 4)$ with this target value. In this example, the digital value 1 may correspond to a target voltage value of one third of the programming voltage VPP (⅓ VPP) such that, in the case that this digital value is provided to a respective one of the D/A voltage converters DAC1, DAC2, DAC3, DAC4, the corresponding voltage converter circuit 710-(1, 2, 3, 4) may be controlled to output the output voltage $V_{out}(1, 2, 3, 4)$ with this target value. In this example, the digital value 2 may correspond to a target voltage value of two thirds of the programming voltage VPP (⅔ VPP) such that, in the case that this digital value is provided to a respective one of the D/A voltage converters DAC1, DAC2, DAC3, DAC4, the corresponding voltage converter circuit 710-(1, 2, 3, 4) may be controlled to output the output voltage $V_{out}(1, 2, 3, 4)$ with this target value. In this example, the digital value 3 may correspond to a target voltage value of the programming voltage VPP (VPP) such that, in the case that this digital value is provided to a respective one of the D/A voltage converters DAC1, DAC2, DAC3, DAC4, the corresponding voltage converter circuit 710-(1, 2, 3, 4) may be controlled to output the output voltage $V_{out}(1, 2, 3, 4)$ with this target value.

According to various aspects, the control scheme 770a may include a ramp up routine to provide the supply voltages to program a memory cell of a memory cell arrangement, e.g., as follows: ramp the voltage value ($\tilde{V}_{out}(1)$) of the first output voltage ($V_{out}(1)$=VXH) from the first target voltage value ($\tilde{V}_{tar-1}$=0 V) up to the fourth target voltage value ($\tilde{V}_{tar-4}$=VPP) by generating the first digital control signal ($S_D(1)$ provided to DAC1) such that the voltage value ($\tilde{V}_{out}(1)$) of the first output voltage ($V_{out}(1)$) matches the second target voltage value ($\tilde{V}_{tar-2}$=⅓ VPP) during a first ramp interval $T_{up}1$, the third target voltage value ($\tilde{V}_{tar-3}$=⅔ VPP) during a second ramp interval $T_{up}2$, and the fourth target voltage value ($\tilde{V}_{tar-4}$=VPP) during a third ramp interval $T_{up}3$; ramp the voltage value ($\tilde{V}_{out}(2)$) of the second output voltage ($V_{out}(2)$=VXL) from the first target voltage value ($\tilde{V}_{tar-1}$=0 V) up to the second target voltage value ($\tilde{V}_{tar-2}$=⅓ VPP) by generating the second digital control signal ($S_D(2)$ provided to DAC2) such that the voltage value ($\tilde{V}_{out}(2)$) of the second output voltage ($V_{out}(2)$) matches the second target voltage value ($\tilde{V}_{tar-2}$=⅓ VPP) during the first ramp interval $T_{up}1$, the second target voltage value ($\tilde{V}_{tar-2}$=⅓ VPP) during the second ramp interval $T_{up}2$, and the second target voltage value ($\tilde{V}_{tar-2}$=⅓ VPP) during the third ramp interval $T_{up}3$; ramp the voltage value ($\tilde{V}_{out}(3)$) of the third output voltage ($V_{out}(3)$=VYH) from the first target voltage value ($\tilde{V}_{tar-1}$=0 V) up to the third target voltage value ($\tilde{V}_{tar-3}$=⅔ VPP) by generating the third digital control signal ($S_D(3)$ provided to DAC3) such that the voltage value ($\tilde{V}_{out}(3)$) of the third output voltage ($V_{out}(3)$) matches the second target voltage value ($\tilde{V}_{tar-2}$=⅓ VPP) during the first ramp interval $T_{up}1$, the third target voltage value ($\tilde{V}_{tar-3}$=⅔ VPP) during the second ramp interval $T_{up}2$, and the third target voltage value ($\tilde{V}_{tar-3}$=⅔ VPP) during the third ramp interval $T_{up}3$; and keep the voltage value ($\tilde{V}_{out}(4)$) of the fourth output voltage ($V_{out}(4)$=VYL) at the first target voltage value ($\tilde{V}_{tar-1}$=0 V) by generating the fourth digital control signal ($S_D(4)$ provided to DAC4) such that the voltage value ($\tilde{V}_{out}(4)$) of the fourth output voltage ($V_{out}(4)$) matches the first target voltage value ($\tilde{V}_{tar-1}$=0 V) during the first ramp interval $T_{up}1$, the first target voltage value ($\tilde{V}_{tar-1}$=0 V) during the second ramp interval $T_{up}2$, and the first target voltage value ($\tilde{V}_{tar-1}$=0 V) during the third ramp interval $T_{up}3$. The first ramp interval $T_{up}1$, the second ramp interval $T_{up}2$, and the third ramp interval $T_{up}3$ may be in sequence, i.e. the end of the first ramp interval $T_{up}1$ may be the beginning of the second ramp interval $T_{up}2$, and the end of the second ramp interval $T_{up}2$ may be the beginning of the third ramp interval $T_{up}3$. The ramping of any voltage value to be ramped in an interval might start at the beginning of the respective interval.

Alternatively, the voltage value ($\tilde{V}_{out}(4)$) of the fourth output voltage ($V_{out}(4)$=VYL) may be ramped from the first target voltage value ($\tilde{V}_{tar-1}$=0 V) to a fifth target voltage value ($\tilde{V}_{tar-5}$) by generating the fourth digital control signal ($S_D(4)$) provided to DAC4) such that the voltage value ($\tilde{V}_{out}(4)$) of the fourth output voltage ($V_{out}(4)$) matches the fifth target voltage value ($\tilde{V}_{tar-5}$) during the first ramp interval, the fifth target voltage value ($\tilde{V}_{tar-5}$) during the second ramp interval, and the fifth target voltage value ($\tilde{V}_{tar-5}$) during the third ramp interval (not illustrated in FIG. 7C).

According to various aspects, the control scheme 770a may include a ramp down routine after the memory cell of the memory cell arrangement is programmed, e.g., as follows: ramp the voltage value ($\tilde{V}_{out}(1)$) of the first output voltage ($V_{out}(1)$=VXH) from the fourth target voltage value ($\tilde{V}_{tar-4}$=VPP) to the first target voltage value ($\tilde{V}_{tar-1}$=0 V) by generating the first digital control signal ($S_D(1)$) provided to DAC1) such that the voltage value of the first output voltage ($V_{out}(1)$) matches the third target voltage value ($\tilde{V}_{tar-3}$=⅔ VPP) during a first ramp interval $T_{do}1$, the second target voltage value ($\tilde{V}_{tar-2}$=⅓ VPP) during a second ramp interval $T_{do}2$, and the first target voltage value ($\tilde{V}_{tar-1}$=0 V) during a third ramp interval $T_{do}3$; ramp the voltage value ($\tilde{V}_{out}(2)$) of the second output voltage ($V_{out}(2)$=VXL) from the second target voltage value ($\tilde{V}_{tar-2}$=⅓ VPP) to the first target voltage value ($\tilde{V}_{tar-1}$=0 V) by generating the second digital control signal ($S_D(2)$) provided to DAC2) such that the voltage value ($\tilde{V}_{out}(2)$) of the second output voltage ($V_{out}(2)$) matches the second target voltage value ($\tilde{V}_{tar-2}$=⅓ VPP) during the first ramp interval $T_{do}1$, the second target voltage value ($\tilde{V}_{tar-2}$=⅓ VPP) during the second ramp interval $T_{do}2$, and the first target voltage value ($\tilde{V}_{tar-1}$=0 V) during the third ramp interval $T_{do}3$; ramp the voltage value ($\tilde{V}_{out}(3)$) of the third output voltage ($V_{out}(3)$=VYH) from the third target voltage value ($\tilde{V}_{tar-3}$=⅔ VPP) to the first target voltage value ($\tilde{V}_{tar-1}$=0 V) by generating the third digital control signal ($S_D(3)$) provided to DAC3) such that the voltage value ($\tilde{V}_{out}(3)$) of the third output voltage ($V_{out}(3)$) matches the third target voltage value ($\tilde{V}_{tar-3}$=⅔ VPP) during the first ramp interval $T_{do}1$, the second target voltage value ($\tilde{V}_{tar-2}$=⅓ VPP) during the second ramp interval $T_{do}2$, and the first target voltage value ($\tilde{V}_{tar-1}$=0 V) during the third ramp interval $T_{do}3$; and keep the voltage value ($\tilde{V}_{out}(4)$) of the fourth output voltage ($V_{out}(4)$=VYL) at the first target voltage value ($\tilde{V}_{tar-1}$=0 V) by generating the fourth digital control signal ($S_D(4)$) provided to DAC4) such that the voltage value ($\tilde{V}_{out}(4)$) of the fourth output voltage ($V_{out}(4)$) matches the first target voltage value ($\tilde{V}_{tar-1}$=0 V) during the first ramp interval $T_{do}1$, the first target voltage value ($\tilde{V}_{tar-1}$=0 V) during the second ramp interval $T_{do}2$, and the first target voltage value ($\tilde{V}_{tar-1}$=0 V) during the third ramp interval $T_{do}3$. The first ramp interval $T_{do}1$, the second ramp interval $T_{do}2$, and the third ramp interval $T_{do}3$ may be in sequence, i.e. the end of the first ramp interval $T_{do}1$ may be the beginning of the second ramp interval $T_{do}2$, and the end of the second ramp interval $T_{do}2$ may be the beginning of the third ramp interval $T_{do}3$. The ramping of any voltage value to be ramped in an interval might start at the beginning of the respective interval.

Alternatively, the voltage value ($\tilde{V}_{out}(4)$) of the fourth output voltage ($V_{out}(4)$=VYL) may be ramped from the fifth target voltage value ($\tilde{V}_{tar-5}$) to the first target voltage value ($\tilde{V}_{tar-1}$) by generating the fourth digital control signal ($S_D(4)$) provided to DAC4) such that the voltage value ($\tilde{V}_{out}(4)$) of the fourth output voltage ($V_{out}(4)$) matches the fifth target voltage value ($\tilde{V}_{tdr-5}$) during the first ramp interval $T_{do}1$, the fifth target voltage value ($\tilde{V}_{tar-5}$) during the second ramp interval $T_{do}2$, and the first target voltage value ($\tilde{V}_{tar-1}$) during the third ramp interval $T_{do}3$.

Figure 7D:
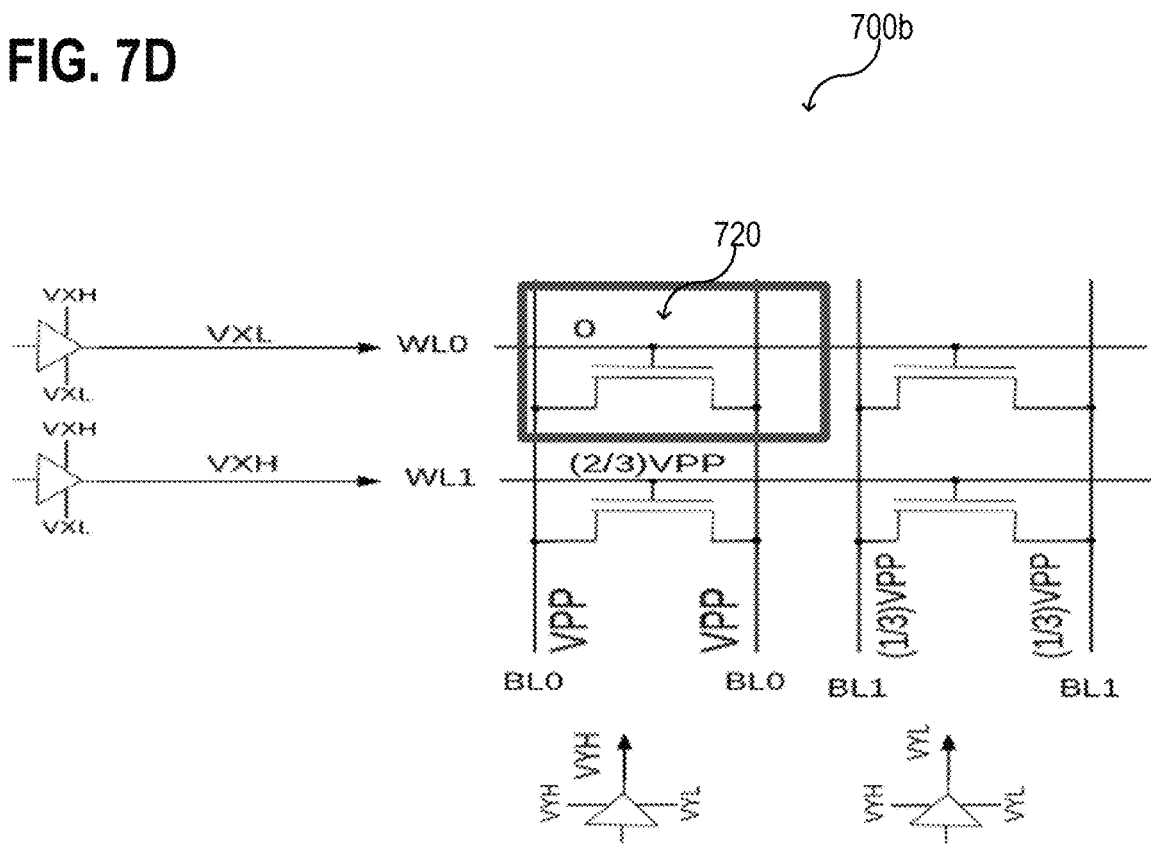
Figure 7E:
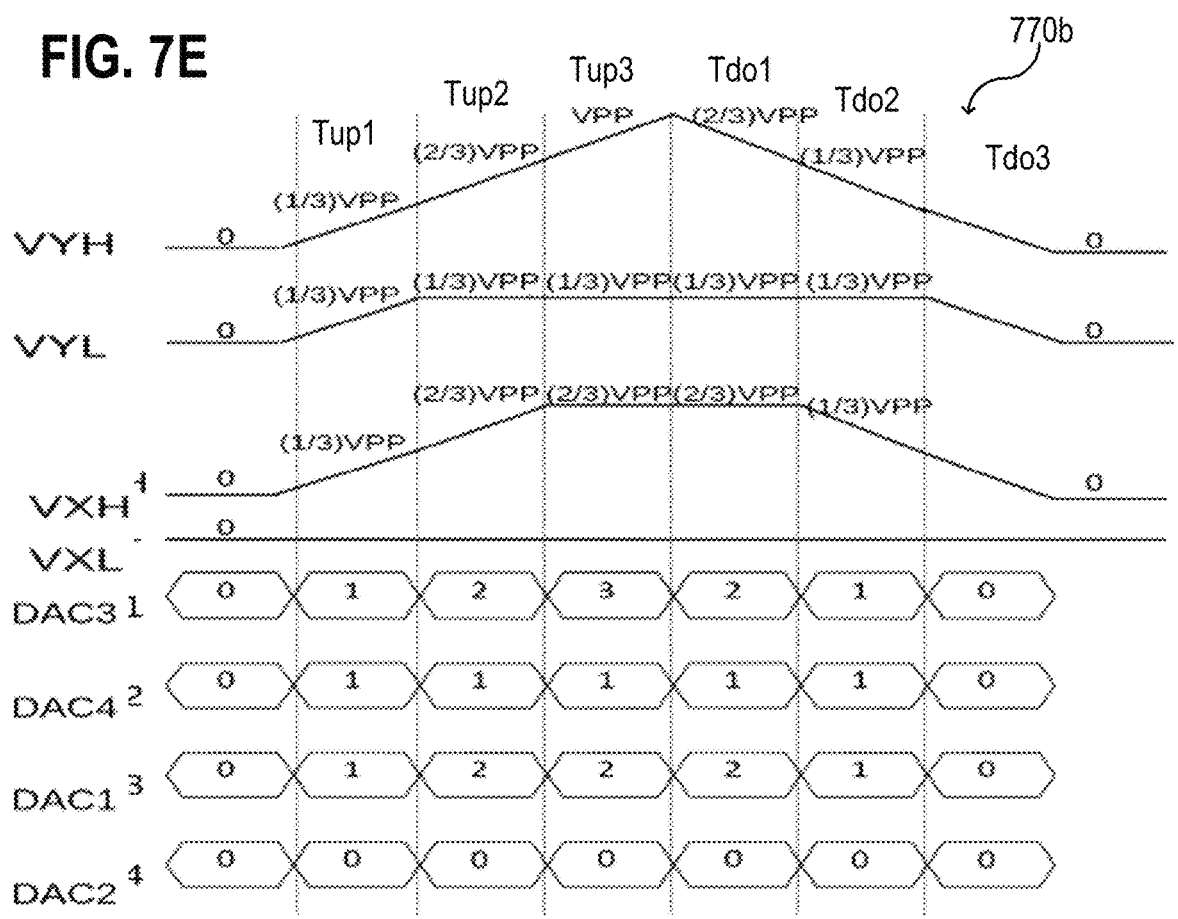

FIG. 7D shows a memory cell arrangement 700b and FIG. 7E shows a corresponding schematic control scheme for erasing a memory cell 720 of the memory cell arrangement 700b via four supply voltages VXH, VXL, VYH, VYL, according to various aspects. The four supply voltages VXH, VXL, VYH, VYL may be generated via the voltage supply circuit 700, according to various aspects. As an example, two supply voltages VXH, VXL may be selectively provided to the word-lines WL0, WL1 of the memory cell arrangement 700b and two supply voltages VYH, VYL may be selectively provided to the sets of source/bit-lines BL0, BL1 of the memory cell arrangement 700b. According to various aspects, for erasing the memory cell 720, a second supply voltage VXL may be provided to a first word-line WL0 of the memory cell arrangement 700b and a first supply voltage VXH may be provided to a second word-line WL1 of the memory cell arrangement 700b, wherein the memory cell 720 to be erased is connected to the first word-line WL0 and not connected to the second word-line WL1. Further, for erasing the memory cell 720, a third supply voltage VYH may be provided to one or more first source/bit-lines BL0 of the memory cell arrangement 700b and a fourth supply voltage VXL may be provided to one or more second source/bit-lines BL1 of the memory cell arrangement 700b, wherein the memory cell 720 to be erased is connected to the one or more first source/bit-lines BL0 and not connected to the one or more source/bit-lines BL1.

The control scheme 770b may include four supply voltages VXH, VXL, VYH, VYL and may be implemented via the control circuit 120 of the voltage supply circuit 700, according to various aspects. In some aspects, the memory cell arrangement 700b may be the same as the memory cell arrangement 700a. In other words, the memory cell arrangement 700a, 700b may be written (e.g., programed and erased) via the control scheme 770a, 770b described herein.

To erase the memory cell 720 of the memory cell arrangement 700b, a programming voltage VPP may be applied between the terminals of the memory cell 720, e.g., between the gate terminal of the memory cell 720 that is connected to the first word-line WL0 and one or both of the source/drain terminals of the memory cell 720 that are connected to the one or both first source/bit-lines BL0. The write voltage VPP for erasing the memory cell 720 may be of opposite polarity compared to the write voltage VPP for programming the memory cell 720, according to various aspects. The four supply voltages VXH, VXL, VYH, VYL may be provided such that other memory cells of the memory cell arrangement (memory cells that are not to be written) may not have the erase voltage VPP applied thereto, e.g., may have a voltage applied thereto that is substantially equal to or lower than one third of the programming voltage VPP (⅓ VPP).

As illustrated in FIG. 7E, the four supply voltages VXH, VXL, VYH, VYL may be provided by controlling the D/A voltage converters DAC1, DAC2, DAC3, DAC4 of the voltage supply circuit 700 accordingly. In this example, the digital value 0 may correspond to a target voltage value of zero volts (0 V) such that, in the case that this digital value is provided to a respective one of the D/A voltage converters DAC1, DAC2, DAC3, DAC4, the corresponding voltage converter circuit 710-(1, 2, 3, 4) may be controlled to output the output voltage $V_{out}$(1, 2, 3, 4) with this target value. In this example, the digital value 1 may correspond to a target voltage value of one third of the programming voltage VPP (⅓ VPP) such that, in the case that this digital value is provided to a respective one of the D/A voltage converters DAC1, DAC2, DAC3, DAC4, the corresponding voltage converter circuit 710-(1, 2, 3, 4) may be controlled to output the output voltage $V_{out}$(1, 2, 3, 4) with this target value. In this example, the digital value 2 may correspond to a target voltage value of two thirds of the programming voltage VPP (⅔ VPP) such that, in the case that this digital value is provided to a respective one of the D/A voltage converters DAC1, DAC2, DAC3, DAC4, the corresponding voltage converter circuit 710-(1, 2, 3, 4) may be controlled to output the output voltage $V_{out}$(1, 2, 3, 4) with this target value. In this example, the digital value 3 may correspond to a target voltage value of the programming voltage VPP (VPP) such that, in the case that this digital value is provided to a respective one of the D/A voltage converters DAC1, DAC2, DAC3, DAC4, the corresponding voltage converter circuit 710-(1, 2, 3, 4) may be controlled to output the output voltage $V_{out}$(1, 2, 3, 4) with this target value.

According to various aspects, the control scheme 770b may include a ramp up routine to provide the supply voltages to program a memory cell of a memory cell arrangement, e.g., as follows: ramp the voltage value $\tilde{V}_{out}(1)$ of the first output voltage ($V_{out}(1)$=VXH) from the first target voltage value ($\tilde{V}_{tar-1}$=0 V) up to the third target voltage value ($\tilde{V}_{tar-3}$=⅔ VPP) by generating the first digital control signal ($S_D(1)$) provided to DAC1) such that the voltage value $\tilde{V}_{out}(1)$ of the first output voltage $V_{out}(1)$ matches the second target voltage value ($\tilde{V}_{tar-2}$=⅓ VPP) during a first ramp interval $T_{up}1$, the third target voltage value ($\tilde{V}_{tar-3}$=2/3 VPP) during a second ramp interval $T_{up}2$, and the third target voltage value ($\tilde{V}_{tar-3}$=⅔ VPP) during a third ramp interval $T_{up}3$; keep the voltage value $\tilde{V}_{out}(2)$ of the second output voltage ($V_{out}(2)$=VXL) at the first target voltage value ($\tilde{V}_{tar-1}$=0 V) by generating the second digital control signal ($S_D(2)$) provided to DAC2) such that the voltage value $\tilde{V}_{out}(2)$ of the second output voltage $V_{out}(2)$ matches the first target voltage value ($\tilde{V}_{tar-1}$=0 V) during the first ramp interval $T_{up}1$, the first target voltage value ($\tilde{V}_{tar-1}$=0 V) during the second ramp interval $T_{up}2$, and the first target voltage value ($\tilde{V}_{tar-1}$=0 V) during the third ramp interval $T_{up}3$; ramp the voltage value $\tilde{V}_{out}(3)$ of the third output voltage ($V_{out}(3)$=VYH) from the first target voltage value ($\tilde{V}_{tar-1}$=0 V) up to the fourth target voltage value ($\tilde{V}_{tar-3}$=VPP) by generating the third digital control signal ($S_D(3)$) provided to DAC3) such that the voltage value $\tilde{V}_{out}(3)$ of the third output voltage $V_{out}(3)$ matches the second target voltage value ($\tilde{V}_{tar-2}$=⅓ VPP) during the first ramp interval $T_{up}1$, the third target voltage value ($\tilde{V}_{tar-3}$=⅔ VPP) during the second ramp interval $T_{up}2$, and the fourth target voltage value ($\tilde{V}_{tar-4}$=VPP) during the third ramp interval $T_{up}3$; and ramp the voltage value $\tilde{V}_{out}(4)$ of the fourth output voltage ($V_{out}(4)$=VYL) from the first target voltage value ($\tilde{V}_{tar-1}$=0 V) to the second target voltage value ($\tilde{V}_{tar-2}$=⅓ VPP) by generating the fourth digital control signal ($S_D(4)$ provided to DAC4) such that the voltage value $\tilde{V}_{out}(4)$ of the fourth output voltage $V_{out}(4)$ matches the second target voltage value ($\tilde{V}_{tar-2}$=⅓ VPP) during the first ramp interval $T_{up}1$, the second target voltage value ($\tilde{V}_{tar-1}$=⅓ VPP) during the second ramp interval $T_{up}2$, and the second target voltage value ($\tilde{V}_{tar-1}$=⅓ VPP) during the third ramp interval $T_{up}3$.

Alternatively, the voltage value $\tilde{V}_{out}(2)$ of the second output voltage ($V_{out}(2)$=VXL) may be ramped from the first target voltage value ($\tilde{V}_{tar-1}$=V 0) to a fifth target voltage value $\tilde{V}_{tar-5}$ by generating the second digital control signal ($S_D(2)$ provided to DAC2) such that the voltage value $\tilde{V}_{out}(2)$ of the second output voltage $V_{out}(2)$ matches the fifth target voltage value $\tilde{V}_{tar-5}$ during the first ramp interval, the fifth target voltage value $\tilde{V}_{tar-5}$ during the second ramp interval, and the fifth target voltage value $\tilde{V}_{tar-5}$ during the third ramp interval (not illustrated in FIG. 7E).

According to various aspects, the control scheme 770b may include a ramp down routine after the memory cell of the memory cell arrangement is erased, e.g., as follows: ramp the voltage value $\tilde{V}_{out}(1)$ of the first output voltage ($\tilde{V}_{out}(1)$=VXH) from the third target voltage value ($\tilde{V}_{tar-3}$=⅔ VPP) to the first target voltage value ($\tilde{V}_{tar-1}$=0 V) by generating the first digital control signal ($S_D(1)$ provided to DAC1) such that the voltage value of the first output voltage $V_{out}(1)$ matches the third target voltage value ($\tilde{V}_{tar-3}$=⅔ VPP) during a first ramp interval $T_{do}1$, the second target voltage value ($\tilde{V}_{tar-2}$=⅓ VPP) during a second ramp interval $T_{do}2$, and the first target voltage value ($\tilde{V}_{tar-1}$=0 V) during a third ramp interval $T_{do}3$; keep the voltage value $V_{out}(2)$ of the second output voltage ($V_{out}(2)$=VXL) at the first target voltage value ($\tilde{V}_{tar-1}$=0 V) by generating the second digital control signal ($S_D(2)$ provided to DAC2) such that the voltage value $V_{out}(2)$ of the second output voltage $V_{out}(2)$ matches the first target voltage value ($\tilde{V}_{tar-1}$=0 V) during the first ramp interval $T_{do}1$, the first target voltage value ($\tilde{V}_{tar-1}$=0 V) during the second ramp interval $T_{do}2$, and the first target voltage value ($\tilde{V}_{tar-1}$=0 V) during the third ramp interval $T_{do}3$; ramp the voltage value $V_{out}(3)$ of the third output voltage ($V_{out}(3)$=VYH) from the fourth target voltage value ($\tilde{V}_{tar-4}$=VPP) to the first target voltage value ($\tilde{V}_{tar-1}$=0 V) by generating the third digital control signal ($S_D(3)$ provided to DAC3) such that the voltage value $\tilde{V}_{out}(3)$ of the third output voltage $V_{out}(3)$ matches the third target voltage value ($\tilde{V}_{tar-3}$=⅔ VPP) during the first ramp interval $T_{do}1$, the second target voltage value ($\tilde{V}_{tar-2}$=⅓ VPP) during the second ramp interval $T_{do}2$, and the first target voltage value ($\tilde{V}_{tar-1}$=0 V) during the third ramp interval $T_{do}3$; and ramp the voltage value $V_{out}(4)$ of the fourth output voltage ($V_{out}(4)$=VYL) from the second target voltage value ($\tilde{V}_{tar-2}$=⅓ VPP) to the first target voltage value ($\tilde{V}_{tar-1}$=0 V) by generating the fourth digital control signal ($S_D(4)$ provided to DAC4) such that the voltage value $V_{out}(4)$ of the fourth output voltage $V_{out}(4)$ matches the second target voltage value ($\tilde{V}_{tar-2}$=⅓ VPP) during the first ramp interval $T_{do}1$, the second target voltage value ($\tilde{V}_{tar-2}$=⅓ VPP) during the second ramp interval $T_{do}2$, and the first target voltage value ($\tilde{V}_{tar-1}$=0 V) during the third ramp interval $T_{do}3$.

Alternatively, the voltage value $\tilde{V}_{out}(2)$ of the second output voltage ($V_{out}(2)$=VXL) may be ramped from the fifth target voltage value $\tilde{V}_{tar-5}$ to the first target voltage value $\tilde{V}_{tar-1}$ by generating the second digital control signal ($S_D(2)$ provided to DAC2) such that the voltage value $\tilde{V}_{out}(2)$ of the second output voltage $V_{out}(2)$ matches the fifth target voltage value $\tilde{V}_{tar-5}$ during the first ramp interval $T_{do}1$, fifth target voltage value $\tilde{V}_{tar-5}$ during the second ramp interval $T_{do}2$, and the first target voltage value $\tilde{V}_{tar-1}$ during the third ramp interval $T_{do}3$.

The proposed control schemes 770a, 770b may generate programming, erase and inhibit voltages for FeFET-based memory cells in, for example array type, memory cell arrangements. The digitally controlled voltage supply makes sure that the inhibit cells will never see more than 1/N·VPP between Gate to Source-Drain terminal during the voltage ramp up and voltage ramp down and afterwards. In this approach, the inhibit voltages can be varied according to any requirement by setting the digital inputs accordingly, which provided more flexibility than conventional supply circuits having, for example, fixed voltage ratios. There may be a significant area reduction and a direct connection of charge pump to row and column decoders which may ensure the target voltages on WLs and BLs without any drop in between.

According to various aspects, the voltage supply circuit may be configured to check, whether the voltage values $\tilde{V}_{out}(1, 2, \ldots, n)$ of the output voltages $V_{out}(1, 2, \ldots, n)$ match the respective target voltage values $\tilde{V}_{tar}$ set by corresponding the digital control signals $S_D(1, 2, \ldots, n)$ during each of the ramp intervals $T_{up}1$, $T_{up}2$, $T_{up}3$, $T_{do}1$, $T_{do}2$, $T_{do}3$. Illustratively the setting of a subsequent ramping interval may be only applied if each voltage value $\tilde{V}_{out}(1, 2, \ldots, n)$ of the respective output voltage $V_{out}(1, 2, \ldots, n)$ match the corresponding target voltage value $\tilde{V}_{tar}$ set by corresponding the digital control signal $S_D(1, 2, \ldots, n)$ during the actual ramping interval.

According to various aspects, the control circuit 120, 720 (see control circuit 820 in FIG. 8A as well) may be configured to check, e.g., during a ramp up, whether the voltage value $\tilde{V}_{out}(1)$ of the first output voltage $V_{out}(1)$ matches the second target voltage value $\tilde{V}_{tar-2}$ during the first ramp interval $T_{up}1$, and, in the case that the voltage value $\tilde{V}_{out}(1)$ of the first output voltage $V_{out}(1)$ matches the second target voltage value $\tilde{V}_{tar-2}$ during the first ramp interval $T_{up}1$ (e.g., at the end of the first ramp interval $T_{up}1$ at latest), generates the first digital control signal $S_D(1)$ such that the voltage value $\tilde{V}_{out}(1)$ of the first output voltage $V_{out}(1)$ matches the third target voltage value $\tilde{V}_{tar-3}$ during the second ramp interval $T_{up}2$. According to various aspects, the control circuit 120, 720 (see control circuit 820 in FIG. 8A as well) may be configured to check, e.g., during a ramp up, whether the voltage value $\tilde{V}_{out}(2)$ of the second output voltage $V_{out}(2)$ matches the second target voltage value $\tilde{V}_{tar-2}$ during the first ramp interval $T_{up}1$ (e.g., at the end of the first ramp interval $T_{up}1$ at latest), and, in the case that the voltage value $\tilde{V}_{out}(2)$ of the second output voltage $V_{out}(2)$ matches the second target voltage value $\tilde{V}_{tar-2}$ during the first ramp interval $T_{up}1$, generates the second digital control signal $S_D(2)$ such that the voltage value $\tilde{V}_{out}(2)$ of the second output voltage $V_{out}(2)$ matches the second target voltage value $\tilde{V}_{tar-2}$ during the second ramp interval $T_{up}2$. In the same or in a similar way, the ramp up of more than two output voltages $V_{out}$ may be controlled. As an example, the control circuit 120, 720 (see control circuit 820 in FIG. 8A as well) may be configured to check, e.g., during a ramp up, whether the voltage value $\tilde{V}_{out}(3)$ of the third output voltage $V_{out}(3)$ matches the second target voltage value $\tilde{V}_{tar-2}$ during the first ramp interval $T_{up}1$ (e.g., at the end of the first ramp interval $T_{up}1$ at latest), and, in the case that the voltage value $\tilde{V}_{out}(3)$ of the third output voltage $V_{out}(3)$ matches the second target voltage value $\tilde{V}_{tar-2}$ during the first ramp interval $T_{up}1$, generates the third digital control signal $S_D(3)$ such that the voltage value $\tilde{V}_{out}(3)$ of the third output voltage $V_{out}(3)$ matches the third target voltage value $\tilde{V}_{tar-3}$ during the second ramp interval $T_{up}2$. In the same or in a similar way, the ramp up during more than one ramp interval may be controlled. As an example, the control circuit 120, 720 (see control circuit 820 in FIG. 8A as well) may be configured to check, e.g., during a ramp up, whether the voltage value $\tilde{V}_{out}(1)$ of the first output voltage $V_{out}(1)$ matches the third target voltage value $\tilde{V}_{tar-3}$ during the second ramp interval $T_{up}2$, and, in the case that the voltage value $\tilde{V}_{out}(1)$ of the first output voltage $V_{out}(1)$ matches the third target voltage value $\tilde{V}_{tar-3}$ during the second ramp interval $T_{up}2$ (e.g., at the end of the second ramp interval $T_{up}2$ at latest), generates the first digital control signal $S_D(1)$ such that the voltage value $\tilde{V}_{out}(1)$ of the first output voltage $V_{out}(1)$ matches the fourth target voltage value $\tilde{V}_{tar-4}$ during the third ramp interval $T_{up}3$.

According to various aspects, the control circuit 120, 720 (see control circuit 820 in FIG. 8A as well) may be configured to check, e.g., during a ramp down, check, whether the voltage value $\tilde{V}_{out}(1)$ of the first output voltage $V_{out}(1)$ matches the second target voltage value $\tilde{V}_{tar-2}$ during the first ramp interval $T_{do}1$, and, in the case that the voltage value $\tilde{V}_{out}(1)$ of the first output voltage $V_{out}(1)$ matches the second target voltage value $\tilde{V}_{tar-2}$ during the first ramp interval (e.g., at the end of the first ramp interval $T_{do}1$ at latest), generates the first digital control signal $S_D(1)$ such that the voltage value $\tilde{V}_{out}(1)$ of the first output voltage $V_{out}(1)$ matches the first target voltage value $\tilde{V}_{tar-1}$ during the second ramp interval $T_{do}2$. According to various aspects, the control circuit 120, 720 (see control circuit 820 in FIG. 8A as well) may be configured to check, e.g., during a ramp down, whether the voltage value $\tilde{V}_{out}(2)$ of the second output voltage $V_{out}(2)$ matches the second target voltage value $\tilde{V}_{tar-2}$ during the first ramp interval $T_{do}1$, and, in the case that the voltage value $\tilde{V}_{out}(2)$ of the second output voltage $(V_{out}(2))$ matches the second target voltage value $\tilde{V}_{tar-2}$ during the first ramp interval $T_{do}1$ (e.g., at the end of the first ramp interval $T_{do}1$ at latest), generates the second digital control signal $S_D(2)$ such that the voltage value $\tilde{V}_{out}(2)$ of the second output voltage $V_{out}(2)$ matches the first target voltage value $\tilde{V}_{tar-1}$ during the second ramp interval $T_{do}2$. In the same or in a similar way, the ramp down of more than two output voltages $V_{out}$ may be controlled. As an example, the control circuit 120, 720 (see control circuit 820 in FIG. 8A as well) may be configured to check, e.g., during a ramp down, whether the voltage value $\tilde{V}_{out}(3)$ of the third output voltage $V_{out}(3)$ matches the second target voltage value $\tilde{V}_{tar-2}$ during the first ramp interval $T_{do}1$ (e.g., at the end of the first ramp interval $T_{do}1$ at latest), and, in the case that the voltage value $\tilde{V}_{out}(3)$ of the third output voltage $V_{out}(3)$ matches the second target voltage value $\tilde{V}_{tar-2}$ during the first ramp interval $T_{do}1$, generates the third digital control signal $S_D(3)$ such that the voltage value $\tilde{V}_{out}(3)$ of the third output voltage $V_{out}(3)$ matches the first target voltage value $\tilde{V}_{tar-1}$ during the second ramp interval $T_{do}2$. In the same or in a similar way, the ramp down during more than one ramp interval may be controlled. As an example, the control circuit 120, 720 (see control circuit 820 in FIG. 8A as well) may be configured to check, e.g., during a ramp down, whether the voltage value $\tilde{V}_{out}(1)$ of the first output voltage $V_{out}(1)$ matches the second target voltage value $\tilde{V}_{tar-2}$ during the second ramp interval $T_{do}2$, and, in the case that the voltage value $\tilde{V}_{out}(1)$ of the first output voltage $V_{out}(1)$ matches the second target voltage value $\tilde{V}_{tar-2}$ during the second ramp interval $T_{do}2$ (e.g., at the end of the second ramp interval $T_{do}2$ at latest), generates the first digital control signal $S_D(1)$ such that the voltage value $\tilde{V}_{out}(1)$ of the first output voltage $V_{out}(1)$ matches the first target voltage value $\tilde{V}_{tar-1}$ during the third ramp interval $T_{do}3$. Similar formulations may apply for all of the described output voltages in each ramp interval. Illustratively, the ramp up of various voltages are synchronized since the next ramp interval may be suspended until each of the target values for the respective previous ramp interval are reached at least once.

Figure 8A:
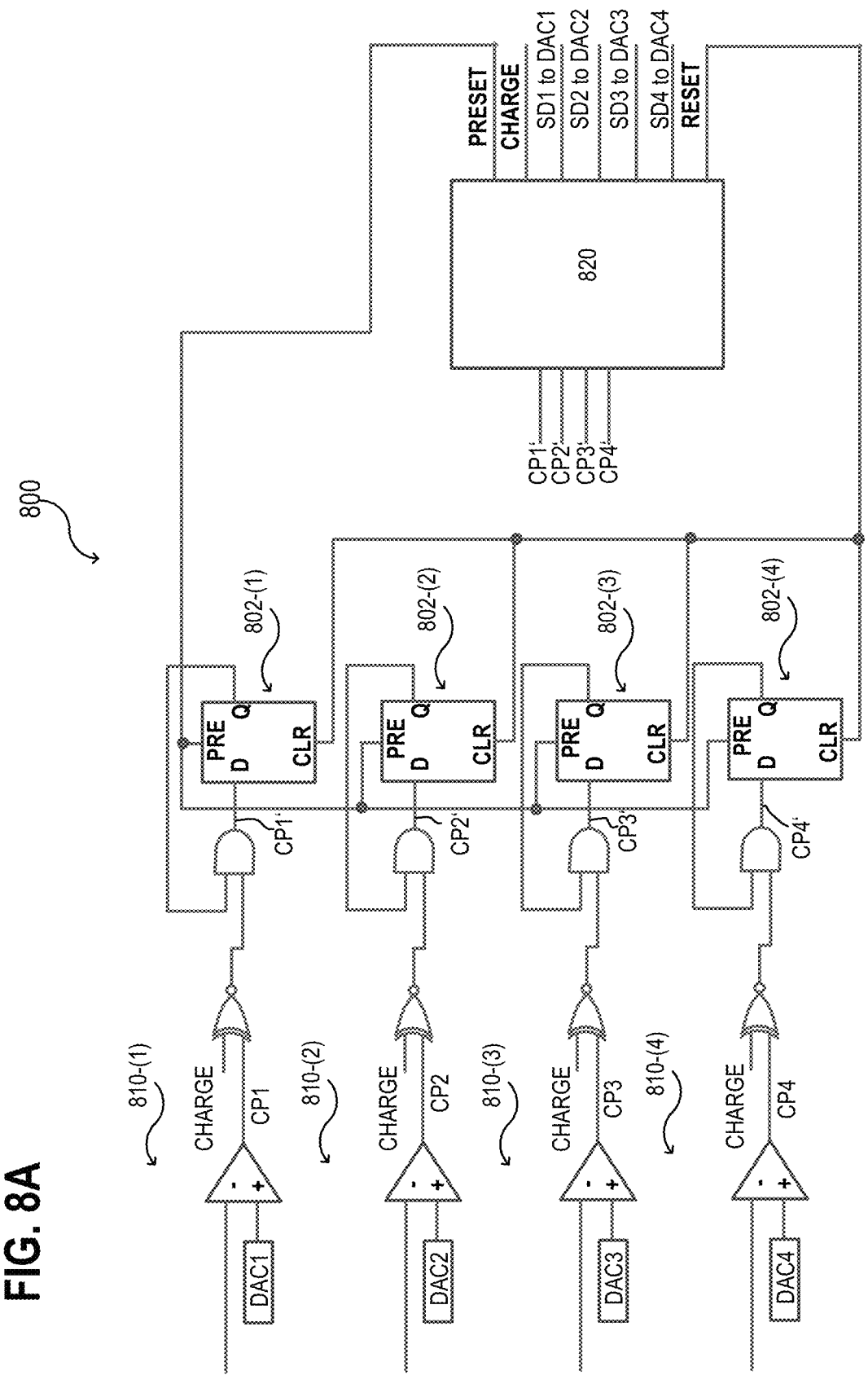

FIG. 8A illustrates an exemplary control circuit 820 and FIG. 8B illustrates a corresponding control scheme 870 that may be used to control a voltage supply circuit 800 (e.g., a voltage supply circuit as described herein), according to various aspects. In this example, the voltage supply circuit 800 may include four digitally controlled voltage converters 810-(1, 2, 3, 4). However, another number of digitally controlled voltage converters may be used in the same way or in a similar way. The control circuit 820 and the corresponding control scheme 870 may be configured to assure that during ramp up and/or ramp down, the next DAC values are only provided to the D/A voltage converters DAC1, DAC2, DAC3, DAC4 in the case that all output voltages actually reached their respective target voltage value. The control circuit 820 may include latches 802-(1, 2, 3, 4) e.g., one latch for each voltage converter circuit of the voltage supply circuit. The control circuit 820 may further include logic circuits including an XNOR logic gate and an AND logic gate. The respective XNOR logic gate, AND logic gate, and latch may be configured to allow selectively both a ramp up and a ramp down controlled by the CHARGE signal and may be configured to determine whether the comparator output signal CP1, CP2, CP3, CP4 indicated whether the output voltage reached the respective target voltage at least once during the respective ramp interval.

According to various aspects, during the PRESET pulse, the controller 820 may load the new DAC values (in this example the digital values 0, 1, 2, 3). If the new DAC values are greater than the previous ones (illustratively during ramp up, CHARGE signal set to "high") initially the comparator output will switch to a positive value. When all CP1, CP2, CP3, CP4 values return to 0, the controller 820 may switch to next state loading new DAC values. To discharge the voltages (illustratively during ramp down) the controller 820 may set the CHARGE signal to "low" and then the behavior is the similar as during charging. In the case that a new DAC value is equal to a previous DAC value, it can be assume that the output of the comparator provides the correct output within the PRESET pulse duration.

It is noted, that other circuits may be provided with the same or a similar functionality, according to various aspects.

According to various aspects, the voltage supply circuit 100, 700 may be configured to provide three output voltages that can be digitally controlled independently from one another. This may allow, for example, controlling a transistor arrangement or any other circuit efficiently.

Figure 9A:
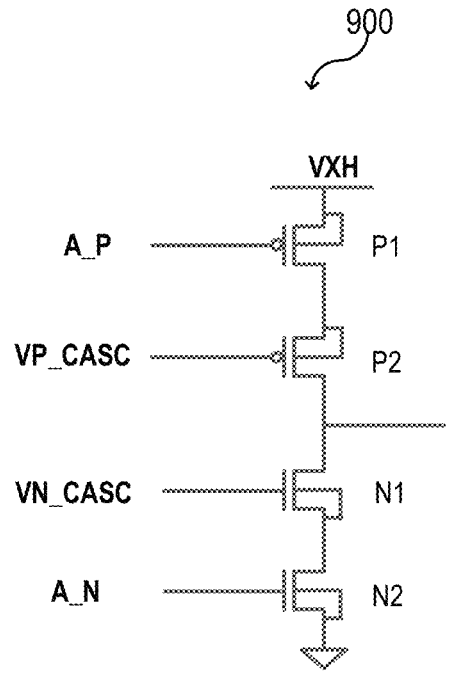
FIGS. 9A and 9B show a transistor arrangement and an operation thereof in various schematic views, according to various aspects.
Figure 9B:
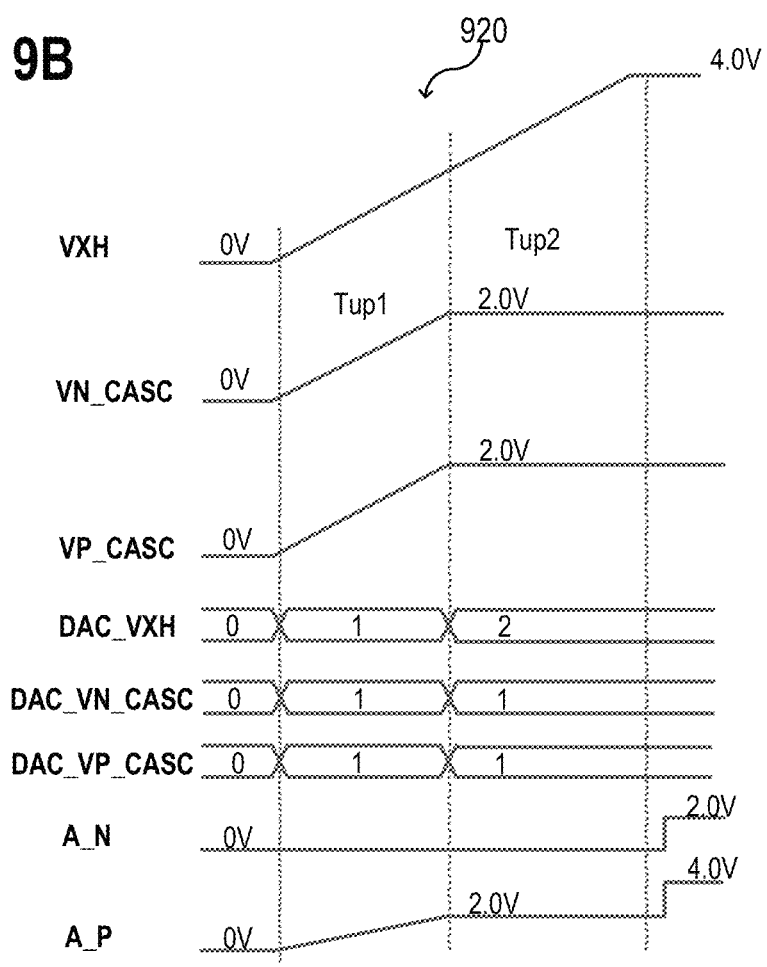

FIG. 9A shows a transistor arrangement 900 and FIG. 9B show a control scheme 920 to digitally control the voltages supplied to the transistor arrangement 900, according to various aspects.

The control scheme 920 may be used to control and limit the voltage applied to the transistors (N1, N2, P1, P2) of the transistor arrangement 900 or any other transistor arrangement. In the circuit exemplarily shown in FIG. 9A, it may be assumed just for illustration, all transistors (N1, N2, P1, P2) can operate with, for example, maximal 2 V, e.g., for technology or any other reasons. Introducing the two cascode transistors P2 and N1 and controlling the ramping voltages according to the control scheme 920, the voltage across each transistor (N1, N2, P1, P2) can be limited to equal to or less than 2 V (or any other desired voltage) thus to guarantee a safe operation even when voltages up to 4.0V are used as supply voltage VXH.

This may allow, for example, implementing a buffer circuit or driver circuit in a high voltage capable way via one or more cascode transistors. The auxiliary supply voltages VP_CASC, VN_CASC provided to the cascode transistors P2 and N1 and the supply voltage VXH for the transistor arrangement 900 may be generated via a voltage supply circuit 100, 700, as described herein. In this case, the voltage supply circuit may have at least three voltage converter circuits 100 that can be digitally controlled, according to various aspects.

The control scheme 920 illustrated in FIG. 9B shows the respective digital values of the digital control signals DAC_VXH, DAC_VP_CASC, DAC_VN_CASC provided as input for the digitally controlled at least three voltage converter circuits 100 (cf. FIG. 1A). In this exemplary case, a first digital value 0 may represent a target voltage of 0 V, the second digital value 1 may represent a target voltage of 2 V, and the third digital value 2 may represent a target voltage of 4 V, only as a numeric example. The control scheme 920 illustrated in FIG. 9B shows the respective supply voltages VP_CASC, VN_CASC, VXH generated based on the digital control signals DAC_VXH, DAC_VP_CASC, DAC_VN_CASC during a first ramp interval $T_{up}1$ and during a second ramping interval $T_{up}2$ and the voltages A_N, A_P provided to the transistors P1, N2.

According to various aspects, a control circuit implementing the control scheme 920 may be configured to ramp the voltage value of the first output voltage (VXH) from a first target voltage value (e.g., 0 V) up to a third target voltage value (e.g., 4 V) by generating the first digital control signal (DAC_VXH) such that the voltage value of the first output voltage (VXH) matches a second target voltage value (e.g., 2 V) during a first ramp interval $T_{up}1$, and the third target voltage value (e.g., 4 V) during a second ramp interval $T_{up}2$. The control circuit implementing the control scheme 920 may be further configured to ramp the voltage value of the second output voltage (VN_CASC) from the first target voltage value (e.g., 0 V) up to the second target voltage value (e.g., 2 V) by generating the second digital control signal DAC_VN_CASC) such that the voltage value of the second output voltage (VN_CASC) matches the second target voltage value (e.g., 2 V) during the first ramp interval $T_{up}1$ and the second target voltage value (e.g., 2 V) during the second ramp interval $T_{up}2$. The control circuit implementing the control scheme 920 may be further configured to ramp the voltage value of the third output voltage (VP_CASC) from the first target voltage value (e.g., 0 V) up to the second target voltage value (e.g., 2 V) by generating the third digital control signal DAC_VP_CASC) such that the voltage value of the third output voltage (VP_CASC) matches the second target voltage value (e.g., 2 V) during the first ramp interval $T_{up}1$ and the second target voltage value (e.g., 2 V) during the second ramp interval $T_{up}2$.

FIG. 10A shows an exemplary flow diagram of a method 1000a (e.g., a method for operating a voltage supply circuit). The method 1000a may include: in 1010a, ramping a voltage value of a first output voltage generated via a first digitally controlled voltage converter from a first target voltage value to a third target voltage value by supplying a first digital control signal to the first digitally controlled voltage converter such that the voltage value of the first output voltage matches a second target voltage value during a first ramp interval and the third target voltage value during a second ramp interval; and, in 1020a, ramping a voltage value of a second output voltage generated via a second digitally controlled voltage converter from the first target voltage value to the second target voltage value by supplying a second digital control signal to the second digitally controlled voltage converter such that the voltage value of the second output voltage matches the second target voltage value during the first ramp interval, and the second target voltage value during the second ramp interval.

FIG. 10B shows an exemplary flow diagram of a method 1000b (e.g., a method for operating a voltage supply circuit). The method 1000b may include: in 1010b, ramping a voltage value of a first output voltage generated via a first digitally controlled voltage converter from a third target voltage value to a first target voltage value by supplying a first digital control signal to the first digitally controlled voltage converter such that the voltage value of the first output voltage matches a second target voltage value during a first ramp interval and the first target voltage value during a second ramp interval; and, in 1020b, ramping a voltage value of a second output voltage generated via a second digitally controlled voltage converter from the second target voltage value to the first target voltage value by supplying a second digital control signal to the second digitally controlled voltage converter such that the voltage value of the second output voltage matches the second target voltage value during the first ramp interval and the first target voltage value during the second ramp interval.

Figure 11A:
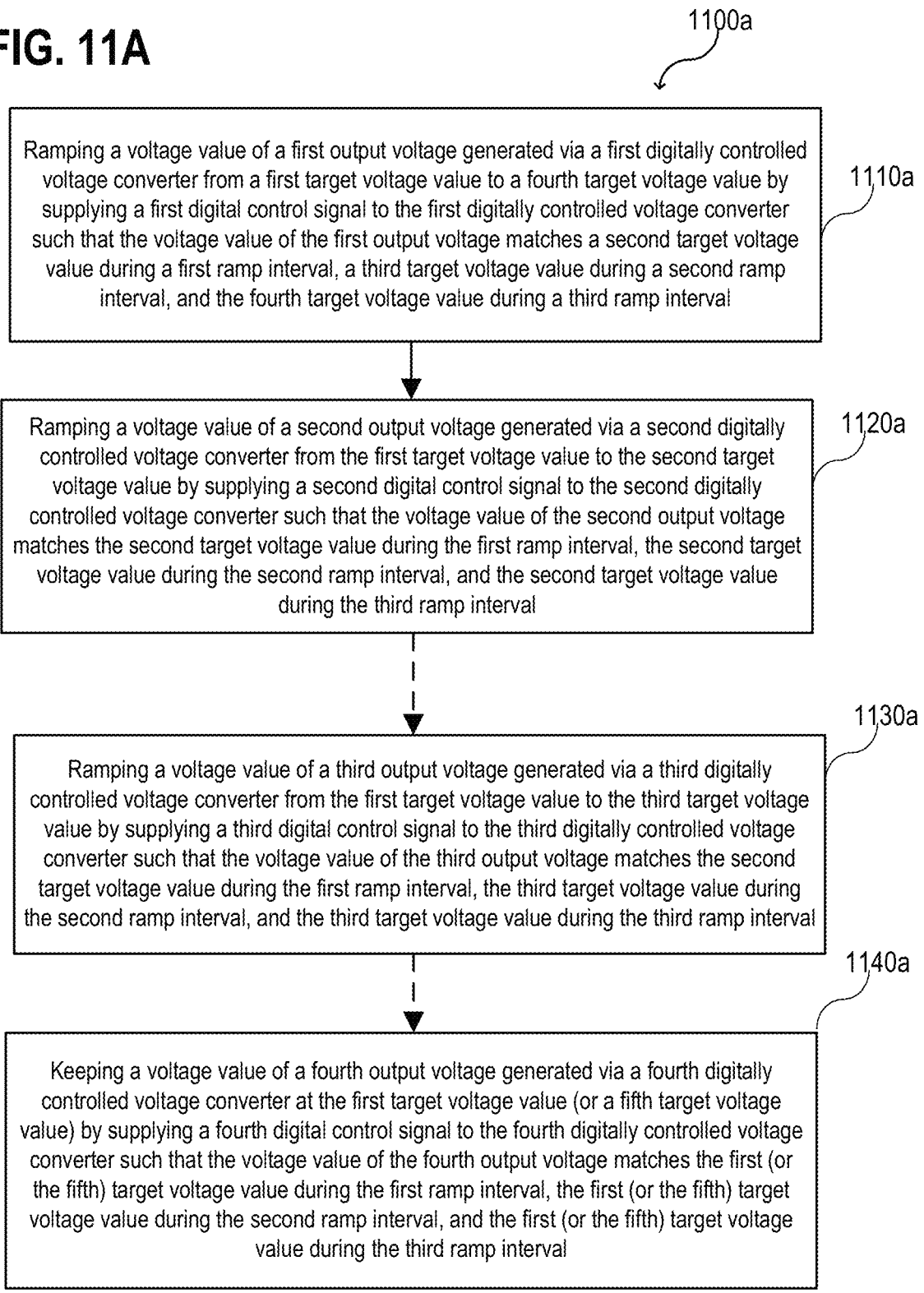
FIG. 11A shows a schematic flow diagram of a method for operating a voltage supply circuit, according to various aspects.

FIG. 11A shows an exemplary flow diagram of a method 1100a (e.g., a method for operating a voltage supply circuit). The method 1100a may include: in 1110a, ramping a voltage value of a first output voltage generated via a first digitally controlled voltage converter from a first target voltage value to a fourth target voltage value by supplying a first digital control signal to the first digitally controlled voltage converter such that the voltage value of the first output voltage matches a second target voltage value during a first ramp interval, a third target voltage value during a second ramp interval, and the fourth target voltage value during a third ramp interval; and, in 1120a, ramping a voltage value of a second output voltage generated via a second digitally controlled voltage converter from the first target voltage value to the second target voltage value by supplying a second digital control signal to the second digitally controlled voltage converter such that the voltage value of the second output voltage matches the second target voltage value during the first ramp interval, the second target voltage value during the second ramp interval, and the second target voltage value during the third ramp interval.

According to various aspects, the method 1100a for operating a voltage supply circuit may further include: in 1130a, ramping a voltage value of a third output voltage generated via a third digitally controlled voltage converter from the first target voltage value to the third target voltage value by supplying a third digital control signal to the third digitally controlled voltage converter such that the voltage value of the third output voltage matches the second target voltage value during the first ramp interval, the third target voltage value during the second ramp interval, and the third target voltage value during the third ramp interval.

According to various aspects, the method 1100a for operating a voltage supply circuit may further include: in 1140a, keeping a voltage value of a fourth output voltage generated via a fourth digitally controlled voltage converter at the first target voltage value (or a fifth target voltage value) by supplying a fourth digital control signal to the fourth digitally controlled voltage converter such that the voltage value of the fourth output voltage matches the first (or the fifth) target voltage value during the first ramp interval, the first (or the fifth) target voltage value during the second ramp interval, and the first (or the fifth) target voltage value during the third ramp interval.

FIG. 11B shows an exemplary flow diagram of a method 1100b (e.g., a method for operating a voltage supply circuit).

The method 1100b may include: in 1110b, ramping a voltage value of a first output voltage generated via a first digitally controlled voltage converter from a fourth target voltage value to a first target voltage value by supplying a first digital control signal to the first digitally controlled voltage converter such that the voltage value of the first output voltage matches a third target voltage value during a first ramp interval, a second target voltage value during a second ramp interval, and the first target voltage value during a third ramp interval; and, in 1120b, ramping a voltage value of a second output voltage generated via a second digitally controlled voltage converter from the second target voltage value to the first target voltage value by supplying a second digital control signal to the second digitally controlled voltage converter such that the voltage value of the second output voltage matches the second target voltage value during the first ramp interval, the second target voltage value during the second ramp interval, and the first target voltage value during the third ramp interval.

According to various aspects, the method 1100b for operating a voltage supply circuit may further include: in 1130b, ramping a voltage value of a third output voltage generated via a third digitally controlled voltage converter from the third target voltage value to the first target voltage value by supplying a third digital control signal to the third digitally controlled voltage converter such that the voltage value of the third output voltage matches the third target voltage value during the first ramp interval, the second target voltage value during the second ramp interval, and the first target voltage value during the third ramp interval.

According to various aspects, the method 1100b for operating a voltage supply circuit may further include: in 1140b, keeping a voltage value of a fourth output voltage generated via a fourth digitally controlled voltage converter at the first target voltage value (or a fifth target voltage value) by supplying a fourth digital control signal to the fourth digitally controlled voltage converter such that the voltage value of the fourth output voltage matches the first (or the fifth) target voltage value during the first ramp interval, the first (or the fifth) target voltage value during the second ramp interval, and the first (or the fifth) target voltage value during the third ramp interval.

In the following, various examples are provided that may include one or more aspects described above with reference to the voltage supply circuit 100, 700, the memory cell driver 300, the memory cell arrangement 400, 500 and methods thereof, e.g., method 1000a, 1000b, 1100a, 1100b.

Example 1 is a voltage supply circuit, including: a first digitally controlled voltage converter circuit configured to receive a first digital control signal, generate a first output voltage, and control the generation of the first output voltage such that a voltage value of the first output voltage matches a first target voltage value, a second target voltage value, or a third target voltage value as a function of the first digital control signal; a second digitally controlled voltage converter circuit configured to receive a second digital control signal, generate a second output voltage, and control the generation of the second output voltage such that a voltage value of the second output voltage matches the first target voltage value or the second target voltage value as a function of the second digital control signal; and a control circuit configured to: ramp the voltage value of the first output voltage from the first target voltage value (e.g., up) to the third target voltage value by generating the first digital control signal such that the voltage value of the first output voltage matches the second target voltage value during a first ramp interval, and such that the voltage value of the first output voltage matches the third target voltage value during a second ramp interval; ramp the voltage value of the second output voltage from the first target voltage value (e.g., up) to the second target voltage value by generating the second digital control signal such that the voltage value of the second output voltage matches the second target voltage value during the first ramp interval and such that the voltage value of the second output voltage matches the second target voltage value during the second ramp interval.

Example 2 is a voltage supply circuit, including: a first digitally controlled voltage converter circuit configured to receive a first digital control signal, generate a first output voltage, and control the generation of the first output voltage such that a voltage value of the first output voltage matches a first target voltage value, a second target voltage value, or a third target voltage value as a function of the first digital control signal; a second digitally controlled voltage converter circuit configured to receive a second digital control signal, generate a second output voltage, and control the generation of the second output voltage such that a voltage value of the second output voltage matches the first target voltage value or the second target voltage value as a function of the second digital control signal; and a control circuit configured to: ramp the voltage value of the first output voltage from the third target voltage value down to the first target voltage value by generating the first digital control signal such that the voltage value of the first output voltage matches the second target voltage value during a first ramp interval, and the first target voltage value during a second ramp interval; ramp the voltage value of the second output voltage from the second target voltage value down to the first target voltage value by generating the second digital control signal such that the voltage value of the second output voltage matches the second target voltage value during the first ramp interval and the first target voltage value during the second ramp interval.

In Example 3, the voltage supply circuit of Example 1 or 2 may optionally further include that each digitally controlled voltage converter circuit includes at least one voltage converter to generate the respective output voltage based on a received input voltage.

In Example 4, the voltage supply circuit of Example 1 or 2 may optionally further include that each digitally controlled voltage converter circuit includes at least one voltage converter to generate the respective output voltage based on an upwards conversion (e.g., Example 1) and/or downwards conversion (e.g., Example 2) of a received input voltage.

In Example 5, the voltage supply circuit of any one of Examples 1 to 4 may optionally further include that each digitally controlled voltage converter circuit includes a feedback loop to control the generation of the respective output voltage by the respective at least one voltage converter.

In Example 6, the voltage supply circuit of Example 3 or 4 together with Example 5 may optionally further include that the respective feedback loop is configured to compare an actual voltage value of the respective output voltage with a reference voltage value of a corresponding reference voltage and control the respective at least one voltage converter based on a result of the comparison.

In Example 7, the voltage supply circuit of Example 6 may optionally further include that the respective feedback loop is configured to control the respective at least one voltage converter such that the actual voltage value of the respective output voltage matches an actual reference voltage value of the respective reference voltage.

In Example 8, the voltage supply circuit of Example 7 may optionally further include that the actual reference voltage value of the respective reference voltage is defined by the respective digital control signal.

In Example 9, the voltage supply circuit of Example 7 or 8 may optionally further include that the respective feedback loop includes a digital analog converter to convert the respective digital control signal into the reference voltage corresponding thereto, the actual reference voltage value of the respective reference voltage is defined by an actual digital value represented by the respective digital control signal.

In Example 10, the voltage supply circuit of Example 9 may optionally further include that the actual digital value represented by the first digital control signal defines whether the voltage value of the first output voltage shall match the first target voltage value, the second target voltage value, or the third target voltage value.

In Example 11, the voltage supply circuit of Example 9 or 10 may optionally further include that the actual digital value represented by the second digital control signal defines whether the voltage value of the second output voltage shall match the first target voltage value or the second target voltage value.

In Example 12, the voltage supply circuit of any one of Examples 5 to 11 may optionally further include that the actual reference voltage value of a first reference voltage defines whether the voltage value of the first output voltage shall match the first target voltage value, the second target voltage value, or the third target voltage value.

In Example 13, the voltage supply circuit of any one of Examples 5 to 12 may optionally further include that the actual reference voltage value of a second reference voltage defines whether the voltage value of the second output voltage shall match the first target voltage value or the second target voltage value.

In Example 14, the voltage supply circuit of any one of Examples 5 to 13 may optionally further include that the respective feedback loop includes at least one voltage divider defining a voltage (e.g., a voltage divided from the output voltage) to be compared with the respective reference voltage.

In Example 15, the voltage supply circuit of any one of Examples 1 to 14 may optionally further include that the first digital control signal is configured to represent selectively one of a first digital value, a second digital value, and a third digital value.

In Example 16, the voltage supply circuit of any one of Examples 1 to 15 may optionally further include that the second digital control signal is configured to represent selectively one of a first digital value and a second digital value.

In Example 17, the voltage supply circuit of Example 1 may optionally further include that the control circuit is further configured to: check, whether the voltage value of the first output voltage matches the second target voltage value during the first ramp interval, and, in the case that the voltage value of the first output voltage matches the second target voltage value during the first ramp interval, generate the first digital control signal such that the voltage value of the first output voltage matches the third target voltage value during the second ramp interval. The control circuit may be further configured to, in the case that the voltage value of the first output voltage does not match the second target voltage value during the first ramp interval, suspend a generation of the first digital control signal such that the voltage value of the first output voltage matches the third target voltage value during the second ramp interval.

In Example 18, the voltage supply circuit of Example 1 or 17 may optionally further include that the control circuit is further configured to: check, whether the voltage value of the second output voltage matches the second target voltage value during the first ramp interval, and, in the case that the voltage value of the second output voltage matches the second target voltage value during the first ramp interval, generate the second digital control signal such that the voltage value of the second output voltage matches the second target voltage value during the second ramp interval. The control circuit may be further configured to, in the case that the voltage value of the second output voltage does not match the second target voltage value during the first ramp interval, suspend a generation of the second digital control signal such that the voltage value of the second output voltage matches the second target voltage value during the second ramp interval.

In Example 19, the voltage supply circuit of Example 2 may optionally further include that the control circuit is further configured to: check, whether the voltage value of the first output voltage matches the second target voltage value during the first ramp interval, and, in the case that the voltage value of the first output voltage matches the second target voltage value during the first ramp interval, generate the first digital control signal such that the voltage value of the first output voltage matches the first target voltage value during the second ramp interval. The control circuit may be further configured to, in the case that the voltage value of the first output voltage does not match the second target voltage value during the first ramp interval, suspend a generation of the first digital control signal such that the voltage value of the first output voltage matches the first target voltage value during the second ramp interval.

In Example 20, the voltage supply circuit of Example 2 or 19 may optionally further include that the control circuit is further configured to: check, whether the voltage value of the second output voltage matches the second target voltage value during the first ramp interval, and, in the case that the voltage value of the second output voltage matches the second target voltage value during the first ramp interval, generate the second digital control signal such that the voltage value of the second output voltage matches the first target voltage value during the second ramp interval. The control circuit may be further configured to, in the case that the voltage value of the second output voltage does not match the second target voltage value during the first ramp interval, suspend a generation of the second digital control signal such that the voltage value of the second output voltage matches the first target voltage value during the second ramp interval.

In Example 21, the voltage supply circuit of Example 1 may optionally further include that the control circuit is further configured to: generate the first digital control signal such that the first digital control signal represents a second digital value in the first ramp interval and a third digital value in the second ramp interval.

In Example 22, the voltage supply circuit of Example 1 or 21 may optionally further include that the control circuit is further configured to: generate the second digital control signal such that the second digital control signal represents a second digital value in the first ramp interval and the second digital value in the second ramp interval.

In Example 23, the voltage supply circuit of Example 2 may optionally further include that the control circuit is further configured to: generate the first digital control signal such that the first digital control signal represents a second digital value in the first ramp interval and a first digital value in the second ramp interval.

Example 24, the voltage supply circuit of Example 2 or 23 may optionally further include that the control circuit is further configured to generate the second digital control signal such that the second digital control signal represents a second digital value in the first ramp interval and a first digital value in the second ramp interval.

Example 25 is a voltage supply circuit, including: a first digitally controlled voltage converter circuit configured to receive a first digital control signal, generate a first output voltage, and control the generation of the first output voltage such that a voltage value of the first output voltage matches a first target voltage value, a second target voltage value, a third target voltage value, or a fourth target voltage value as a function of the first digital control signal; a second digitally controlled voltage converter circuit configured to receive a second digital control signal, generate a second output voltage, and control the generation of the second output voltage such that a voltage value of the second output voltage matches the first target voltage value or the second target voltage value as a function of the second digital control signal; a third digitally controlled voltage converter circuit configured to receive a third digital control signal, generate a third output voltage, and control the generation of the third output voltage such that a voltage value of the third output voltage matches the first target voltage value, the second target voltage value, or the third target voltage value as a function of the third digital control signal; a fourth digitally controlled voltage converter circuit configured to receive a fourth digital control signal, generate a fourth output voltage, and control the generation of the fourth output voltage such that a voltage value of the fourth output voltage matches the first target voltage value or a fifth target voltage value as a function of the fourth digital control signal; and a control circuit configured to: ramp the voltage value of the first output voltage from the first target voltage value (e.g., up) to the fourth target voltage value by generating the first digital control signal such that the voltage value of the first output voltage matches the second target voltage value during a first ramp interval, such that the voltage value of the first output voltage matches the third target voltage value during a second ramp interval, and such that the voltage value of the first output voltage matches the fourth target voltage value during a third ramp interval; ramp the voltage value of the second output voltage from the first target voltage value (e.g., up) to the second target voltage value by generating the second digital control signal such that the voltage value of the second output voltage matches the second target voltage value during the first ramp interval, such that the voltage value of the second output voltage matches the second target voltage value during the second ramp interval, and such that the voltage value of the second output voltage matches the second target voltage value during the third ramp interval; ramp the voltage value of the third output voltage from the first target voltage value (e.g., up) to the third target voltage value by generating the third digital control signal such that the voltage value of the third output voltage matches the second target voltage value during the first ramp interval, the such that the voltage value of the third output voltage matches third target voltage value during the second ramp interval, and such that the voltage value of the third output voltage matches the third target voltage value during the third ramp interval; and either keep the voltage value of the fourth output voltage at the first target voltage value by generating the fourth digital control signal such that the voltage value of the fourth output voltage matches the first target voltage value during the first ramp interval, such that the voltage value of the fourth output voltage matches the first target voltage value during the second ramp interval, and such that the voltage value of the fourth output voltage matches the first target voltage value during the third ramp interval, or ramp the voltage value of the fourth output voltage from the first target voltage value (e.g., up) to the fifth target voltage value by generating the fourth digital control signal such that the voltage value of the fourth output voltage matches the fifth target voltage value during the first ramp interval, such that the voltage value of the fourth output voltage matches the fifth target voltage value during the second ramp interval, and such that the voltage value of the fourth output voltage matches the fifth target voltage value during the third ramp interval.

Example 26 is a voltage supply circuit, including: a first digitally controlled voltage converter circuit configured to receive a first digital control signal, generate a first output voltage, and control the generation of the first output voltage such that a voltage value of the first output voltage matches a first target voltage value, a second target voltage value, a third target voltage value, or a fourth target voltage value as a function of the first digital control signal; a second digitally controlled voltage converter circuit configured to receive a second digital control signal, generate a second output voltage, and control the generation of the second output voltage such that a voltage value of the second output voltage matches the first target voltage value or the second target voltage value as a function of the second digital control signal; a third digitally controlled voltage converter circuit configured to receive a third digital control signal, generate a third output voltage, and control the generation of the third output voltage such that a voltage value of the third output voltage matches the first target voltage value, the second target voltage value, or the third target voltage value as a function of the third digital control signal; a fourth digitally controlled voltage converter circuit configured to receive a fourth digital control signal, generate a fourth output voltage, and control the generation of the fourth output voltage such that a voltage value of the fourth output voltage matches the first target voltage value or a fifth target voltage value as a function of the fourth digital control signal; and a control circuit configured to: ramp the voltage value of the first output voltage from the fourth target voltage value down to the first target voltage value by generating the first digital control signal such that the voltage value of the first output voltage matches the third target voltage value during a first ramp interval, such that the voltage value of the first output voltage matches the second target voltage value during a second ramp interval, and such that the voltage value of the first output voltage matches the first target voltage value during a third ramp interval; ramp the voltage value of the second output voltage from the second target voltage value down to the first target voltage value by generating the second digital control signal such that the voltage value of the second output voltage matches the second target voltage value during the first ramp interval, such that the voltage value of the second output voltage matches the second target voltage value during the second ramp interval, and such that the voltage value of the second output voltage matches the first target voltage value during the third ramp interval; ramp the voltage value of the third output voltage from the third target voltage value down to the first target voltage value by generating the third digital control signal such that the voltage value of the third output voltage matches the third target voltage value during the first ramp interval, such that the voltage value of the third output voltage matches the second target voltage value during the second ramp interval, and such that the voltage value of the third output voltage matches the first target voltage value during the third ramp interval; and either keep the voltage value of the fourth output voltage at the first target voltage value by generating the fourth digital control signal such that the voltage value of the fourth output voltage matches the first target voltage value during the first ramp interval, such that the voltage value of the fourth output voltage matches the first target voltage value during the second ramp interval, and such that the voltage value of the fourth output voltage matches the first target voltage value during the third ramp interval, or ramp the voltage value of the fourth output voltage from the fifth target voltage value to the first target voltage value by generating the fourth digital control signal such that the voltage value of the fourth output voltage matches the fifth target voltage value during the first ramp interval, such that the voltage value of the fourth output voltage matches the fifth target voltage value during the second ramp interval, and such that the voltage value of the fourth output voltage matches the first target voltage value during the third ramp interval.

It may be noted that the two control options provided with the control of the generation of the fourth output voltage as a function of the fourth digital control signal (i.e. either to keep the fourth output voltage at the first target voltage value or to ramp the fourth output voltage to any other target voltage value (e.g., the fifth target voltage value) and keep it there), see Examples 25 and 26, may be alternative control options and may not be implemented necessarily at the same time.

In Example 27, the voltage supply circuit of Example 25 or 26 may optionally further include that each digitally controlled voltage converter circuit includes at least one voltage converter to generate the respective output voltage based on a received input voltage.

In Example 28, the voltage supply circuit of Example 27 may optionally further include that each digitally controlled voltage converter circuit includes a feedback loop to control the generation of the respective output voltage by the respective at least one voltage converter.

In Example 29, the voltage supply circuit of Example 28 may optionally further include that the respective feedback loop is configured to compare an actual voltage value of the respective output voltage with a reference voltage value of a corresponding reference voltage and control the respective at least one voltage converter based on a result of the comparison.

In Example 30, the voltage supply circuit of Example 29 may optionally further include that the respective feedback loop is configured to control the respective at least one voltage converter such that the actual voltage value of the respective output voltage matches an actual reference voltage value of the respective reference voltage.

In Example 31, the voltage supply circuit of Example 30 may optionally further include that the actual reference voltage value of the respective reference voltage is defined by the respective digital control signal.

In Example 32, the voltage supply circuit of Example 30 or 31 may optionally further include that the respective feedback loop includes a digital analog converter to convert the respective digital control signal into the reference voltage corresponding thereto, the actual reference voltage value of the respective reference voltage is defined by an actual digital value represented by the respective digital control signal.

In Example 33, the voltage supply circuit of Example 32 may optionally further include that the actual digital value represented by the first digital control signal defines whether the voltage value of the first output voltage shall match the first target voltage value, the second target voltage value, the third target voltage value, or the fourth target voltage value.

In Example 34, the voltage supply circuit of Example 32 or 33 may optionally further include that the actual digital value represented by the second digital control signal defines whether the voltage value of the second output voltage shall match the first target voltage value or the second target voltage value.

In Example 35, the voltage supply circuit of any one of Examples 32 to 34 may optionally further include that the actual digital value represented by the third digital control signal defines whether the voltage value of the third output voltage shall match the first target voltage value, the second target voltage value, or the third target voltage value.

In Example 36, the voltage supply circuit any one of Examples 32 to 35 may optionally further include that the actual digital value represented by the fourth digital control signal defines whether the voltage value of the fourth output voltage shall match the first target voltage value or the fifth target voltage value.

In Example 37, the voltage supply circuit of any one of Examples 29 to 36 may optionally further include that the actual reference voltage value of a first reference voltage defines whether the voltage value of the first output voltage shall match the first target voltage value, the second target voltage value, the third target voltage value, or the fourth target voltage value.

In Example 38, the voltage supply circuit of any one of Examples 29 to 37 may optionally further include that the actual reference voltage value of a second reference voltage defines whether the voltage value of the second output voltage shall match the first target voltage value or the second target voltage value.

In Example 39, the voltage supply circuit of any one of Examples 29 to 38 may optionally further include that the actual reference voltage value of a third reference voltage defines whether the voltage value of the third output voltage shall match the first target voltage value, the second target voltage value, or the third target voltage value.

In Example 40, the voltage supply circuit of any one of Examples 29 to 39 may optionally further include that the actual reference voltage value of a fourth reference voltage defines whether the voltage value of the fourth output voltage shall match the first target voltage value or the fifth target voltage value.

In Example 41, the voltage supply circuit of any one of Examples 29 to 40 may optionally further include that the respective feedback loop includes at least one voltage divider defining a measurement voltage to be compared with the respective reference voltage.

In Example 42, the voltage supply circuit of any one of Examples 25 to 41 may optionally further include that the first digital control signal is configured to represent selectively one of a first digital value, a second digital value, a third digital value, and a fourth digital value.

In Example 43, the voltage supply circuit of any one of Examples 25 to 42 may optionally further include that the second digital control signal is configured to represent selectively one of a first digital value and a second digital value.

In Example 44, the voltage supply circuit of any one of Examples 25 to 43 may optionally further include that the third digital control signal is configured to represent selectively one of a first digital value, a second digital value, and a third digital value.

In Example 45, the voltage supply circuit of any one of Examples 25 to 44 may optionally further include that the fourth digital control signal is configured to represent selectively one of a first digital value and a fifth digital value.

In Example 46, the voltage supply circuit of Example 25 may optionally further include that the control circuit is configured to: check, whether the voltage value of the first output voltage matches the second target voltage value during the first ramp interval, and, in the case that the voltage value of the first output voltage matches the second target voltage value during the first ramp interval, generate the first digital control signal such that the voltage value of the first output voltage matches the third target voltage value during the second ramp interval; and/or check, whether the voltage value of the first output voltage matches the third target voltage value during the second ramp interval, and, in the case that the voltage value of the first output voltage matches the third target voltage value during the second ramp interval, generate the first digital control signal such that the voltage value of the first output voltage matches the fourth target voltage value during the third ramp interval.

In Example 47, the voltage supply circuit of Example 25 or 46 may optionally further include that the control circuit is configured to: check, whether the voltage value of the second output voltage matches the second target voltage value during the first ramp interval, and, in the case that the voltage value of the second output voltage matches the second target voltage value during the first ramp interval, generate the second digital control signal such that the voltage value of the second output voltage matches the second target voltage value during the second ramp interval; and/or check, whether the voltage value of the second output voltage matches the second target voltage value during the second ramp interval, and, in the case that the voltage value of the second output voltage matches the second target voltage value during the second ramp interval, generate the second digital control signal such that the voltage value of the second output voltage matches the second target voltage value during the third ramp interval.

In Example 48, the voltage supply circuit of Example 25, 46, or 47 may optionally further include that the control circuit is configured to: check, whether the voltage value of the third output voltage matches the second target voltage value during the first ramp interval, and, in the case that the voltage value of the third output voltage matches the second target voltage value during the first ramp interval, generate the third digital control signal such that the voltage value of the third output voltage matches the third target voltage value during the second ramp interval; and/or check, whether the voltage value of the third output voltage matches the second target voltage value during the second ramp interval, and, in the case that the voltage value of the third output voltage matches the second target voltage value during the second ramp interval, generate the third digital control signal such that the voltage value of the third output voltage matches the third target voltage value during the third ramp interval.

In Example 49, the voltage supply circuit of Example 25 or any one of Examples 46 to 48 may optionally further include that the control circuit is configured to: check, whether the voltage value of the fourth output voltage matches the first target voltage value or the fifth target voltage value during the first ramp interval, and, in the case that the voltage value of the fourth output voltage matches the first target voltage value or the fifth target voltage value during the first ramp interval, generate the fourth digital control signal such that the voltage value of the fourth output voltage matches the first target voltage value or the fifth target voltage value during the second ramp interval; and/or check, whether the voltage value of the fourth output voltage matches the first target voltage value or the fifth target voltage value during the second ramp interval, and, in the case that the voltage value of the fourth output voltage matches the first target voltage value or the fifth target voltage value during the second ramp interval, generate the fourth digital control signal such that the voltage value of the fourth output voltage matches the first target voltage value or the fifth target voltage value during the third ramp interval.

In Example 50, the voltage supply circuit of Example 26 may optionally further include that the control circuit is configured to: check, whether the voltage value of the first output voltage matches the third target voltage value during the first ramp interval, and, in the case that the voltage value of the first output voltage matches the third target voltage value during the first ramp interval, generate the first digital control signal such that the voltage value of the first output voltage matches the second target voltage value during the second ramp interval; and/or check, whether the voltage value of the first output voltage matches the second target voltage value during the second ramp interval, and, in the case that the voltage value of the first output voltage matches the second target voltage value during the second ramp interval, generate the first digital control signal such that the voltage value of the first output voltage matches the first target voltage value during the third ramp interval.

In Example 51, the voltage supply circuit of Example 26 or 50 may optionally further include that the control circuit is configured to: check, whether the voltage value of the second output voltage matches the second target voltage value during the first ramp interval, and, in the case that the voltage value of the second output voltage matches the second target voltage value during the first ramp interval, generate the second digital control signal such that the voltage value of the second output voltage matches the second target voltage value during the second ramp interval; and/or check, whether the voltage value of the second output voltage matches the second target voltage value during the second ramp interval, and, in the case that the voltage value of the second output voltage matches the second target voltage value during the second ramp interval, generate the second digital control signal such that the voltage value of the second output voltage matches the first target voltage value during the third ramp interval.

In Example 52, the voltage supply circuit of Example 26, 50, or 51 may optionally further include that the control circuit is configured to: check, whether the voltage value of the third output voltage matches the third target voltage value during the first ramp interval, and, in the case that the voltage value of the third output voltage matches the third target voltage value during the first ramp interval, generate the third digital control signal such that the voltage value of the third output voltage matches the second target voltage value during the second ramp interval; and/or check, whether the voltage value of the third output voltage matches the second target voltage value during the second ramp interval, and, in the case that the voltage value of the third output voltage matches the second target voltage value during the second ramp interval, generate the third digital control signal such that the voltage value of the third output voltage matches the first target voltage value during the third ramp interval.

In Example 53, the voltage supply circuit of Example 36 or any one of Examples 50 to 52 may optionally further include that the control circuit is configured to: check, whether the voltage value of the fourth output voltage matches the first target voltage value or the fifth target voltage value during the first ramp interval, and, in the case that the voltage value of the fourth output voltage matches the first target voltage value or the fifth target voltage value during the first ramp interval, generate the fourth digital control signal such that the voltage value of the fourth output voltage matches the first target voltage value or the fifth target voltage value during the second ramp interval; and/or check, whether the voltage value of the fourth output voltage matches the first target voltage value or the fifth target voltage value during the second ramp interval, and, in the case that the voltage value of the fourth output voltage matches the first target voltage value or the fifth target voltage value during the second ramp interval, generate the fourth digital control signal such that the voltage value of the fourth output voltage matches the first target voltage value or the fifth target voltage value during the third ramp interval.

In Example 54, the voltage supply circuit of Example 25 and any one of Examples 42 to 45 may optionally further include that the control circuit is configured to: generate the first digital control signal such that the first digital control signal represents the second digital value in the first ramp interval, the third digital value in the second ramp interval, and the fourth digital value in the third ramp interval; and/or generate the second digital control signal such that the second digital control signal represents the second digital value in the first ramp interval, the second digital value in the second ramp interval, and the second digital value in the third ramp interval; and/or generate the third digital control signal such that the third digital control signal represents the second digital value in the first ramp interval, the third digital value in the second ramp interval, and the third digital value in the third ramp interval; and/or generate the fourth digital control signal such that the fourth digital control signal represents the first digital value or the fifth digital value in the first ramp interval, the first digital value or the fifth digital value in the second ramp interval, and the first digital value or the fifth digital value in the third ramp interval.

In Example 55, the voltage supply circuit of Example 26 and any one of Examples 42 to 45 may optionally further include that the control circuit is configured to: generate the first digital control signal such that the first digital control signal represents the third digital value in the first ramp interval, the second digital value in the second ramp interval, and the first digital value in the third ramp interval; and/or generate the second digital control signal such that the second digital control signal represents the second digital value in the first ramp interval, the second digital value in the second ramp interval, and the first digital value in the third ramp interval; and/or generate the third digital control signal such that the third digital control signal represents the third digital value in the first ramp interval, the second digital value in the second ramp interval, and the first digital value in the third ramp interval; and/or generate the fourth digital control signal such that the fourth digital control signal represents the first digital value or the fifth digital value in the first ramp interval, the first digital value or the fifth digital value in the second ramp interval, and the first digital value or the fifth digital value in the third ramp interval.

Example 60 is a memory cell arrangement, including: a first set of memory cell drivers configured to selectively supply a supply voltage of a set of supply voltages to one or more first control-lines for operating one or more memory cells; a second set of memory cell drivers configured to selectively supply another supply voltage of the set of supply voltages to one or more second control-lines for operating the one or more memory cells; and a voltage supply circuit configured to provide the set of supply voltages to the first set of memory cell drivers and the second set of memory cell drivers), the voltage supply circuit including: a first digitally controlled voltage converter circuit configured to generate a first supply voltage of the set of supply voltages in response to a received first digital control signal; a second digitally controlled voltage converter circuit configured to generate a second supply voltage of the set of supply voltages in response to a received second digital control signal; a third digitally controlled voltage converter circuit configured to generate a third supply voltage of the set of supply voltages in response to a received third digital control signal; and a fourth circuit configured to provide a fourth supply voltage of the set of supply voltages. The fourth circuit may be optionally configured to provide the fourth supply voltage of the set of supply voltages in response to a received fourth digital control signal. The fourth circuit may include a fourth digitally controlled voltage converter circuit configured to generate the fourth supply voltage of the set of supply voltages in response to a received fourth digital control signal.

In Example 61, the memory cell arrangement of Example 60 may optionally further include that the fourth supply voltage is a base voltage. As an example, the base voltage may be at a constant voltage level.

In Example 62, the memory cell arrangement of Example 60 or 61 may optionally further include that the voltage supply circuit is configured to provide the set of supply voltages to program one or more memory cells of the memory cell arrangement; wherein providing the set of supply voltages includes: ramping the first supply voltage of the set of supply voltages from a first target voltage value to a fourth target voltage value, ramping the second supply voltage of the set of supply voltages from the first target voltage value to a second target voltage value, ramping the third supply voltage of the set of supply voltages from the first target voltage value to a third target voltage value, and keeping the fourth supply voltage of the set of supply voltages at the first target voltage value or ramping the fourth supply voltage of the set of supply voltages to a fifth target voltage value.

In Example 63, the memory cell arrangement of Example 62 may optionally further include that the voltage supply circuit is configured to control the ramping of the first supply voltage, the second supply voltage, and the third supply voltage such that: the first supply voltage, the second supply voltage, and the third supply voltage are ramped from a voltage value that is substantially equal to the first target voltage value to a voltage value that is substantially equal to the second target voltage value during a first ramp up interval.

In Example 64, the memory cell arrangement of Example 62 or 63 may optionally further include that the voltage supply circuit is configured to control the ramping of the first supply voltage, the second supply voltage, and the third supply voltage such that: the first supply voltage and the third supply voltage are ramped from a voltage value that is substantially equal to the second target voltage value to a voltage value that is substantially equal to the third target voltage value during a second ramp up interval.

In Example 65, the memory cell arrangement of any one of Examples 62 to 64 may optionally further include that the voltage supply circuit is configured to control the ramping of the first supply voltage, the second supply voltage, and the third supply voltage such that: the first supply voltage is ramped from a voltage value that is substantially equal to the third target voltage value to a voltage value that is substantially equal to the fourth target voltage value during a third ramp up interval.

In Example 66, the memory cell arrangement of any one of Examples 62 to 65 may optionally further include that providing the set of supply further includes: ramping the first supply voltage of the set of supply voltages from the fourth target voltage value to the first target voltage value, and/or ramping the second supply voltage of the set of supply voltages from the second target voltage value to the first target voltage value, and/or ramping the third supply voltage of the set of supply voltages from the third target voltage value to the first target voltage value. The fourth supply voltage of the set of supply voltages may be kept at the first target voltage value or ramped from the fifth target voltage value to the first target voltage value.

In Example 67, the memory cell arrangement of Example 66 may optionally further include that the voltage supply circuit is configured to control the ramping of the first supply voltage, the second supply voltage, and the third supply voltage such that: the first supply voltage is ramped from a voltage value that is substantially equal to the fourth target voltage value to a voltage value that is substantially equal to the third target voltage value during a first ramp down interval; and/or the first supply voltage and the third supply voltage are ramped from a voltage value that is substantially equal to the third target voltage value to a voltage value that is substantially equal to the second target voltage value during a second ramp down interval, and/or the first supply voltage, the second supply voltage, and the third supply voltage are ramped from a voltage value that is substantially equal to the second target voltage value to a voltage value that is substantially equal to the first target voltage value during a third ramp down interval.

In Example 68, the memory cell arrangement of any one of Examples 60 to 67 may optionally further include that the voltage supply circuit is configured to provide the set of supply voltages to erase one or more memory cells of the memory cell arrangement; wherein providing the set of supply voltages includes: ramping the first supply voltage of the set of supply voltages from a first target voltage value to a third target voltage value, and/or keeping the second supply voltage of the set of supply at the first target voltage value, and/or ramping the third supply voltage of the set of supply voltages from the first target voltage value to a fourth target voltage value, and/or ramping the fourth supply voltage of the set of supply voltages from the first target voltage value to a second target voltage value.

In Example 69, the memory cell arrangement of Example 68 may optionally further include that the voltage supply circuit is configured to control the ramping of the first supply voltage, the third supply voltage, and the fourth supply voltage such that: the first supply voltage, the third supply voltage, and the fourth supply voltage are ramped from a voltage value that is substantially equal to the first target voltage value to a voltage value that is substantially equal to the second target voltage value during a first ramp up interval, and/or the first supply voltage and the third supply voltage are ramped from a voltage value that is substantially equal to the second target voltage value to a voltage value that is substantially equal to the third target voltage value during a second ramp up interval, and/or the third supply voltage is ramped from a voltage value that is substantially equal to the third target voltage value to a voltage value that is substantially equal to the fourth target voltage value during a third ramp up interval.

In Example 70, the memory cell arrangement of Example 68 or 69 may optionally further include that providing the set of supply voltages further includes: ramping the first supply voltage of the set of supply voltages from the third target voltage value to the first target voltage value, and/or keeping the second supply voltage of the set of supply voltages at the first target voltage value, and/or ramping the third supply voltage of the set of supply voltages from the fourth target voltage value to the first target voltage value, and/or ramping down the fourth supply voltage of the set of supply voltages from the second target voltage value to the first target voltage value.

In Example 71, the memory cell arrangement of Example 70 may optionally further include that the voltage supply circuit is configured to control the ramping of the first supply voltage, the third supply voltage, and the fourth supply voltage such that: the third supply voltage is ramped from a voltage value that is substantially equal to the fourth target voltage value to a voltage value that is substantially equal to the third target voltage value during a first ramp down interval, and/or the first supply voltage and the third supply voltage are ramped from a voltage value that is substantially equal to the third target voltage value to a voltage value that is substantially equal to the second target voltage value during a second ramp down interval, and/or the first supply voltage, the third supply voltage, and the fourth supply voltage are ramped from a voltage value that is substantially equal to the second target voltage value to a voltage value that is substantially equal to the first target voltage value during a third ramp down interval.

In Example 72, the memory cell arrangement of any one of Examples 60 to 71 may optionally further include that a voltage difference between the first target voltage value and the fourth target voltage value is equal to or greater than a write voltage value to write (e.g., program and/or erase) the at least one memory cell.

In Example 73, the memory cell arrangement of Example 72 may optionally further include that an absolute value of a voltage difference between the first target voltage value and the second target voltage value is substantially equal to one third of an absolute value of the voltage difference between the first target voltage value and the fourth target voltage value; and/or that an absolute value of a voltage difference between the second target voltage value and the third target voltage value is substantially equal to one third of an absolute value of the voltage difference between the first target voltage value and the fourth target voltage value; and/or that an absolute value of a voltage difference between the third target voltage value and the fourth target voltage value is substantially equal to one third of an absolute value of the voltage difference between the first target voltage value and the fourth target voltage value.

In Example 74, the memory cell arrangement of Example 72 or 73 may optionally further include that an absolute value of a voltage difference between the second target voltage value and the third target voltage value is substantially equal to two thirds of an absolute value of the voltage difference between the first target voltage value and the fourth target voltage value; and/or that an absolute value of a voltage difference between the first target voltage value and the fourth target voltage value is substantially equal to two thirds of an absolute value of the voltage difference between the first target voltage value and the fourth target voltage value.

In Example 75, the memory cell arrangement of any one of Examples 60 to 74 may optionally further include that the memory cell drivers of the first set of memory cell drivers are word-line-drivers, wherein the word-line-drivers are configured to supply the first supply voltage to one or more word-lines connected to one or more memory cells to be programmed and to supply the second supply voltage to one or more bit-lines connected to one or more memory cells not to be programmed; and/or that the memory cell drivers of the second set of memory cell drivers are source/bit-line-drivers, wherein the source/bit-line-drivers are configured to supply the fourth supply voltage to one or more source/bit-lines connected to one or more memory cells to be programmed and to supply the third supply voltage to one or more source/bit-lines connected to one or more memory cells not to be programmed.

In Example 76, the memory cell arrangement of any one of Examples 60 to 75 may optionally further include that the memory cell drivers of the first set of memory cell drivers are word-line-drivers, wherein the word-line-drivers are configured to supply the second supply voltage to one or more word-lines connected to one or more memory cells to be erased and to supply the first supply voltage to one or more bit-lines connected to one or more memory cells not to be erased; and/or that the memory cell drivers of the second set of memory cell drivers are source/bit-line-drivers, wherein the source/bit-line-drivers are configured to supply the third supply voltage to one or more source/bit-lines connected to one or more memory cells to be erased and to supply the fourth supply voltage to one or more source/bit-lines connected to one or more memory cells not to be erased.

According to various aspects, an electronic circuit may be operated based on two or more supply voltages being ramped in accordance with a digital control scheme, the digital control scheme may include ramping a voltage value of a first output voltage generated via a first digitally controlled voltage converter from a first target voltage value to a third target voltage value such that the voltage value of the first output voltage matches a second target voltage value during a first ramp interval and the third target voltage value during a second ramp interval; and ramping a voltage value of a second output voltage generated via a second digitally controlled voltage converter from the first target voltage value to the second target voltage value such that the voltage value of the second output voltage matches the second target voltage value during the first ramp interval, and the second target voltage value during the second ramp interval.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A voltage supply circuit, comprising:
a first digitally controlled voltage converter circuit configured to receive a first digital control signal, generate a first output voltage, and control the generation of the first output voltage such that a voltage value of the first output voltage matches a first target voltage value, a second target voltage value, or a third target voltage value as a function of the first digital control signal;
a second digitally controlled voltage converter circuit configured to receive a second digital control signal, generate a second output voltage, and control the generation of the second output voltage such that a voltage value of the second output voltage matches the first target voltage value or the second target voltage value as a function of the second digital control signal; and
a control circuit configured to:
ramp the voltage value of the first output voltage from the first target voltage value to the third target voltage value by generating the first digital control signal such that the voltage value of the first output voltage matches the second target voltage value during a first ramp interval and such that the voltage value of the first output voltage matches the third target voltage value during a second ramp interval; and
ramp the voltage value of the second output voltage from the first target voltage value to the second target voltage value by generating the second digital control signal such that the voltage value of the second output voltage matches the second target voltage value during the first ramp interval and such that the voltage value of the second output voltage matches the second target voltage value during the second ramp interval.

2. The voltage supply circuit of claim 1,
wherein the control circuit is further configured to:
ramp the voltage value of the first output voltage from the third target voltage value to the first target voltage value by generating the first digital control signal such that the voltage value of the first output voltage matches the second target voltage value during a first ramp interval and such that the voltage value of the first output voltage matches the first target voltage value during a second ramp interval; and
ramp the voltage value of the second output voltage from the second target voltage value down to the first target voltage value by generating the second digital control signal such that the voltage value of the second output voltage matches the second target voltage value during the first ramp interval and such that the voltage value of the second output voltage matches the first target voltage value during the second ramp interval.

3. The voltage supply circuit of claim 1,
wherein each digitally controlled voltage converter circuit comprises at least one voltage converter, and
wherein each digitally controlled voltage converter circuit comprises a feedback loop to control the generation of the respective output voltage by the respective at least one voltage converter.

4. The voltage supply circuit of claim 3,
wherein the respective feedback loop is configured to compare an actual voltage value of the respective output voltage with a reference voltage value of a reference voltage and control the respective at least one voltage converter based on a result of the comparison.

5. The voltage supply circuit of claim 3,
wherein the respective feedback loop is configured to control the respective at least one voltage converter such that the actual voltage value of the respective output voltage matches an actual reference voltage value of the respective reference voltage,
wherein the actual reference voltage value of the respective reference voltage is defined by the respective digital control signal.

6. The voltage supply circuit of claim 3,
wherein the respective feedback loop comprises a digital analog converter to convert the respective digital control signal into the reference voltage corresponding thereto, the actual reference voltage value of the respective reference voltage is defined by an actual digital value represented by the respective digital control signal.

7. The voltage supply circuit of claim 6,
wherein the actual digital value represented by the first digital control signal defines whether the voltage value of the first output voltage matches the first target voltage value, the second target voltage value, or the third target voltage value; and/or
wherein the actual digital value represented by the second digital control signal defines whether the voltage value of the second output voltage matches the first target voltage value or the second target voltage value.

8. The voltage supply circuit of claim 3,
wherein the actual reference voltage value of a first reference voltage defines whether the voltage value of the first output voltage matches the first target voltage value, the second target voltage value, or the third target voltage value; and/or
wherein the actual reference voltage value of a second reference voltage defines whether the voltage value of the second output voltage matches the first target voltage value or the second target voltage value.

9. The voltage supply circuit of claim 1,
wherein the first digital control signal is configured to represent selectively one of a first digital value, a second digital value, and a third digital value; and/or
wherein the second digital control signal is configured to represent selectively one of a first digital value and a second digital value.

10. The voltage supply circuit of claim 1,
wherein the control circuit is configured to:
check, whether the voltage value of the first output voltage matches the second target voltage value during the first ramp interval, and, in the case that the voltage value of the first output voltage matches the second target voltage value during the first ramp interval, generate the first digital control signal such that the voltage value of the first output voltage matches the third target voltage value during the second ramp interval; and/or
check, whether the voltage value of the second output voltage matches the second target voltage value during the first ramp interval, and, in the case that the voltage value of the second output voltage matches the second target voltage value during the first ramp interval, generate the second digital control signal such that the voltage value of the second output voltage matches the second target voltage value during the second ramp interval.

11. The voltage supply circuit of claim 2,
wherein the control circuit is configured to:
check, whether the voltage value of the first output voltage matches the second target voltage value during the first ramp interval, and, in the case that the voltage value of the first output voltage matches the second target voltage value during the first ramp interval, generate the first digital control signal such that the voltage value of the first output voltage matches the first target voltage value during the second ramp interval; and/or check, whether the voltage value of the second output voltage matches the second target voltage value during the first ramp interval, and, in the case that the voltage value of the second output voltage matches the second target voltage value during the first ramp interval, generate the second digital control signal such that the voltage value of the second output voltage matches the first target voltage value during the second ramp interval.

12. A voltage supply circuit, comprising:

a first digitally controlled voltage converter circuit configured to receive a first digital control signal, generate a first output voltage, and control the generation of the first output voltage such that a voltage value of the first output voltage matches a first target voltage value, a second target voltage value, a third target voltage value, or a fourth target voltage value as a function of the first digital control signal;

a second digitally controlled voltage converter circuit configured to receive a second digital control signal, generate a second output voltage, and control the generation of the second output voltage such that a voltage value of the second output voltage matches the first target voltage value or the second target voltage value as a function of the second digital control signal;

a third digitally controlled voltage converter circuit configured to receive a third digital control signal, generate a third output voltage, and control the generation of the third output voltage such that a voltage value of the third output voltage matches the first target voltage value, the second target voltage value, or the third target voltage value as a function of the third digital control signal;

a fourth digitally controlled voltage converter circuit configured to receive a fourth digital control signal, generate a fourth output voltage, and control the generation of the fourth output voltage such that a voltage value of the fourth output voltage matches the first target voltage value or a fifth target voltage value as a function of the fourth digital control signal;

a control circuit configured to ramp the voltage values of the respective output voltages according to a first control scheme and/or a second control scheme, (i) the first control scheme comprises:

ramp the voltage value of the first output voltage from the first target voltage value up to the fourth target voltage value by generating the first digital control signal such that the voltage value of the first output voltage matches the second target voltage value during a first ramp interval, the third target voltage value during a second ramp interval, and the fourth target voltage value during a third ramp interval;

ramp the voltage value of the second output voltage from the first target voltage value up to the second target voltage value by generating the second digital control signal such that the voltage value of the second output voltage matches the second target voltage value during the first ramp interval, the second target voltage value during the second ramp interval, and the second target voltage value during the third ramp interval;

ramp the voltage value of the third output voltage from the first target voltage value up to the third target voltage value by generating the third digital control signal such that the voltage value of the third output voltage matches the second target voltage value during the first ramp interval, the third target voltage value during the second ramp interval, and the third target voltage value during the third ramp interval; and either keep the voltage value of the fourth output voltage at the first target voltage value by generating the fourth digital control signal such that the voltage value of the fourth output voltage matches the first target voltage value during the first ramp interval, the first target voltage value during the second ramp interval, and the first target voltage value during the third ramp interval, or ramp the voltage value of the fourth output voltage from the first target voltage value to the fifth target voltage value by generating the fourth digital control signal such that the voltage value of the fourth output voltage matches the fifth target voltage value during the first ramp interval, the fifth target voltage value during the second ramp interval, and the fifth target voltage value during the third ramp interval;

(ii) the second control scheme comprises:

ramp the voltage value of the first output voltage from the fourth target voltage value down to the first target voltage value by generating the first digital control signal such that the voltage value of the first output voltage matches the third target voltage value during a first ramp interval, the second target voltage value during a second ramp interval, and the first target voltage value during a third ramp interval;

ramp the voltage value of the second output voltage from the second target voltage value down to the first target voltage value by generating the second digital control signal such that the voltage value of the second output voltage matches the second target voltage value during the first ramp interval, the second target voltage value during the second ramp interval, and the first target voltage value during the third ramp interval;

ramp the voltage value of the third output voltage from the third target voltage value down to the first target voltage value by generating the third digital control signal such that the voltage value of the third output voltage matches the third target voltage value during the first ramp interval, the second target voltage value during the second ramp interval, and the first target voltage value during the third ramp interval; and either keep the voltage value of the fourth output voltage at the first target voltage value by generating the fourth digital control signal such that the voltage value of the fourth output voltage matches the first target voltage value during the first ramp interval, the first target voltage value during the second ramp interval, and the first target voltage value during the third ramp interval, or ramp the voltage value of the fourth output voltage from the fifth target voltage value to the first target voltage value by generating the fourth digital control signal such that the voltage value of the fourth output voltage matches the fifth target voltage value during the first ramp interval, the fifth target voltage value during the second ramp interval, and the first target voltage value during the third ramp interval.

13. A memory cell arrangement, comprising:

a first set of memory cell drivers configured to selectively supply a supply voltage of a set of supply voltages to one or more first control-lines for operating one or more memory cells;

a second set of memory cell drivers configured to selectively supply another supply voltage of the set of supply voltages to one or more second control-lines for operating the one or more memory cells; and a voltage supply circuit configured to provide the set of supply voltages to the first set of memory cell drivers and the second set of memory cell drivers, the voltage supply circuit comprising:

a first digitally controlled voltage converter circuit configured to generate a first supply voltage of the set of supply voltages in response to a received first digital control signal;

a second digitally controlled voltage converter circuit configured to generate a second supply voltage of the set of supply voltages in response to a received second digital control signal;

a third digitally controlled voltage converter circuit configured to generate a third supply voltage of the set of supply voltages in response to a received third digital control signal; and a fourth circuit configured to provide a fourth supply voltage of the set of supply voltages.

14. The memory cell arrangement of claim 13, wherein the fourth circuit comprises a fourth digitally controlled voltage converter circuit configured to generate the fourth supply voltage of the set of supply voltages in response to a received fourth digital control signal, or wherein the fourth supply voltage is a base voltage, wherein, preferably, the base voltage is at a constant voltage level.

15. The memory cell arrangement of claim 13, wherein the voltage supply circuit is configured to provide the set of supply voltages to program one or more memory cells of the memory cell arrangement; wherein providing the set of supply voltages comprises:

ramping the first supply voltage of the set of supply voltages from a first target voltage value to a fourth target voltage value, ramping the second supply voltage of the set of supply voltages from the first target voltage value to a second target voltage value, ramping the third supply voltage of the set of supply voltages from the first target voltage value to a third target voltage value, and keeping the fourth supply voltage of the set of supply voltages at the first target voltage value; and wherein the voltage supply circuit is configured to control the ramping of the first supply voltage, the second supply voltage, and the third supply voltage such that:

the first supply voltage, the second supply voltage, and the third supply voltage are ramped from a voltage value that is substantially equal to the first target voltage value to a voltage value that is substantially equal to the second target voltage value during a first ramp up interval, the first supply voltage and the third supply voltage are ramped from a voltage value that is substantially equal to the second target voltage value to a voltage value that is substantially equal to the third target voltage value during a second ramp up interval, and the first supply voltage is ramped from a voltage value that is substantially equal to the third target voltage value to a voltage value that is substantially equal to the fourth target voltage value during a third ramp up interval.

16. The memory cell arrangement of claim 15, wherein providing the set of supply voltages further comprises:

ramping the first supply voltage of the set of supply voltages from the fourth target voltage value to the first target voltage value, ramping the second supply voltage of the set of supply voltages from the second target voltage value to the first target voltage value, ramping the third supply voltage of the set of supply voltages from the third target voltage value to the first target voltage value, and keeping the fourth supply voltage of the set of supply voltages at the first target voltage value; and wherein the voltage supply circuit is configured to control the ramping of the first supply voltage, the second supply voltage, and the third supply voltage such that:

the first supply voltage is ramped from a voltage value that is substantially equal to the fourth target voltage value to a voltage value that is substantially equal to the third target voltage value during a first ramp down interval, the first supply voltage and the third supply voltage are ramped from a voltage value that is substantially equal to the third target voltage value to a voltage value that is substantially equal to the second target voltage value during a second ramp down interval, and the first supply voltage, the second supply voltage, and the third supply voltage are ramped from a voltage value that is substantially equal to the second target voltage value to a voltage value that is substantially equal to the first target voltage value during a third ramp down interval.

17. The memory cell arrangement of claim 13, wherein the voltage supply circuit is configured to provide the set of supply voltages to erase one or more memory cells of the memory cell arrangement; wherein providing the set of supply voltages comprises:

ramping the first supply voltage of the set of supply voltages from a first target voltage value to a third target voltage value, keeping the second supply voltage of the set of supply at the first target voltage value, ramping the third supply voltage of the set of supply voltages from the first target voltage value to a fourth target voltage value, and ramping the fourth supply voltage of the set of supply voltages from the first target voltage value to a second target voltage value; and wherein the voltage supply circuit is configured to control the ramping of the first supply voltage, the third supply voltage, and the fourth supply voltage such that:

the first supply voltage, the third supply voltage, and the fourth supply voltage are ramped from a voltage value that is substantially equal to the first target voltage value to a voltage value that is substantially equal to the second target voltage value during a first ramp up interval, the first supply voltage and the third supply voltage are ramped from a voltage value that is substantially equal to the second target voltage value to a voltage value that is substantially equal to the third target voltage value during a second ramp up interval, and the third supply voltage is ramped from a voltage value that is substantially equal to the third target voltage value to a voltage value that is substantially equal to the fourth target voltage value during a third ramp up interval.

18. The memory cell arrangement of claim 17,
wherein providing the set of supply voltages further comprises:
ramping the first supply voltage of the set of supply voltages from the third target voltage value to the first target voltage value,
keeping the second supply voltage of the set of supply voltages at the first target voltage value,
ramping the third supply voltage of the set of supply voltages from the fourth target voltage value to the first target voltage value, and
ramping down the fourth supply voltage of the set of supply voltages from the second target voltage value to the first target voltage value; and
wherein the voltage supply circuit is configured to control the ramping of the first supply voltage, the third supply voltage, and the fourth supply voltage such that:
the third supply voltage is ramped from a voltage value that is substantially equal to the fourth target voltage value to a voltage value that is substantially equal to the third target voltage value during a first ramp down interval,
the first supply voltage and the third supply voltage are ramped from a voltage value that is substantially equal to the third target voltage value to a voltage value that is substantially equal to the second target voltage value during a second ramp down interval, and
the first supply voltage, the third supply voltage, and the fourth supply voltage are ramped from a voltage value that is substantially equal to the second target voltage value to a voltage value that is substantially equal to the first target voltage value during a third ramp down interval.

19. The memory cell arrangement of claim 13,
wherein a voltage difference between the first target voltage value and the fourth target voltage value is equal to or greater than a write voltage value to write the at least one memory cell; and/or
wherein an absolute value of a voltage difference between the first target voltage value and the second target voltage value is substantially equal to one third of an absolute value of the voltage difference between the first target voltage value and the fourth target voltage value; and/or
wherein an absolute value of a voltage difference between the second target voltage value and the third target voltage value is substantially equal to one third of an absolute value of the voltage difference between the first target voltage value and the fourth target voltage value; and/or
wherein an absolute value of a voltage difference between the third target voltage value and the fourth target voltage value is substantially equal to one third of an absolute value of the voltage difference between the first target voltage value and the fourth target voltage value; and/or
wherein an absolute value of a voltage difference between the second target voltage value and the third target voltage value is substantially equal to two thirds of an absolute value of the voltage difference between the first target voltage value and the fourth target voltage value; and/or
wherein an absolute value of a voltage difference between the first target voltage value and the fourth target voltage value is substantially equal to two thirds of an absolute value of the voltage difference between the first target voltage value and the fourth target voltage value.

20. Method for operating a memory cell arrangement, the method comprising
ramping a voltage value of a first output voltage generated via a first digitally controlled voltage converter from a first target voltage value to a third target voltage value by supplying a first digital control signal to the first digitally controlled voltage converter such that the voltage value of the first output voltage matches a second target voltage value during a first ramp interval and the third target voltage value during a second ramp interval; and
ramping a voltage value of a second output voltage generated via a second digitally controlled voltage converter from the first target voltage value to the second target voltage value by supplying a second digital control signal to the second digitally controlled voltage converter such that the voltage value of the second output voltage matches the second target voltage value during the first ramp interval, and the second target voltage value during the second ramp interval.

* * * * *